US011355791B2

(12) United States Patent
Austin

(10) Patent No.: US 11,355,791 B2
(45) Date of Patent: Jun. 7, 2022

(54) VEHICULAR BATTERY CHARGER, CHARGING SYSTEM, AND METHOD WITH USER-CONFIGURABLE ALERTS

(71) Applicant: Christopher B. Austin, Grafton, WI (US)

(72) Inventor: Christopher B. Austin, Grafton, WI (US)

(*) Notice: Subject to any disclaimer, the term of this patent is extended or adjusted under 35 U.S.C. 154(b) by 211 days.

(21) Appl. No.: 16/056,049

(22) Filed: Aug. 6, 2018

(65) Prior Publication Data

US 2018/0351216 A1    Dec. 6, 2018

Related U.S. Application Data

(63) Continuation of application No. 12/737,803, filed as application No. PCT/US2009/054174 on Aug. 18, 2009, now Pat. No. 10,090,567.

(Continued)

(51) Int. Cl.
  *H01M 10/44*     (2006.01)
  *B60L 53/14*     (2019.01)
  (Continued)

(52) U.S. Cl.
  CPC ......... *H01M 10/44* (2013.01); *B60L 53/126* (2019.02); *B60L 53/14* (2019.02); *B60L 53/18* (2019.02);
  (Continued)

(58) Field of Classification Search
  CPC ...... H01M 10/44; H02J 7/0042; H02J 7/0047; B60L 53/68; B60L 53/126; B60L 53/14;
  (Continued)

(56) References Cited

U.S. PATENT DOCUMENTS 4,532,418 A   7/1985   Meese et al.
4,742,283 A   5/1988   Bolger et al.
             (Continued)

FOREIGN PATENT DOCUMENTS

JP   2004142661    5/2004
JP   2006074868    3/2006
WO   WO2008026390  3/2008

OTHER PUBLICATIONS

Search Report issued in corresponding PCT/US2009/054174; dated Dec. 3, 2009.

(Continued)

*Primary Examiner* — Nathaniel R Pelton
(74) *Attorney, Agent, or Firm* — Michael Best & Friedrich LLP

(57) ABSTRACT

A vehicle battery charger and a vehicle battery charging system are described and illustrated, and can include a controller enabling a user to enter a time of day at which the vehicle battery charger or system begins and/or ends charging of the vehicle battery. The vehicle battery charger can be separate from the vehicle, can be at least partially integrated into the vehicle, can include a transmitter and/or a receiver capable of communication with a controller that is remote from the vehicle and vehicle charger, and can be controlled by a user or another party (e.g., a power utility) to control battery charging based upon a time of day, cost of power, or other factors.

20 Claims, 22 Drawing Sheets

Related U.S. Application Data

(60) Provisional application No. 61/189,353, filed on Aug. 18, 2008.

(51) Int. Cl.

| | | |
|---|---|---|
| *B60L 53/38* | (2019.01) | |
| *B60L 53/63* | (2019.01) | |
| *B60L 53/18* | (2019.01) | |
| *B60L 53/30* | (2019.01) | |
| *B60L 53/68* | (2019.01) | |
| *B60L 53/126* | (2019.01) | |
| *G01R 31/371* | (2019.01) | |
| *H02J 7/00* | (2006.01) | |

(52) U.S. Cl.
CPC ............ *B60L 53/305* (2019.02); *B60L 53/38* (2019.02); *B60L 53/63* (2019.02); *B60L 53/68* (2019.02); *G01R 31/371* (2019.01); *H02J 7/0042* (2013.01); *H02J 7/0047* (2013.01); *Y02E 60/00* (2013.01); *Y02T 10/70* (2013.01); *Y02T 10/7072* (2013.01); *Y02T 90/12* (2013.01); *Y02T 90/14* (2013.01); *Y02T 90/16* (2013.01); *Y04S 10/126* (2013.01)

(58) Field of Classification Search
CPC ........ B60L 53/305; B60L 53/18; B60L 53/38; B60L 53/63
USPC ........................................................... 320/109
See application file for complete search history.

(56) References Cited

U.S. PATENT DOCUMENTS

| | | | | |
|---|---|---|---|---|
| 4,769,796 | A * | 9/1988 | Levine | G04G 11/00 368/29 |
| 5,202,617 | A | 4/1993 | Nor | |
| 5,311,973 | A | 5/1994 | Tseng et al. | |
| 5,461,298 | A | 10/1995 | Lara et al. | |
| 5,462,439 | A | 10/1995 | Keith | |
| 5,548,200 | A * | 8/1996 | Nor | H02J 7/0027 320/109 |
| 5,594,318 | A * | 1/1997 | Nor | B60L 53/12 320/108 |
| 5,595,271 | A | 1/1997 | Tseng | |
| 5,650,710 | A | 7/1997 | Hotta | |
| 6,281,663 | B1 | 8/2001 | Yagi et al. | |
| 6,421,600 | B1 | 7/2002 | Ross | |
| 6,424,158 | B2 | 7/2002 | Klang | |
| 6,963,186 | B2 * | 11/2005 | Hobbs | B60L 58/24 320/128 |
| 7,881,957 | B1 * | 2/2011 | Cohen | G06Q 30/08 |
| 7,917,179 | B2 | 3/2011 | Kokubo | |
| 2002/0079868 | A1 | 6/2002 | Gaza | |
| 2003/0015995 | A1 | 1/2003 | Tamura et al. | |
| 2003/0127155 | A1 | 7/2003 | Mulvenna et al. | |
| 2003/0184162 | A1 * | 10/2003 | Kelsey | H02J 7/0031 307/150 |
| 2003/0209375 | A1 | 11/2003 | Suzuki et al. | |
| 2005/0046387 | A1 | 3/2005 | Aker et al. | |
| 2006/0276938 | A1 | 12/2006 | Miller | |
| 2007/0080827 | A1 | 4/2007 | Huang | |
| 2007/0144605 | A1 | 6/2007 | Horowitz et al. | |
| 2007/0164704 | A1 | 7/2007 | Mcginley et al. | |
| 2008/0007202 | A1 * | 1/2008 | Pryor | B60L 53/14 320/104 |
| 2008/0040223 | A1 | 2/2008 | Bridges et al. | |
| 2008/0040296 | A1 | 2/2008 | Bridges et al. | |
| 2008/0052017 | A1 | 2/2008 | Smith et al. | |
| 2008/0052145 | A1 | 2/2008 | Kaplan et al. | |
| 2008/0054845 | A1 | 3/2008 | Wang | |
| 2008/0103370 | A1 | 5/2008 | Dicks et al. | |
| 2008/0156553 | A1 | 7/2008 | Hoogenraad | |
| 2008/0203973 | A1 | 8/2008 | Gale et al. | |
| 2008/0224654 | A1 * | 9/2008 | Kim | H02J 7/0013 320/103 |
| 2008/0238355 | A1 | 10/2008 | Muramatsu | |
| 2008/0265684 | A1 | 10/2008 | Farkas | |
| 2008/0281168 | A1 | 11/2008 | Gibson et al. | |
| 2008/0296978 | A1 | 12/2008 | Finkenzeller et al. | |
| 2009/0021213 | A1 | 1/2009 | Johnson | |
| 2009/0063183 | A1 | 3/2009 | McNeely et al. | |
| 2009/0063193 | A1 | 3/2009 | Barton et al. | |
| 2009/0139781 | A1 * | 6/2009 | Straubel | B60L 50/64 180/65.1 |
| 2009/0237034 | A1 | 9/2009 | Lindemann et al. | |
| 2009/0243538 | A1 * | 10/2009 | Kelty | B60L 15/2045 320/104 |
| 2009/0243549 | A1 | 10/2009 | Matsumura et al. | |
| 2009/0278492 | A1 | 11/2009 | Shimizu et al. | |
| 2009/0313034 | A1 | 12/2009 | Ferro et al. | |
| 2009/0313174 | A1 | 12/2009 | Hafner et al. | |
| 2010/0010698 | A1 | 1/2010 | Iwashita et al. | |
| 2010/0030389 | A1 | 2/2010 | Palmer et al. | |
| 2010/0081378 | A1 | 4/2010 | Kawamura | |
| 2010/0106631 | A1 | 4/2010 | Kurayama et al. | |
| 2010/0169008 | A1 | 7/2010 | Niwa et al. | |
| 2010/0228405 | A1 | 9/2010 | Morgal et al. | |
| 2010/0281183 | A1 | 11/2010 | Van Bebber | |
| 2011/0266996 | A1 | 11/2011 | Sugano | |

OTHER PUBLICATIONS

Written Opinion issued in corresponding PCT/US2009/054174; dated Dec. 3, 2009.

Search Report issued in corresponding EP09808718.2; dated Sep. 21, 2017.

Official Action issued in corresponding EP09808718.2; dated Apr. 29, 2020.

Official Action issued in corresponding EP09808718.2; dated Feb. 17, 2021.

Official Action issued in corresponding EP09808718.2; dated Jul. 20, 2021.

English Translation of relevant text for WO 0118899, 3 pages (Year: 2001).

* cited by examiner

VEHICULAR BATTERY CHARGER, CHARGING SYSTEM, AND METHOD WITH USER-CONFIGURABLE ALERTS

CROSS-REFERENCE TO RELATED APPLICATIONS

The present patent application is a continuation of U.S. patent application Ser. No. 12/737,803, filed Feb. 17, 2011, which application is a national stage filing under 35 U.S.C. § 371 of International Application No. PCT/US2009/054174, filed on Aug. 18, 2009, which claims the benefit of U.S. Provisional Patent Application No. 61/189,353 filed on Aug. 18, 2008, the entire contents of which are incorporated herein by reference in their entireties.

BACKGROUND

In light of the ever-rising costs of energy in the global market, energy consumers of all types seek to reduce the impact such costs to the greatest extent possible. One popular manner of doing so is the use of vehicles that do not rely solely (and in some cases, at all) upon petroleum products as a source of energy. Many such vehicles have been developed that rely exclusively or in large part on batteries that must be recharged from a source of electrical power external to the vehicle. Such vehicles are referred to hereinafter simply as "electric vehicles," it being understood that this term refers to any vehicle requiring an external supply of electrical power to charge the vehicle for normal use. By way of example and without limitation, the term "electric vehicle" therefore refers to vehicles whose primary source of power is electrical batteries, as well as vehicles that have other sources of power (e.g., biofuel, fuel cells, natural gas, compressed air, and the like) in addition to or in lieu of electrical batteries, but that are designed to be supplied with electrical power from an external source to improve efficient operation of the vehicle.

Unfortunately, significant limitations exist to the widespread utilization of electric vehicles. For example, most households have a small number of appliances, devices, and systems that require a significant draw of electrical power from a power supplier. The introduction of an electrical vehicle as another daily draw of electric power for a household would place unprecedented strain on community power systems, many of which are already incapable of meeting peak demands. This problem is exacerbated by the fact that in some cases, the daily draw of electric power to charge the battery of an electric vehicle may be the highest of a household.

Simply put, existing power infrastructure for most communities is incapable of meeting the demand that widespread use of rechargeable electric vehicles would place on the infrastructure. Until electrical power distribution infrastructure is updated to meet this demand (and even after such a time), improvements in energy distribution and utilization for charging electric vehicle batteries are welcome in the art.

SUMMARY OF THE INVENTION

In some embodiments, a vehicle charger for charging a battery of a vehicle and adapted for communication with a first controller remote from the vehicle and vehicle charger, wherein the vehicle charger comprises an electrical power cord releasably attachable to at least one of the vehicle and a source of power; a second controller electrically coupled to the electrical power cord; and at least one of a transmitter and a receiver coupled to the second controller and adapted for communication with the first controller, the second controller responsive to at least one signal from the first controller by changing a charging state of the vehicle charger.

Some embodiments of the present invention provide a vehicle charger for charging a battery of a vehicle in the course of a charging session, wherein the vehicle charger comprises a controller; a display coupled to the controller and adapted to display a time; and a user-manipulatable control coupled to the controller and operable by a user to enter a time of day at which the charging session will end, the controller changing the supply of electric power to the vehicle battery during the course of the charging session by at least one of increasing a rate of charge of the battery, decreasing the rate of charge of the battery, starting battery charging, or stopping battery charging based at least in part upon the time needed to charge the vehicle battery by the time of day entered by the user.

In some embodiments, a vehicle charger for charging a battery of a vehicle is provided, wherein the vehicle charger comprises a display mounted within the vehicle within reach of a user seated within the vehicle; a user-manipulatable control within reach of the user seated within the vehicle and by which a user can enter a time of day; a controller coupled to the display and to the battery, the controller changing a supply of electric power to charge the battery during the course of a charging session by at least one of increasing a rate of charge of the battery, decreasing the rate of charge of the battery, starting battery charging, or stopping battery charging based at least in part upon the time of day entered by the user.

Some embodiments of the present invention provide a vehicle charger for charging a battery of a vehicle, wherein the vehicle charger comprises: a controller; and a memory coupled to the controller and in which to save a time of day entered by a user; the controller changing a supply of electric power to charge the battery during the course of a charging session by at least one of increasing a rate of charge of the battery, decreasing the rate of charge of the battery, starting battery charging, or stopping battery charging based at least in part upon the time of day entered by the user; and wherein the controller supplies electric power to the battery if a level of battery charge is below a threshold level of battery charge independent of the time of day entered by the user, the controller supplying electric power to the battery until the threshold level of battery charge is reached.

In some embodiments, a vehicle charger for charging a battery of a vehicle is provided, wherein the vehicle charger comprises a controller; a display coupled to the controller; and a memory accessible by the controller and in which to save a time of day; the controller changing a supply of electric power to charge the battery during the course of a charging session by at least one of increasing a rate of charge of the battery, decreasing the rate of charge of the battery, starting battery charging, or stopping battery charging based at least in part upon the time of day; the controller operable to display at least two different screens upon the display, at least one of the screens displaying information regarding a charging session, and at least one of the screens displaying settings at least partially defining the manner of operation of the vehicle charger.

Some embodiments of the present invention provide a vehicle charger for charging a battery of a vehicle and adapted for communication with a first controller remote from the vehicle and vehicle charger, wherein the vehicle charger comprises a display; a second controller coupled to the display and operable to change a supply of electric power to charge the battery during the course of a charging session by at least one of increasing a rate of charge of the battery, decreasing the rate of charge of the battery, starting battery charging, or stopping battery charging based at least in part upon a time of day; and at least one of a transmitter and a receiver coupled to the second controller and adapted for communication with the first controller, wherein the second controller displays an indicator indicating a status of communication between the first and second controllers.

In some embodiments, a vehicle charger for charging a battery of a vehicle is provided, and comprises a controller; and a display coupled to the controller; the controller changing a supply of electric power to charge the battery during the course of a charging session by at least one of increasing a rate of charge of the battery, decreasing the rate of charge of the battery, starting battery charging, or stopping battery charging based at least in part upon a time of day; the controller operable to display on the display an amount of time remaining to complete charging of the battery.

Some embodiments of the present invention provide a vehicle charger for charging a battery of a vehicle, wherein the vehicle charger comprises a controller; and a display coupled to the controller; the controller changing a supply of electric power to charge the battery during the course of a charging session by at least one of increasing a rate of charge of the battery, decreasing the rate of charge of the battery, starting battery charging, or stopping battery charging based at least in part upon a time of day; the controller operable to display on the display an amount of power consumed by the battery during the charging session.

In some embodiments, a vehicle charger for charging a battery of a vehicle is provided, and comprises a controller; and a display coupled to the controller; the controller changing a supply of electric power to charge the battery during the course of a charging session by at least one of increasing a rate of charge of the battery, decreasing the rate of charge of the battery, starting battery charging, or stopping battery charging based at least in part upon a time of day; the controller operable to display on the display a cost of power supplied to the vehicle charger.

Some embodiments of the present invention provide a vehicle charger for charging a battery of a vehicle in the course of a charging session, wherein the vehicle charger comprises an electrical power cord releasably attachable to at least one of the vehicle and a source of power; a controller; a housing attached to the electrical cord; a display on the housing, coupled to the controller, and adapted to display a time; and a user-manipulatable control coupled to the controller and operable by a user to enter a time of day; the controller changing the supply of electric power to the vehicle battery during the course of the charging session by at least one of increasing a rate of charge of the battery, decreasing the rate of charge of the battery, starting battery charging, or stopping battery charging based at least in part upon the time of day entered by the user.

In some embodiments, a vehicle charger for charging a battery of a vehicle and adapted for communication with a first controller remote from the vehicle and vehicle charger is provided, and comprises a display; a user-manipulatable control; a second controller coupled to the display and operable to change a supply of electric power to charge the battery during the course of a charging session by at least one of increasing a rate of charge of the battery, decreasing the rate of charge of the battery, starting battery charging, or stopping battery charging; and at least one of a transmitter and a receiver coupled to the second controller and adapted for communication with the first controller, the second controller responsive to at least one signal from the first controller by changing a charging state of the vehicle charger based at least in part upon the time of day entered by the user.

Some embodiments of the present invention provide a vehicle charger for charging a battery of a vehicle, wherein the vehicle charger comprises a controller operable to change a supply of electric power to charge the battery during the course of a charging session by at least one of increasing a rate of charge of the battery, decreasing the rate of charge of the battery, starting battery charging, or stopping battery charging based at least in part upon a time of day, wherein the controller transmits a signal responsive to detection of an interruption of power supply to the vehicle charger.

In some embodiments, a vehicle charger for charging a battery of a vehicle is provided, and comprises a controller; a vehicle charger battery coupled to the controller; and an electrical power cord releasably attachable to at least one of the vehicle and the vehicle charger battery to supply power from the vehicle charger battery to the battery of the vehicle, wherein the controller is operable to change a supply of electric power to the vehicle charger battery during the course of a charging session by at least one of increasing a rate of charge of the vehicle charger battery, decreasing the rate of charge of the vehicle charger battery, starting charging of the vehicle charger battery, or stopping charging of the vehicle charger battery based at least in part upon a time of day.

Some embodiments of the present invention provide a vehicle charger for charging a battery of a vehicle, wherein the vehicle charger comprises a first core on the vehicle; a second core in a location stationary with respect to the first core, the second core providing an inductive charge to the first core in at least one position of the first core with respect to the second core; at least one sensor positioned to detect the position of the first core with respect to the second core; a display mounted within the vehicle within view of a user seated within the vehicle; and a controller coupled to the display and responsive to signals from the sensor to display at least one indicator on the display indicating a direction in which the vehicle must move for an improved positional relationship between the first and second cores.

In some embodiments, a vehicle charger for charging a battery of a vehicle is provided, and comprises a controller; a first electrical connector coupled to the battery and the controller and located on one side of the vehicle; and a second electrical connector coupled to the battery and the controller and located on a different side of the vehicle, the first and second electrical connectors both shaped and dimensioned for releasable connection to an electrical power cord supplying power to the vehicle from an external power source.

Some embodiments of the present invention provide a method of controlling charging of batteries of multiple vehicles each electrically connected to a power generation and distribution system, wherein the method comprises establishing communication with a controller associated with a battery charger of each vehicle; obtaining from each battery charger a time of day by which battery charging for the vehicle associated with the battery charger must be completed; and changing power supply to at least some of the battery chargers based at least in part upon the time of day received from the battery chargers.

DETAILED DESCRIPTION

Before any embodiments of the present invention are explained in detail, it is to be understood that the present invention is not limited in its application to the details of construction and the arrangement of components set forth in the following description or illustrated in the accompanying drawings. The invention is capable of other embodiments and of being practiced or of being carried out in various ways. Also, it is to be understood that the phraseology and terminology used herein is for the purpose of description, and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

Figure 1:
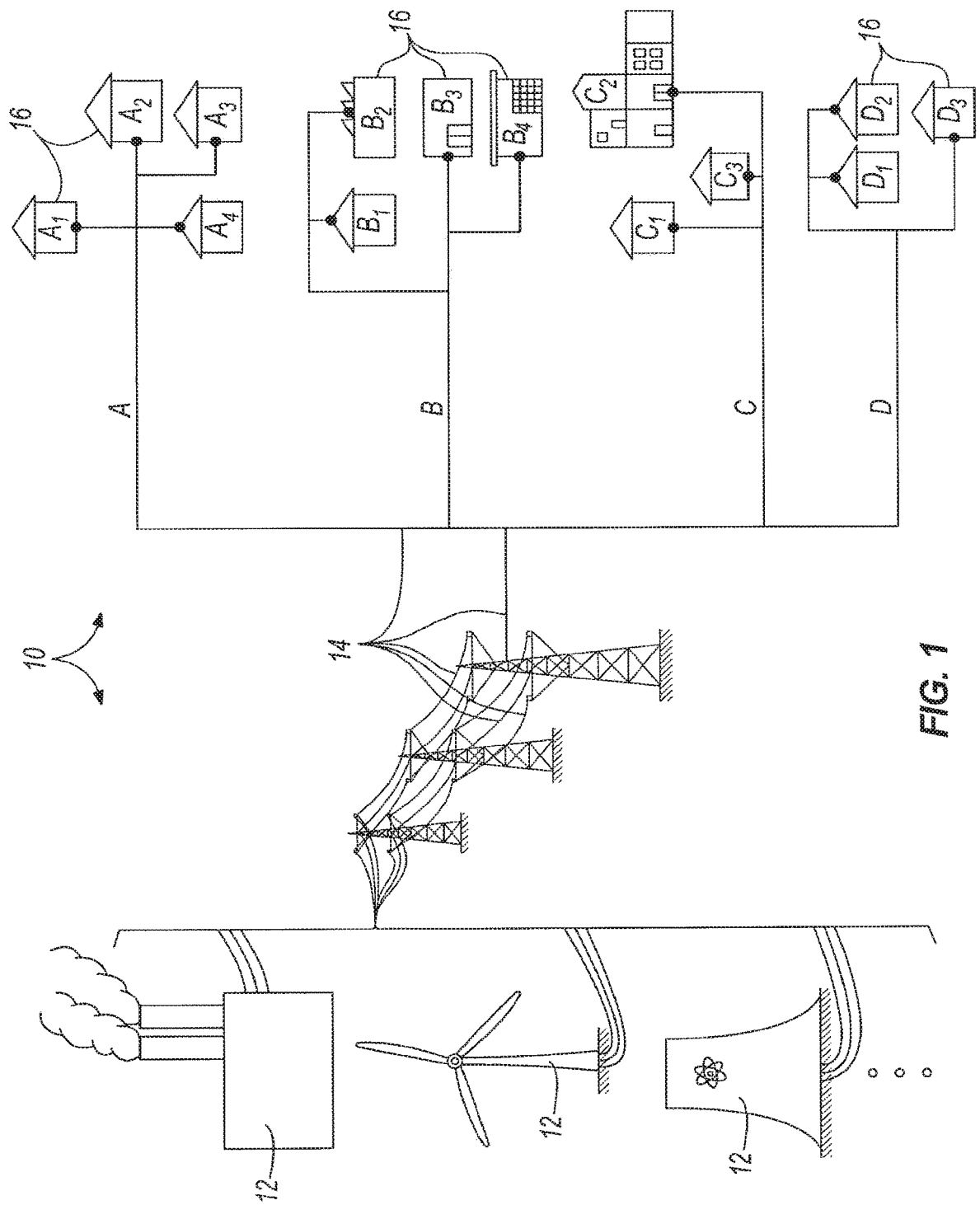
FIG. 1 is a schematic diagram of a power generation and distribution system for a community.

A power generation and distribution system in which vehicle chargers and vehicle charging systems according to the present invention can be used is illustrated schematically in FIG. 1, and is indicated generally at 10. The system 10 includes one or more sources of power 12 that supply a community, such as one or more power plants generating electric power from natural gas, coal, water flow, nuclear power, geo-thermal power, wind, solar power, other power sources, and any combination thereof. Any number of sources of power 12 can supply the electricity needs of the community, and can be located within the community and/or located distant from the community. For example, electric power can be generated in one or more power plants located in or nearby the community, whereas additional electric power can be supplied from other more distant power plants as needed in times of peak demand.

Electric power is distributed from the sources of power 12 in any conventional manner, such as by a number of power lines 14 running from the sources of power 12 to various locations in the community. Electric power can be further distributed within the community by additional power lines 14 and power distribution infrastructure. Such power lines and power distribution infrastructure (in their various forms) are known to those skilled in the art, and are not therefore described further herein.

Electric power is transmitted over the power lines 14 to a number of different locations 16 in the community, each of which draws and uses the electrical power for various purposes. One or more electric vehicles 18, 618, 1018 are at some of these locations, and draw an amount of electric power for purposes of charging one or more batteries 20, 620, 1020 (see FIGS. 2-4) of each electric vehicle 18, 618, 1018. Each electric vehicle 18, 618, 1018 in the community is releasably connected to the vehicular charging system 10. In the illustrated embodiment of FIGS. 2 and 3, each electric vehicle 18, 618 is releasably electrically and mechanically connected by a respective cord 22, 744 as will be described in greater detail below. In other embodiments (e.g., FIG. 4), one or more of the electric vehicles 1018 are releasably electrically connected to the vehicular charging system 10, but are not mechanically connected thereto. In such cases, the electric vehicles 1018 can be electrically connected by use of induction charging as described in greater detail below.

Figure 2:
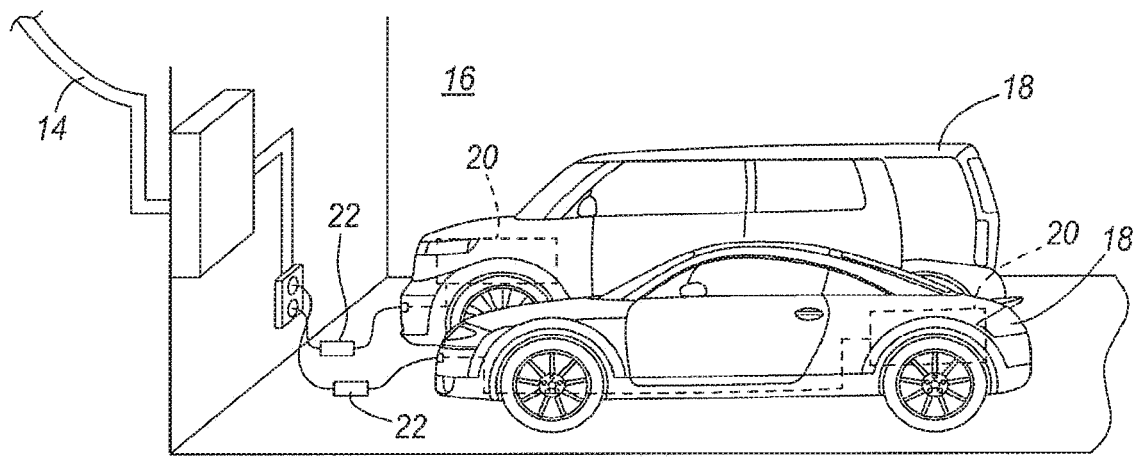
FIG. 2 illustrates a vehicular charging system according to an embodiment of the present invention.
Figure 5:
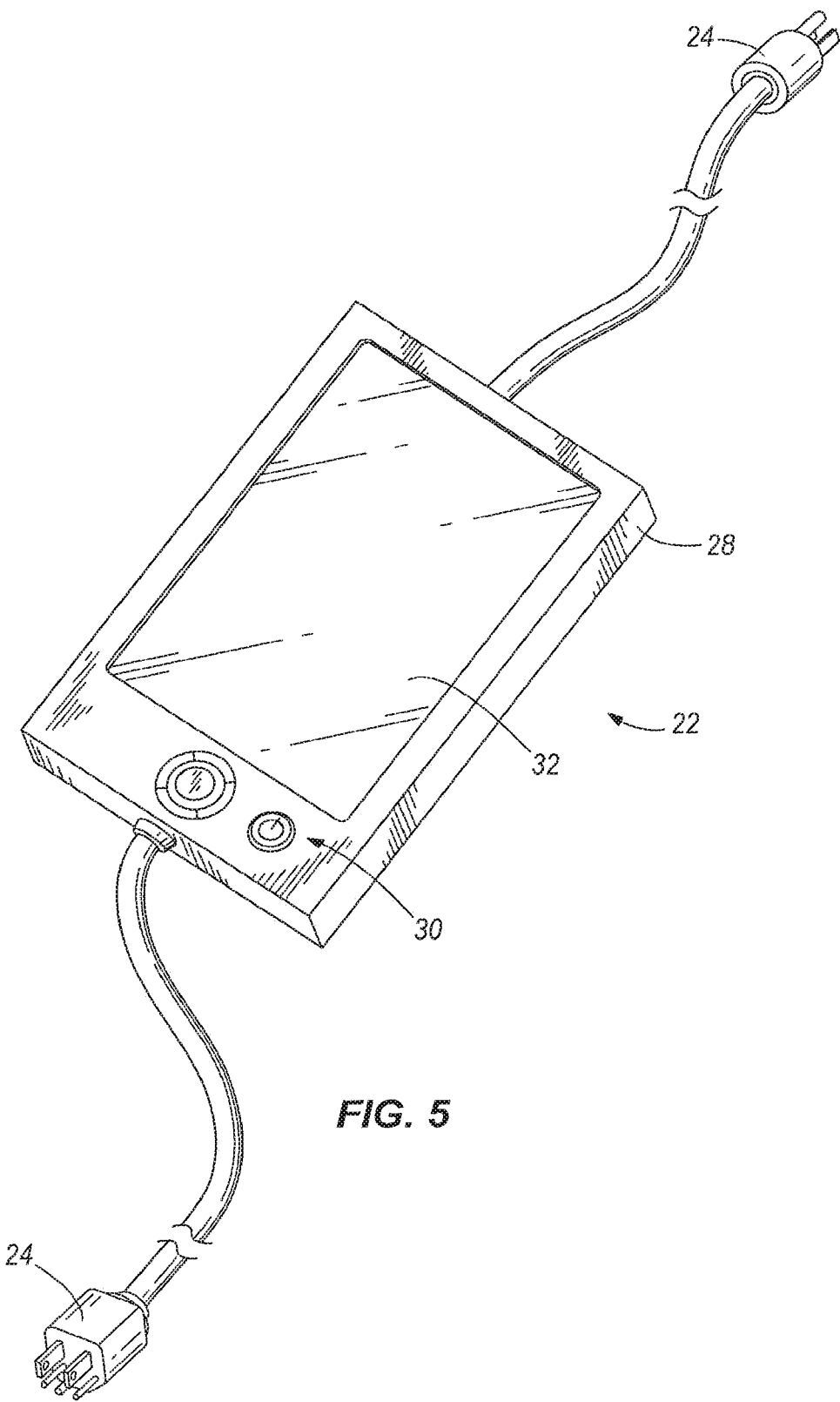
FIG. 5 is a perspective view of a vehicle charger according to an embodiment of the present invention.

A vehicle charging cord 22 according to an embodiment of the present invention is illustrated in FIG. 5, and is shown in use in FIG. 2. The illustrated vehicle charging cord 22 has a first end 24 adapted to releasably connect to an electrical outlet (not shown) of a business, residence, or other building or facility, and a second end 26 adapted to releasably connect to the electric vehicle 18. In this regard, the first end 24 can have, for example, a standard U.S. two-prong or three-prong male electrical connector (i.e., grounded or ungrounded) intended for connection to a 120V AC supply of electric current, a U.S. Type B electrical connector intended for connection to a 220V AC supply of electric current, any electrical connector suitable for a 240V AC supply of electrical current, a Japanese Type B electrical connector meeting JA1-15 electrical standards, a British Type G electrical connector meeting British BS 1363 electrical standards, a European Type F electrical connector meeting CENELEC electrical standards, a French Type E electrical connector meeting French electrical standards, a Chinese Type I electrical connector meeting Chinese electrical standards, or a Type D or M electrical connector meeting Indian electrical standards. Any other releasable electrical connector suitable for connection to an electrical outlet of a building or facility, or for connection to a power cord, power device, or other power interface with the electrical system of the building or facility can be used as desired. In this regard, although the first end 24 of the vehicle charging cord 22 shown in FIG. 5 has a U.S. Type B plug, it will be appreciated that the first end 24 can have any number and arrangement of blades, pins, and apertures for releasable mating engagement with an electrical connector of a power cord, power device, or other power interface as just described.

The second end 26 of the vehicle charging cord 22 can have any suitable plug for releasable connection with a mating electrical connector of the vehicle. In this regard, the second end 26 of the vehicle charging cord 22 can have any number of blades and/or pins for mating with associated apertures of the mating electrical connector of the vehicle, and can also or instead have any number of apertures for mating with associated blades and/or pins of the mating electrical connector of the vehicle. The second end 26 can be connected directly to an electrical connector of a vehicle, or to a power cord, power device, or other power interface with the electrical power system of a vehicle.

The vehicle charging cord 22 can be any gauge suitable for carrying electric current to charge the vehicle 18 and for also meeting country and local electrical codes. Also, the vehicle charging cord 22 illustrated in FIG. 5 is insulated with flexible plastic or other suitable material.

The vehicle charging cord 22 illustrated in FIGS. 2 and 5 also has a housing 28 intermediate the ends 24, 26 of the cord 22. In other embodiments, the housing 28 can be located at or define an end of the cord 22, in which case the housing 28 can carry any of the electrical connectors described above with regard to ends 24, 26 of the vehicle charging cord 22.

The illustrated housing 28 has a substantially parallelepiped shape. Depending at least in part upon the shape and size of the electronics within the housing (described below) for performing any desired electrical transformer function, and the shape and size of the electrical elements used for the control features described below, the housing 28 can be larger or smaller than that shown in FIG. 5, and can have any other shape desired, (e.g., a cube shape, a spherical, elliptical, or other rotund shape, an irregular shape, and the like).

Figure 15:
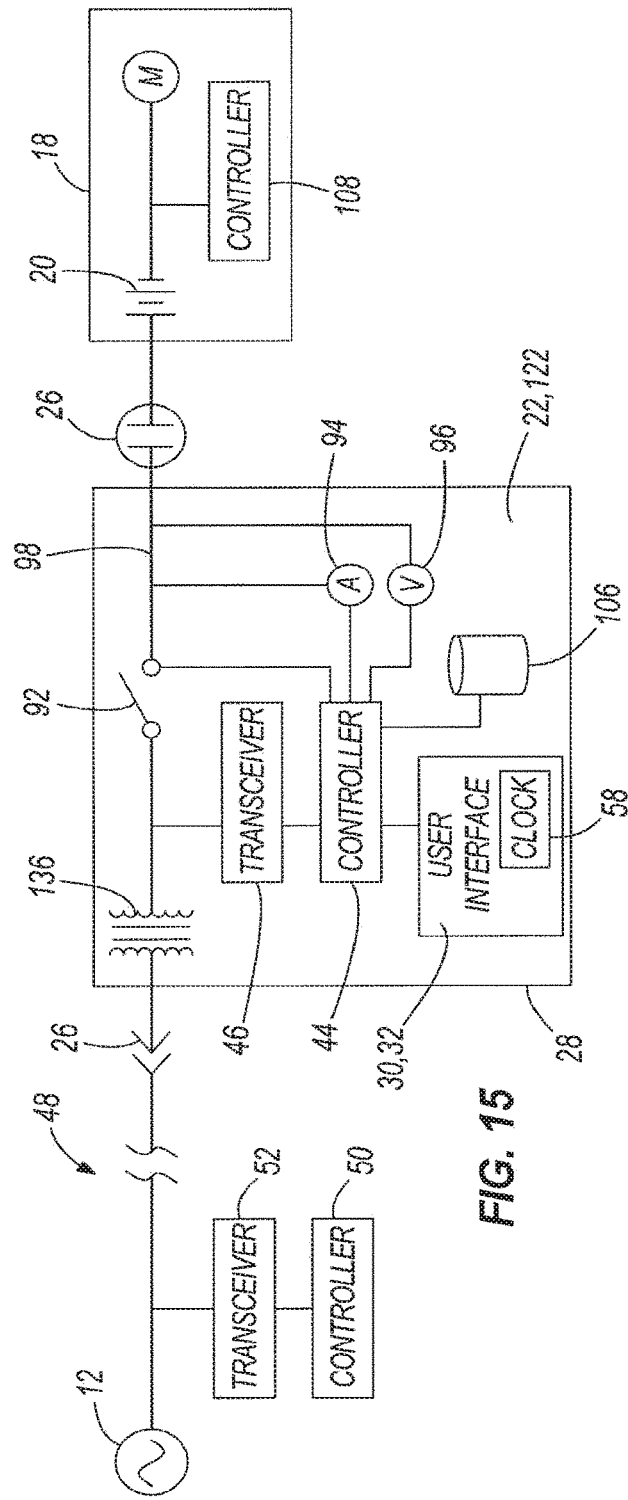
FIG. 15 is a schematic electrical diagram of a vehicular charging system according to an embodiment of the present invention.

With reference now to FIGS. 5-11, and also with reference to FIG. 15 (which illustrates a vehicular charging system utilizing the vehicular charger of FIGS. 2, 5-11, a number of user-manipulatable controls 30 and a display 32 are provided on the housing 28. The illustrated housing 28 also contains electrical components for transforming power supplied thereto (indicated generally at 136), and control circuitry for performing the vehicle battery charging management functions described in greater detail below. The display 32 shown in FIGS. 5-11 and 15 is an LCD display 32, although any other type of display can be used as desired. The user-manipulatable controls 30 include a power button 34, a number of navigation buttons 36, and a select button 38 (see FIGS. 6-11). The power button 34 can be pressed by a user to turn the vehicle charging cord 22 on and off, thereby enabling and disabling the vehicle charging cord 22 to charge one or more batteries 20 of a vehicle 18 connected thereto. The navigation buttons 36 can be pressed by a user to navigate through one or more screens upon the display 32 (described in greater detail below), whereas the select button 38 can be pressed by a user to select one or more options on the screen(s).

In the illustrated embodiment, four navigation buttons 36 (up, down, left, and right) are positioned around the select button 38, all of which are adjacent the power button 34. However, in other embodiments, the navigation buttons 36, select button 38, and power button 34 can be in any other arrangement on the housing 28. Also, it will be appreciated that the user-manipulatable controls 30 can be buttons as shown in FIGS. 5-11, but can instead or also be any other type of user-manipulatable control. For example, any of the user-manipulatable controls 30 can be dome or tact switch, heat-sensitive, or other types of buttons, can be knobs or dials, and the like. Also, fewer or more user-manipulatable controls 30 can be used in other embodiments, such as for vehicle charging cords 22 not having a power button 34 (i.e., automatically powered upon connection to a power source), vehicle charging cords 22 having more or fewer navigation buttons (depending in some embodiments upon the arrangement of options on screens 32 shown on the display 32), and the like.

Although a display 32 in conjunction with a number of button-type user-manipulatable controls 34, 36, 40 is employed in the embodiment of FIGS. 2, 5-11 and 15, in other embodiments, the display 32 and any number of the button-type user-manipulatable controls 34, 36, 40 can be replaced by a touch screen (not shown). The touch screen can enable a user to display options, navigate between two or more screens, and select options by inputting commands directly into the display 32, and in some embodiments can simplify control of the vehicle charging cord 22.

With reference now to FIG. 15, in some embodiments, the vehicle charging cord 22 has a controller 44 located within the housing 28 and at least partially controlling operations of the vehicle charging cord 22. The controller 44 in the illustrated embodiment of FIGS. 2, 5-11 and 15 is a programmable processor of any suitable type, but in some embodiments can take other forms such as non-programmable processor, a system of discrete logic elements, and any combination thereof. The illustrated vehicle charging cord 22 also has a transceiver 46 coupled to the controller 44, enabling the controller 44 to communicate with another controller. The other controller can be one or more processors of a personal computer, phone, PDA, or other processor-based device associated with a user of the vehicle charging cord 22, one or more processors of a server or other computer associated with a power utility providing power to the vehicle charging cord 22, and the like). In the illustrated embodiment of FIGS. 2, 5-11 and 15, the other controller is a remote computer of a power utility 48, and is indicated at 50. The controller 50 of the power utility 48 is coupled to a power utility transceiver 52 to enable the power utility 48 to communicate with the controller 44 of the vehicle charging cord 22.

The transceiver 46 of the vehicle charging cord 22 and the transceiver 52 for the computer of the power utility 48 can each take any suitable form. However, it will be appreciated that the transceiver 52 for the computer of the power utility 48 can be selected to enable the computer of the power utility 48 to communicate with multiple vehicle charging cord controllers 44 of the same or different users. Also, the transceiver 46 of the vehicle charging cord 22 and/or the transceiver 52 for the computer of the power utility 48 can be replaced by a separate transmitter and a separate receiver enabling two-way communication between the controller 50 of the power utility 48 and the controller 44 of the vehicle charging cord 22. Such communication can be via the power lines 14 (see FIG. 1) between the computer of the power utility 48 and the locations 16 at which the vehicle charging cord 22 is used. In this regard, reference herein and in the appended claims to a "receiver" and a "transmitter" is intended to encompass transceivers as well as separate receivers and transceivers.

Any power line communication (PLC) system or combination of PLC systems adapted for carrying data over power lines 14 can be used for communication between the controllers 44, 50 described above, such as distribution line carrier (DLC) PLC systems, broadband over lines carrier (BLC) systems, low-speed narrow-band communication systems (proposed and used in Demand Side Management systems), and the like. Communication between the controller 50 of the power utility 48 and the controller 44 of the vehicle charging cord 22 can be through any number of substations between the power utility 48 and the location 16 at which the vehicle charging cord 22 is used. Also, depending at least in part upon the PLC system(s) used, such communication can be through any number of repeaters as is well known to those skilled in the art of PLC systems.

The controller 50 of the power utility 48 (with which the controller 44 of the vehicle charging cord 22 communicates) can be located anywhere between the location 16 of the user and the sources of power 12. For example, the controller 50 of the power utility 48 can be located at a facility where power is generated, at an office of the power utility 48, at any of a number of substations between the source of power 12 and the location 16 of the user, and the like.

By connecting the first end 24 of the vehicle charging cord 22 to an electrical outlet of a building or facility (or to a power cord, power device, or other power interface with the electrical system of the building or facility), communication can be established over the vehicle charging cord 22, the electrical system of the home, building, or other facility (e.g., through wiring and one or more circuit breakers thereof), and low and high-voltage power lines to the power utility 48 and the controller 50 of the power utility 48 described above. In some embodiments, this communication can be established automatically upon plugging in the first end 24 of the vehicle charging cord 22, whereas in other embodiments, this communication is established when the vehicle charging cord 22 is turned on or when a user enters an appropriate command to establish this communication (described in greater detail below), or in any other suitable manner. Communication between processors established automatically upon their connection are well known to those skilled in the art, and are not therefore described further herein.

As discussed above, communication between the controller 44 of the vehicle charging cord 22 and the controller 50 of the power utility 48 can be over power lines, wiring, or other conductors. However, it will be appreciated that communication along any portion or all of the distance between the controller 50 of the power utility 48 and the vehicle charging cord 22 can include wireless communication. In such cases, any number of wireless transmitters and receivers (and associated antennae) can be used to send and receive communications between the controller 50 of the power utility 48 and the vehicle charging cord 22. By way of example only, the vehicle charging cord 22 can have a wireless processor and associated antenna, receiver, and transmitter enabling wireless communication with a wireless service provider, and ultimately to the controller 50 of the power utility 48. Like the PLC communication described above, wireless communication between the controller 50 of the power utility 48 and the vehicle charging cord 22 can be established automatically upon plugging in the first end 24 of the vehicle charging cord 22, when the vehicle charging cord 22 is turned on, or when a user enters an appropriate command to establish this communication (described in greater detail below).

In some embodiments, the controller 44 of the vehicle charging cord 22 communicates with a user's computer rather than, or in addition to, communicating with the controller 50 of the power utility 48. This communication can be any combination of wired or wireless communication. For example, a residence-based, office-based, or other facility-based PLC system can be used to communicate between the controller 44 of the charging cord 22 and a user's computer (via the electrical system of the residence, office, or other facility). In other embodiments, the vehicle charging cord 22 can have a wireless processor adapted for communication with a user's computer. Such communication can be through any suitable wireless personal area network (WPAN) (using, for example, ZigBee®, Bluetooth®, or any other WPAN wireless technology), wireless local area network (WLAN), and the like. Like the PLC communication described above, communication between the controller 50 of the power utility 48 and the user's computer can be established automatically upon plugging in the first end 24 of the vehicle charging cord 22, when the vehicle charging cord 22 is turned on, or when a user enters an appropriate command to establish this communication (described in greater detail below).

Upon connection with a user's computer (wireless or otherwise), a user can control the vehicle charging cord 22 in any of the same manners as a power utility 48 described in greater detail below. Alternatively or in addition, communication between the controller 44 of the vehicle charging cord 22 and the controller of 50 of the power utility 48 can be established through the user's computer. Specifically, wired or wireless communication between the controller 44 of the vehicle charging cord 22 and the user's computer can be used in conjunction with a connection between the user's computer and the controller 50 of the power utility 48 to enable communication between the controller 44 of the vehicle charging cord 22 and the controller 50 of the power utility 48. Such communication can thereby enable the power utility 48 to control the vehicle charging cord 22 (in any of the manners described below) via the user's computer.

With reference now to FIGS. 6-11, the illustrated vehicle charging cord 22 has a first screen 40 providing information regarding the vehicle charging cord 22, a battery connected thereto, and the status of charging operations of the vehicle charging cord 22. In the illustrated embodiment of FIGS. 2, 5-11 and 15, the screen 40 has a vehicle charging cord status indicator 42, which displays the status of charging operations. The status indicator 42 can indicate whether the vehicle charging cord 22 is charging a battery, the type of charging operations being performed by the vehicle charging cord 22, and/or whether an error in charging the battery has been detected.

Figure 6:
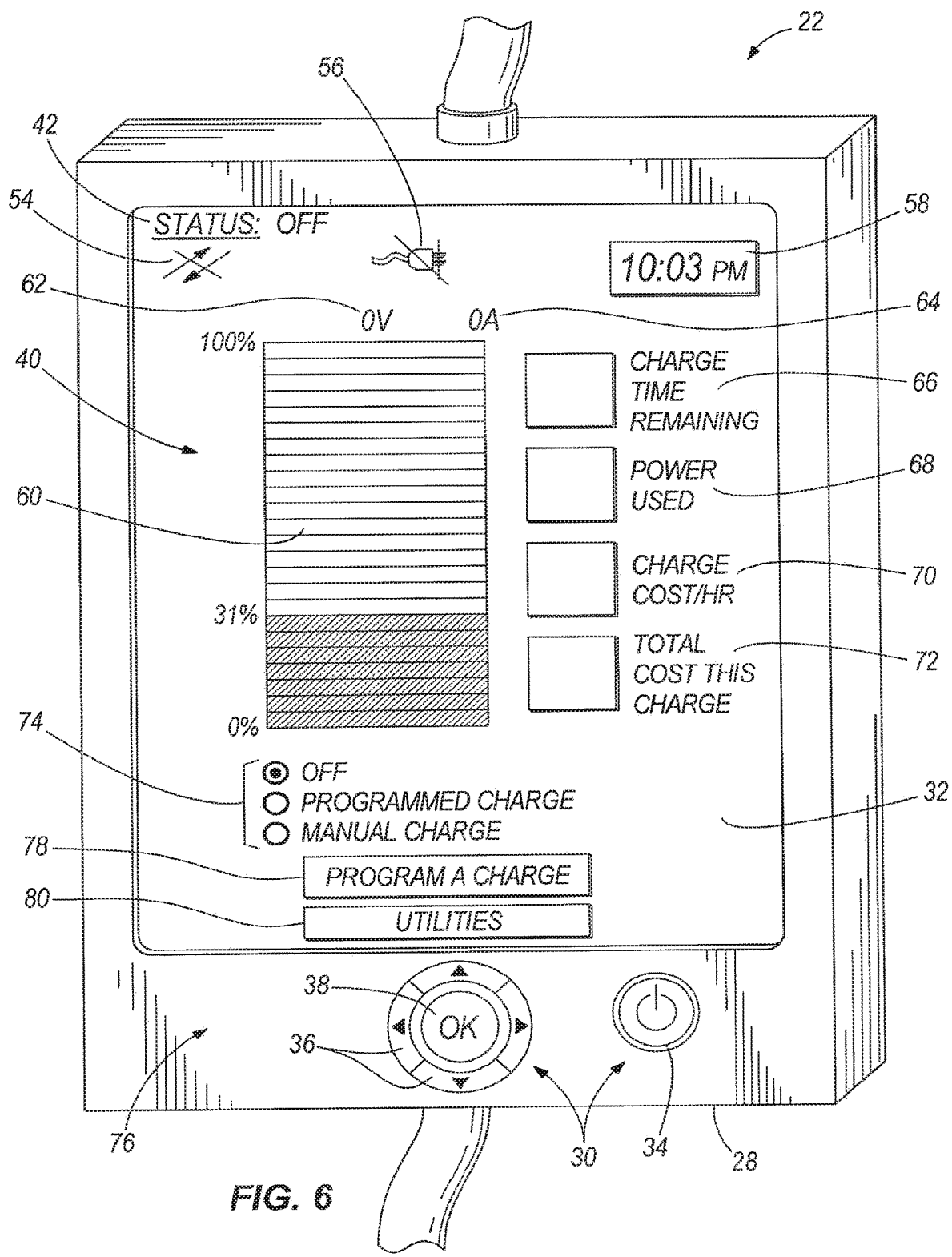
FIG. 6 is a perspective view of a portion of the vehicular charger illustrated in FIG. 5, shown in a first state.
Figure 7:
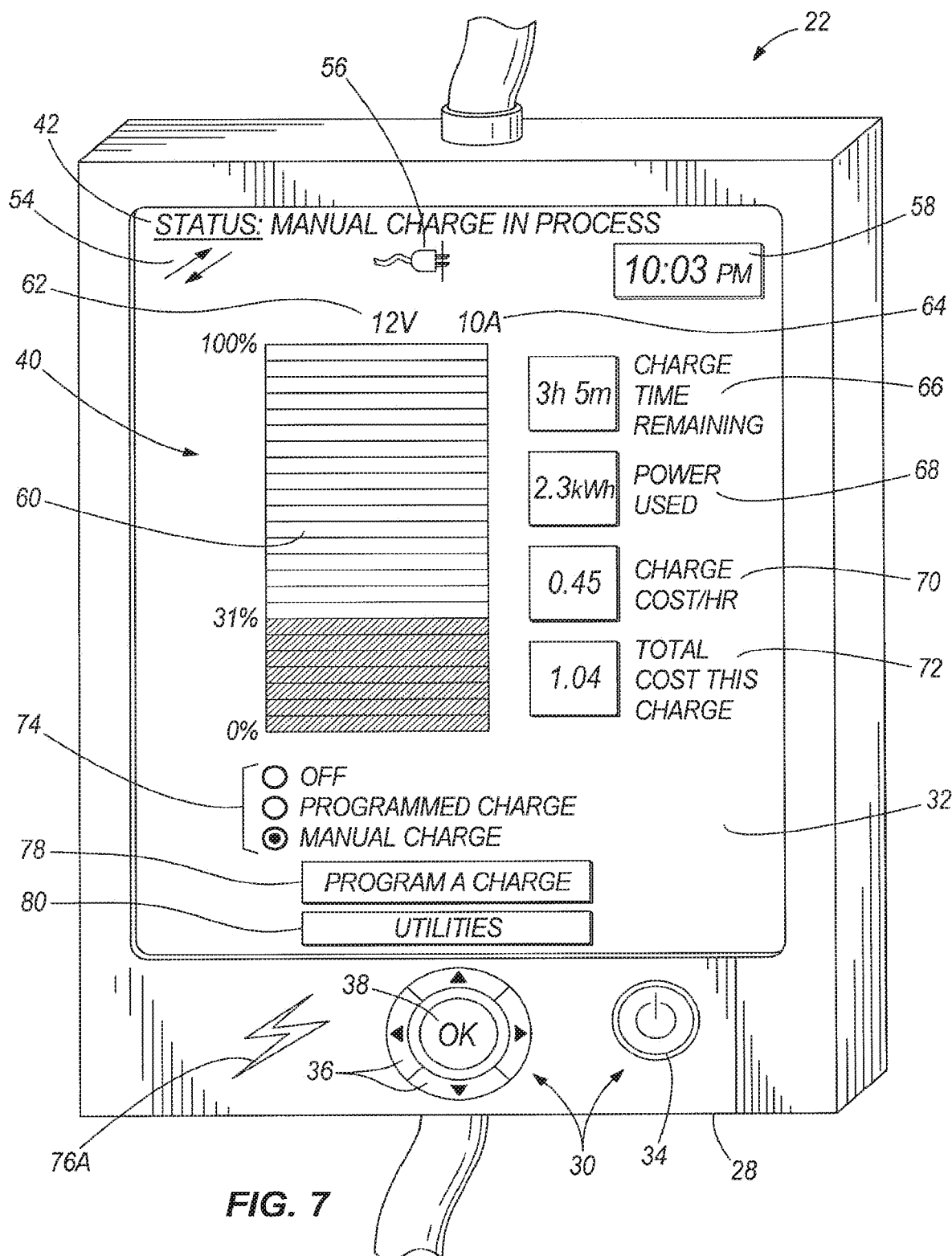
FIG. 7 is a perspective view of the vehicular charger illustrated in FIGS. 5 and 6, showing the vehicular charger in a second state.
Figure 8:
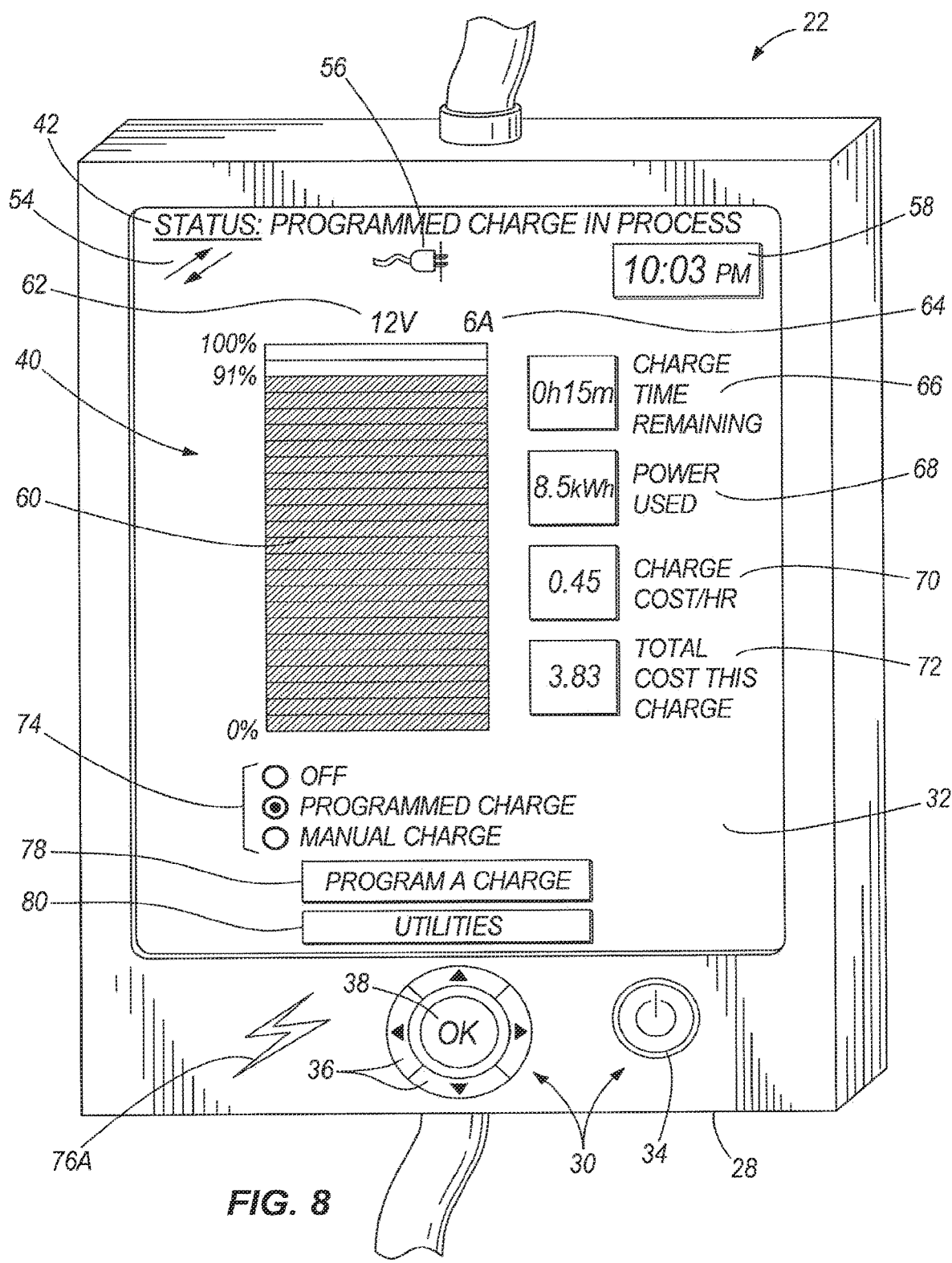
FIG. 8 is a perspective view of the vehicular charger illustrated in FIGS. 5-7, showing the vehicular charger in a third state.
Figure 9:
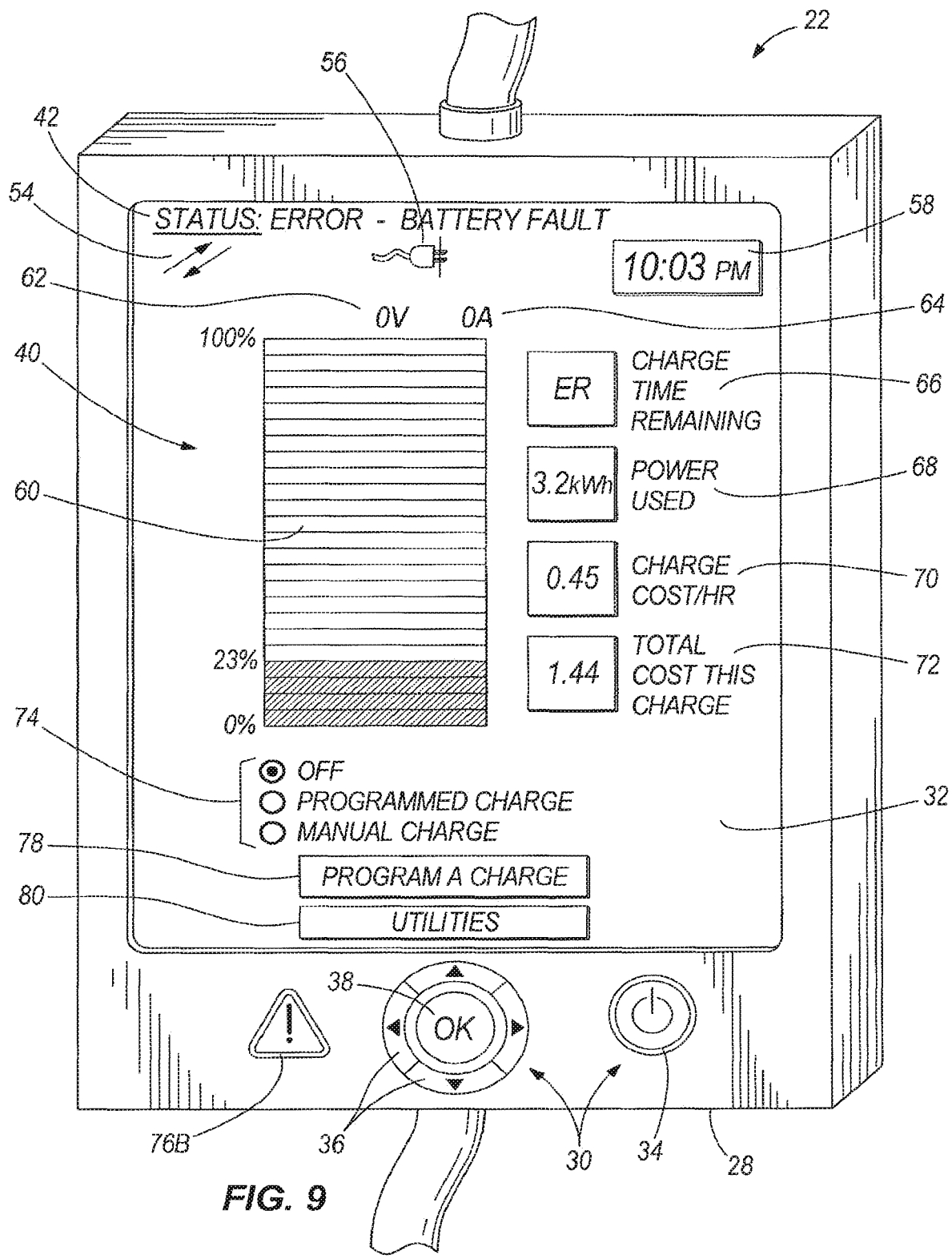
FIG. 9 is a perspective view of the vehicular charger illustrated in FIGS. 5-8, showing the vehicular charger in a fourth state.

In the state of the vehicle charging cord 22 shown in FIGS. 6, 10, and 11, the vehicle charging cord 22 is not charging a battery connected thereto, nor is the vehicle charging cord 22 programmed or otherwise controlled to charge a battery (described in greater detail below). Accordingly, the status indicator 42 displays "OFF". In the state of the vehicle charging cord 22 shown in FIG. 7, the vehicle charging cord 22 is in the process of charging a vehicle battery in "manual" mode (i.e., not based upon a time of day). Therefore, the status indicator 42 displays "MANUAL CHARGE IN PROCESS" in FIG. 7. In the state of the vehicle charging cord 22 shown in FIG. 8, the vehicle charging cord 22 is in the process of charging a battery based upon one or more instructions that can include a time of day to begin charging the battery and/or a time of day to stop battery charging (discussed in greater detail below). Accordingly, the status indicator 42 displays "PROGRAMMED CHARGE IN PROCESS" in FIG. 8. Finally, in the state of the vehicle charging cord 22 shown in FIG. 9, an error has been detected by the vehicle charging cord 22 in the process of attempting to charge the battery. Therefore, the status indicator 42 display "ERROR-BATTERY FAULT" in FIG. 9. In some embodiments, the vehicle charging cord 22 can have appropriate circuitry to detect a variety of charging problems, including without limitation a damaged battery, a damaged vehicle charging cord 22, a disconnection between the vehicle charging cord 22 and a source of power used to charge the vehicle battery, and/or a disconnection between the vehicle charging cord 22 and the battery to be charged. A large number of conventional circuits capable of detecting such problems exist, and are not therefore described further herein. Such circuits fall within the spirit and scope of the present invention.

The first screen 40 of the vehicle charging cord 22 illustrated in FIGS. 2, 5-11 and 15 also has a communication status indicator 54. The communication status indicator 54 indicates whether communication exists between the controller 44 of the vehicle charging cord 22 and a computer (e.g., a computer of the power utility 48, the user's computer, a mobile phone, PDA, or other processor-based device as described above, and the like). For example, in the "OFF" state of the vehicle charging cord 22 illustrated in FIG. 6, no communication exists between the controller 44 of the vehicle charging cord 22 and a computer, so the communication status indicator 54 displays an appropriate indicator.

Figure 10:
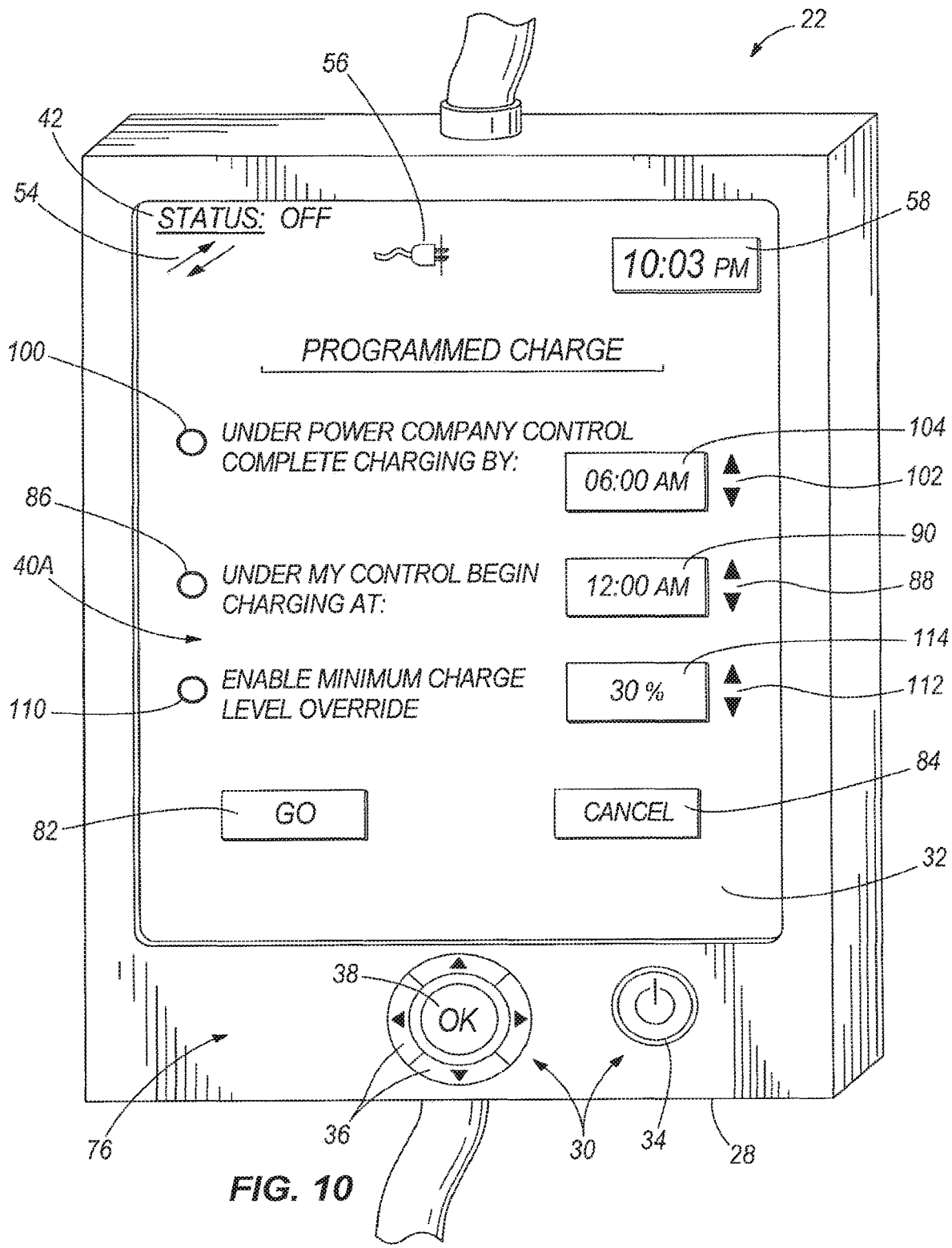
FIG. 10 is a perspective view of the vehicular charger illustrated in FIGS. 5-9, showing the vehicular charger in a fifth state.
Figure 11:
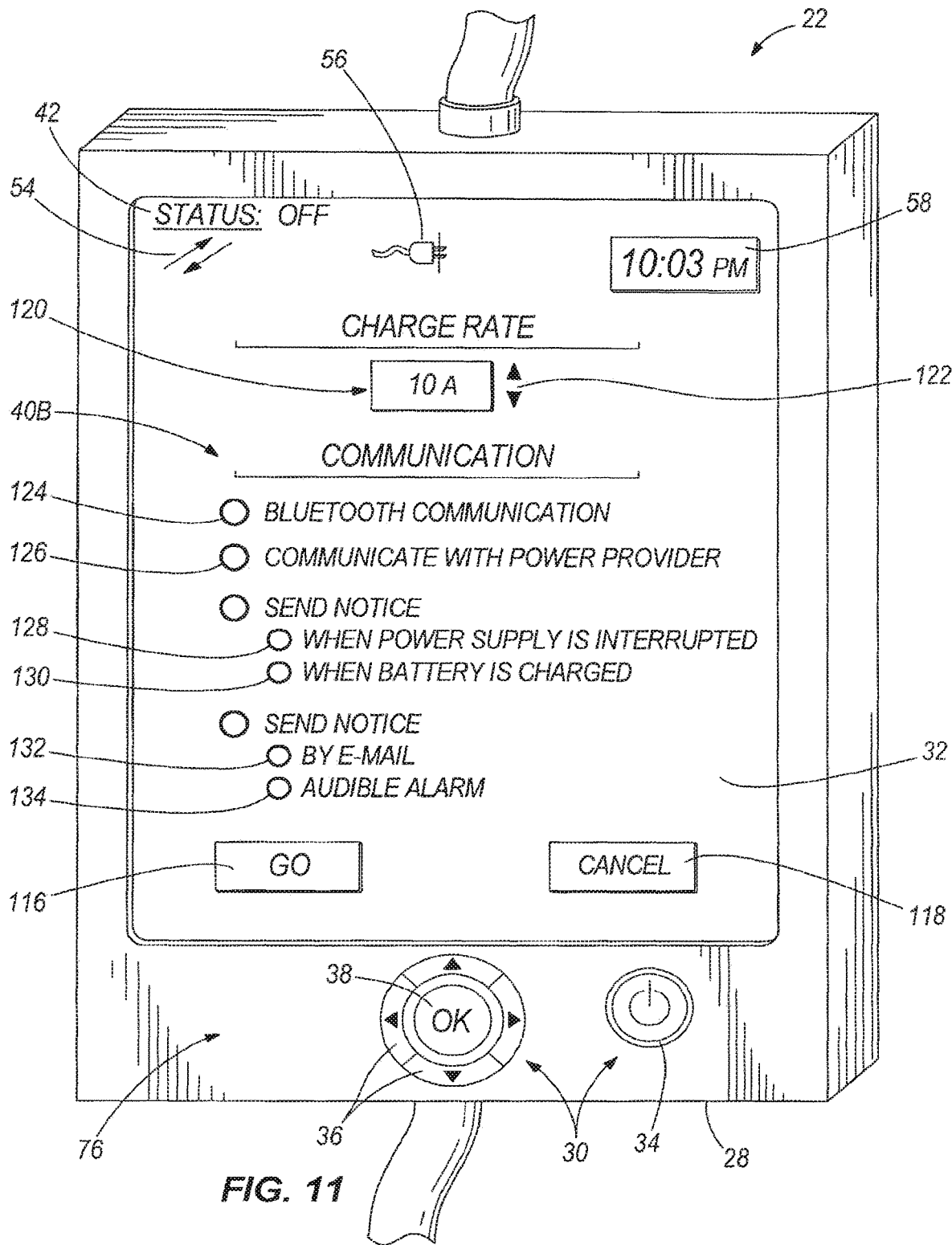
FIG. 11 is a perspective view of the vehicular charger illustrated in FIGS. 5-10, showing the vehicular charger in a sixth state.

In the other states of the vehicular charging cord 22 illustrated in FIGS. 7-11, including the states of FIGS. 10 and 11 where the vehicle charging cord 22 is in an "OFF" state but is not set to charge a battery, communication has been established and maintained between the controller 44 and a computer, so the communication status indicator 54 displays an indicator showing this status.

The first screen 40 of the vehicle charging cord 22 illustrated in FIGS. 2, 5-11 and 15 also has a power connection status indicator 56. The power connection status indicator 56 indicates whether an electrical connection exists between the vehicle charging cord 22 and a source of power (e.g., an electrical system of a house, office, facility, or other location) to charge a battery. When the first end 24 of the illustrated vehicle charging cord 22 is unplugged or is connected to an electrical system not providing power to the vehicle charging cord 22, the power connection status indicator 56 displays such an indicator (see, for example, FIG. 6). Otherwise, if a proper power connection is made, the connection status indicator 56 displays an appropriate indicator showing that such a connection has been made (see, for example, FIGS. 7-11).

A clock 58 is also displayed on the first screen 40 shown in FIGS. 6-9. Any form of clock can be displayed as desired, preferably indicating whether the displayed time is "A.M." or "P.M.". In some embodiments, time on the clock 58 is maintained by the controller 44 of the vehicle charging cord 22, and can be maintained even if no power is supplied to the vehicle charging cord 22 (e.g., when the vehicle charging cord 22 is unplugged) by a battery of the vehicle charging cord 22. Such a battery (not shown) can be connected to the controller 44 of the vehicle charging cord 22, can be located within the housing 28, and in some embodiments can be removed and replaced by a user as necessary via a door or other battery cover (also not shown). In these and other embodiments, the time displayed upon the clock 58 can be retrieved and displayed by the controller 44 from a computer upon establishment of communication with the computer in any of the manners described above.

The first screen 40 of the vehicle charging cord 22 illustrated in FIGS. 2, 5-11 and 15 also has a battery charge level indicator 60. Using any battery diagnostic circuitry desired, the controller 44 of the vehicle charging cord 22 can detect the level of charge of a battery 20 to which the vehicle charging cord 22 is connected (e.g., by the plug on the second end 26 of the vehicle charging cord 22 described above). The battery charge level indicator 60 illustrated in FIGS. 6-9 is a bar chart displaying charges ranging from 0% to 100%, and also displaying the percentage of full charge of a vehicle battery 20 to which the vehicle charging cord 22 is connected (e.g., 31% in FIG. 6). However, other types of battery charge level indicators 60 can be used in other embodiments.

For example, the battery charge level indicator 60 can be simply a number (e.g., the percentage of full charge of the battery 20, the exact charge level of the battery in amp-hours or in another unit of measurement, another number representative of the amount of charge of the battery 20 but not necessarily in units conventionally used to indicate battery charge, and the like). As another example, the battery charge level indicator 60 can also or instead include any other chart or visual representation, such as a pie chart, an escalating series of bars having different lengths, a symbol having different colors and/or brightness levels representing different battery charge levels, a gauge with a needle or other pointer, text in any language indicating the level of battery charge (e.g., "empty, very low, low, high, full"), and the like.

The battery charge level indicator 60 can comprise any graphics, text, or combination of graphics and text to convey the level of charge of the battery 20 to a user, and can be any size desired on the first screen 40. The controller 44 of the vehicular charging cord 22 can monitor the charge level of the battery 20 being charged, and can update the battery charge level indicator 60 continuously or on a periodic basis.

In some embodiments, the first screen 40 of the vehicular charging cord 22 also displays the voltage and/or amperage used to charge a battery 20 connected thereto. These voltage and/or amperage indicators are included in the embodiment of the vehicle charging cord 22 shown in FIGS. 2, 5-11 and 15, and are given reference numbers 62 and 64, respectively.

As also shown in FIGS. 6-9, the first screen 40 of the vehicle charging cord 22 can include other information regarding the status of a battery charging session performed by the vehicular charging cord 22, including the amount of time estimated to completely charge the battery 20 (in minutes, minutes and hours, or in any other format), the estimated or actual amount of power already consumed during the present charging session (in kWh or in any other unit of measurement), the actual or estimated cost of charging the connected battery 20 per hour or other unit time, and/or the total actual or estimated cost of the current charging session to the present time. Each of these examples of information is displayed on the first screen 40 shown in FIGS. 6-9, and is indicated with reference numbers 66, 68, 70, and 72, respectively.

The charge time remaining indicator 66 and the power used indicator 68 can be calculated by the controller 44 in any of a number of manners well known to those in the art of battery charging and electrical power metering technology. In this regard, it will be appreciated that the charge time remaining can be calculated taking into account the non-linear rate of charging for many batteries 20, wherein the rate of battery charge at different levels of battery charge changes. Formulas for such estimates are well known to those skilled in the art of battery charging, and are not therefore described further herein. The charge cost per hour indicator 70 can be retrieved and displayed by the controller 44 from a computer upon establishment of communication with the computer in any of the manners described above, or can be manually entered into the vehicle charging cord 22 by a user using the user-manipulatable controls 30 and an appropriate data entry cell or menu on the display 32 (not shown). In those embodiments in which the charge cost per hour is retrieved from another computer as described above, the controller 44 can retrieve a cost per kWh figure directly from the power utility 48 (e.g., from the controller 50 of a computer of the power utility 48), from the user's computer in which is stored a cost per kWh figure entered there or retrieved by the user's computer, and the like, and can multiply that figure by an estimated kWh level at which the vehicle charging cord 22 will charge the battery 20 to display the charge cost per hour 70 for the current battery charging session. The total cost to the present time for a charging session 72 can be calculated by the controller 44 simply by multiplying the values of indicators 68 and 70 together.

In some embodiments, any or all of the indicators 66, 68, 70, and 72 can be updated periodically during a charging session, such as every second, minute, or other time interval. Any or all of the indicators 66, 68, 70, 72 can be continually updated by receiving streaming data from the controller 50 of the power utility 48 or from the user's computer. For example, the charge time remaining indicator 66 can be updated by the controller 44 every second or minute based upon battery charge calculations made at the beginning of the charging session or made periodically during the charging session. As another example, the power used indicator can be updated by the controller 44 every second, minute, or in greater periods of time based upon the actual or estimated power delivered via the vehicle charging cord 22. As yet another example, the charge cost per hour indicator 70 can be updated every second, minute or other time period based upon cost information retrieved by the controller 44 from the controller 50 of the power utility 48 or the user's computer, and/or can be updated immediately upon receiving streaming or batch-loaded power cost information from the controller 50 of the power utility 48 or the user's computer.

The first screen 40 of the vehicle charging cord 22 illustrated in FIGS. 2, 5-11 and 15 also has a battery charge selector 74 by which a user can select the manner in which the vehicle charging cord 22 will charge a vehicle battery 20. By pressing the navigation buttons 36 and then the select button 38 described above, a user can highlight a desired manner in which the vehicle charging cord 22 will charge a vehicle battery 20 connected thereto. The battery charge selector options illustrated in FIGS. 6-9 include "OFF", "PROGRAMMED CHARGE", AND "MANUAL CHARGE", any of which can be highlighted and selected by a user as just described. Although a radio button format of the battery charge selector 74 is illustrated in the embodiment of FIGS. 2, 5-11 and 15, the battery charge selector 74 can have any other form desired, including without limitation a drop-down or pop-up menu, and the like. Upon selecting the desired charge state as just described, the vehicle charging cord 22 can immediately begin a charging session by beginning to supply current to the battery 20 to which the vehicle charging cord 22 is connected (e.g., by closing a switch 92 coupled to the controller 44 as described in greater detail below), or can begin such a session after a user then presses the power button 34. For example, if the power button 34 is selected after the "MANUAL CHARGE" button has been selected, the controller 44 can causes the switch 92 to close without delay in order to begin charging the vehicle battery 20, whereas if the power button 34 is selected after the "PROGRAMMED CHARGE" button has been selected, the controller 44 can cause the switch 92 to close only after one or more conditions have been met as will be described in greater detail below. In any case, once a user commands and enables the vehicle charging cord 22 to begin charging immediately or to begin charging at a later time based upon a set of instructions as described elsewhere herein, a vehicle charging session begins.

The operational status of the vehicle charging cord 22 can be displayed by the vehicle charging cord 22 in a number of different manners and locations. For example, the vehicle charging cord status indicator 42 described above can be provided. Alternatively or in addition, one or more graphics (e.g., symbols, colors, and the like) providing the same general status indicators (e.g., off, charging in process, error) can be displayed elsewhere on the housing 28, such as through a translucent or transparent portion of the housing 28, through a lens located on the housing 28, and the like. In this regard, one or more graphics can be printed on the interior and/or exterior of the housing 28, can be invisible or substantially not visible to a user when not illuminated, and can be illuminated by one or more lamps, LEDs or other light sources within the housing 28 when such graphics are to be displayed. By way of example only, the controller 44 can display a battery charging symbol such as that shown in FIGS. 7 and 8 in a first charge status display area 76A when a charging session is in process, or when the vehicle charging cord 22 is in the process of charging a battery 20 (as described in greater detail below, the battery 20 may not be actively charging the battery 20 at one or more times during a charging session). As another example, the controller 44 can display an error symbol such as that shown in FIG. 9 in the same or a different charge status display area 76B when any of the battery charging errors described above have been detected. Still other battery charging symbols indicating any other information regarding the status of the vehicle charging cord 22 and its operation can be displayed anywhere on the housing as a supplement to or in addition to the information shown on the display 32 described above. In some embodiments, one or more status display areas 76 as just described can even replace the display 32.

With continued reference to the illustrated embodiment of FIGS. 2, 5-11 and 15, in some embodiments, the controller 44 of the vehicle charging cord 22 can display two or more different screens upon the display 32. This control enables a user to view substantially more information than that available from other types of displays and from other types of controls and indicators on the housing 28. By way of example only, two such alternative screens 40A, 40B are illustrated in FIGS. 10 and 11, respectively, and can be accessed in a number of different manners. In some embodiments, each screen 40, 40A, 40B is accessed by selecting a navigation button, such as by using navigation button 36 in the illustrated embodiment to highlight a desired navigation button on the screen 40, 40A, 40B. In other embodiments, one or more navigation buttons 36 on the housing 28 are provided to move between screens 40, 40A, 40B, such as forward and back buttons, a single button to scroll though two or more screens 40, 40A, 40B, and the like. Although three different screens 40, 40A, 40B can be shown upon the display 32 in the illustrated embodiment of FIGS. 2, 5-11 and 15, any other number of displays (e.g., 1, 2, 4, or more) can be shown upon the display 32, and can include any number and arrangement of the indicators, selectors, and other information described herein. In still other embodiments, a single screen 40 is provided, only a portion of which is visible on the display 32 at any given time. In such cases, other portions of the screen 40 can be viewed by scrolling in any desired direction using one or more navigation buttons 36 or other user-manipulatable controls on the housing 28.

In the illustrated embodiment of FIGS. 2, 5-11 and 15, the first screen 40 has two navigation buttons 78, 80, each of which causes the controller to display a different screen 40A, 40B when selected by a user in the manner described above. When a first "PROGRAM A CHARGE" navigation button 78 is selected by a user, the controller 44 replaces the first screen 40 with a second screen 40A shown in FIG. 10. This second screen 40A enables a user to change the manner in which the vehicle charging cord 22 will operate to charge one or more batteries 20 connected thereto. The second screen 40A also has navigation buttons 82, 84 that can be selected by a user to return to the first screen 40, whether by making one or more changes to operation of the vehicle charging cord 22 (by selecting the "GO" navigation button 84), or by making no changes to operation of the vehicle charging cord 22 (by selecting the "CANCEL" navigation button 84). In the illustrated embodiment, selection of either navigation button 82, 84 on the second screen 40A will return the user to the first screen 40.

A valuable feature of the vehicle charging cord 22 of FIGS. 2, 5-11 and 15 is the ability of a user to at least partially control when the vehicle charging cord 22 will begin to charge one or more batteries 20 connected thereto. In many geographic locations, times of day, and times of the year, the ability of power utilities 48 to supply the full power demand of users is limited or is inadequate. Although power utilities can often generate or otherwise obtain additional power at peak periods, such power often comes at a higher price to the power utility 48. Regardless of whether a higher price is paid by the utility, higher power prices are often charged to consumers of the power utility 22 during peak periods. In many cases, power utilities 48 encourage their customers to consume power at non-peak periods, such as a nighttime, and often give significant discounts to those who consume power during such periods. The vehicle charging cord 22 of FIGS. 2, 5-11 and 15 enables the user to take advantage of such cost savings by controlling when vehicle battery charging will occur. Even in those cases where savings to the power consumer are not provided, the vehicle charging cord 22 can be used to reduce power draw upon power utilities 48 at peak times and/or to better manage power consumption.

With reference to FIG. 10, the second screen 40A (entitled the "Programmed Charge" screen in FIG. 10) can show any amount of the information shown on the first screen 40 described above, such as the vehicle charging cord status indicator 42, the communication status indicator 54, the power connection status indicator 56, and the clock 58. The second screen 40A enables a user to select a time at which the vehicle charging cord 22 will begin charging a battery 20 connected thereto. For this purpose, the second screen 40A has a button 86 that can be selected (e.g., by user manipulation of the navigation and select buttons 36, 38 as described above) to set the vehicle charging cord 22 to begin charging at a desired time of day. This time of day can be changed and set by one or more time change buttons 88, such as by using the navigation buttons 36 to highlight one of the time change buttons 88 and by using the select button 38 to change the charge start time 90 displayed on the second screen 40A. Any other manner of changing and selecting a desired time can be used as desired, including without limitation drop down or pull-up menus displaying various charge start times that can be selected.

Once a charge start time has been selected by a user as just described, the user can select the navigation button 82 described above to return to the first screen 40, and can command the vehicle charging cord 22 to begin a charging session by pressing the power button 34. By doing so, the controller 44 of the vehicle charging cord 22 will compare the start time 90 entered by the user to the current time of day (e.g., displayed by the clock 58 as described above), and will begin charging the battery 20 at the entered charge start time 90. With reference to FIG. 15, the vehicle charging cord 22 can have a relay or other electrical switch 92 coupled to the controller 44 and operable by the controller 40 to close at the charge start time 90. Once the charge start time 90 has been reached, the controller 40 can automatically close the switch 92, thereby supplying a current to the battery 20 for charging the battery 20. The switch 92 can remain closed until the controller 40 detects that the battery 20 is fully or sufficiently charged, until an error in charging is detected (as described above), or in some embodiments until a charge stop time or other triggering event occurs. When any such condition is reached, the switch 92 can open, thereby stopping current flow to the battery 20 and stopping the battery charging process. The vehicle charging cord 22 can be provided with any battery charge circuitry suitable for charging the battery 20. Such battery charge circuitry is well know, and can include one or more voltmeters and/or amp meters for this purpose.

For example, the vehicle charging cord 22 illustrated in FIGS. 2, 5-11 and 15 includes an amp meter 94 and a volt meter 96 electrically coupled to a power line 98 supplying power to the battery 20. The controller 44 can utilize information from the amp meter 94 and/or volt meter 96 to determine whether the battery 20 is fully charged, and to automatically stop charging the battery 20 (e.g., by opening the switch 92) when the battery 20 is fully charged.

Accordingly, the vehicle charging cord 22 can be programmed to begin charging a battery 20 connected thereto at any time of day desired by a user. A user can therefore select an off-peak power time, and in some applications when the cost of power is reduced.

It will be appreciated that the time selected by a user to begin charging the battery 20 may not be the most optimal time for a power utility 48 to supply power for charging the battery 20. For example, in an emergency or during an unexpected surge of power demand, an otherwise off-peak time to begin charging the battery 20 may not be desirable for the power utility 20. As another example, widespread use of the vehicle charging cord 22 may result in surges of power demand at particular off-peak times, such as at midnight, 1 a.m., 2 a.m., or other charge start times that may be commonly selected by users in programming the vehicle charging cord 22 as described above. Another valuable feature of the vehicle charging cord 22 illustrated in FIGS. 2, 5-11 and 15 can help to reduce or eliminate these problems. With reference again to FIG. 10, the second screen 40A has another button 100 that can be selected (e.g., by user manipulation of the navigation and select buttons 36, 38 as described above) to set the vehicle charging cord 22 to complete charging by a desired time of day. This time of day can be changed and set by one or more time change buttons 102, such as by using the navigation buttons 36 to highlight one of the time change buttons 102 and by using the select button 38 to change the charge completion time 104 displayed on the second screen 40A. Any other manner of changing and selecting a desired time can be used as desired, including without limitation drop down or pull-up menus displaying various charge start times that can be selected.

Once a charge start time has been selected by a user as just described, the user can select the navigation button 82 described above to return to the first screen 40, and can command the vehicle charging cord 22 to begin a charging session by pressing the power button 34. In such cases, the controller 44 receives the charge completion time 90 and can delay the start time at which battery charging will commence based upon one or more factors (described below).

In some embodiments, the controller 44 automatically retrieves power information from a memory 106 coupled to the controller 44. This power information can include the cost of power per unit time, one or more pre-set times, and the like, and can be saved in the memory 106 by the controller 44. The controller 44 can receive the power information from the transceiver 46 of the vehicle charging cord 22, which can receive the power information in communication with the controller 50 and transceiver 52 of the power utility 48 and/or in communication with the user's computer. This communication can occur in any of the manners described above regarding the communication between the controllers 44, 50 and/or between the controller 44 and the user's computer. In this regard, the information can be originally produced by the power utility 48, or can be produced by a user entering the information into the user's computer for transfer to the controller 44 and memory 106 of the vehicle charging cord 22.

The controller 44 can delay the time at which battery charging will begin based upon the power information just described, whether stored in the memory 106 of the vehicle charging cord 22 or retrieved from the power utility 48 without being stored in the memory 106. In some embodiments, the battery charging start determined by the controller 44 can be based upon a threshold cost of power reached over a period of time. This cost of power can be received periodically by the controller 44 from the power utility 48, such as by the controller 44 of the vehicle charging cord 22 polling the controller 50 of the power utility 48, or by the controller 50 of the power utility 48 regularly sending or streaming updated cost of power information to the controller 44 of the vehicle charging cord 22. Upon reaching a desired cost of power (e.g., $0.50/hr., $0.45/hr., $0.40/hr.), the controller 44 of the vehicle charging cord 44 can automatically cause the switch 92 to close, thereby charging the vehicle battery 20. This threshold cost of power can be input by a user into the vehicle charging cord 22 in any of the manners described above in connection with other information entry, such as by another data entry field similar to that of the desired charge start time 90 or the desired charge completion time 104.

In some embodiments, the controller 44 can also automatically cause the switch 92 to open if a desired cost of power threshold is reached, thereby interrupting battery charging. In such cases, battery charging can resume in the same manner as it began when the cost of power lowers as detected by the controller 44 of the vehicle charging cord 22. Any number of interruptions and resumptions in charging the vehicle battery 20 can take place in this manner.

In some embodiments, the controller 44 detects a command from the user to begin a charging session, and through communication with the controller 50 of the power utility 48 (whether initiated by the controller 44 of the vehicle charging cord 22 or initiated by the controller 50 of the power utility 48 by periodic polling or in any other manner), provides a signal to the controller 50 of the power utility 48 that a charging session has been requested. Upon receiving this signal, the controller 50 of the power utility 48 can request or otherwise receive the charge completion time 104 from the controller 44 of the vehicle charging cord 22. In some embodiments, additional information regarding the charging session can also be received, such as the level of charge of the battery 20 connected to the vehicle charging cord 22, and/or the estimated charge time remaining (discussed above in connection with the charge time remaining indicator 66). Still other information can be received by the controller 50 of the power utility 48, such as the capacity of the battery 20, the battery type, the manufacturer of the battery 20, the model or other identification information of the battery 20, and/or the battery age.

Any or all of this information can be retrieved by or transmitted to the controller 44 of the vehicle charging cord 44 by communication with a controller 108 of the battery 20 (i.e., for batteries 20 having an integrated circuit or other controller adapted for communication with another controller, otherwise known as "smart batteries") or vehicle. For example, the battery capacity, type, manufacturer, model or other identification information, and/or age can be stored in a memory (not shown) of the battery 20 coupled to and accessible by a controller 108 of the battery 20. This information can be stored in the memory of the battery 20 by the manufacturer, supplier, and/or servicer of the battery 20, or in some embodiments by a user. As another example, any or all of this information can be stored in a memory (not shown) of the vehicle 18 coupled to and accessible by a controller 108 of the vehicle 18. This information can be stored in the memory of the vehicle 18 by the manufacturer, supplier, and/or servicer of the vehicle 18, or in some embodiments by a user. For example, upon installation of a battery into the vehicle 18, the installer can access the controller 108 of the vehicle 18 in a conventional manner to record the battery capacity, type, manufacturer, model or other identification information, and/or age in a memory associated with the vehicle 18. Any of this information can be transmitted to or retrieved by the controller 44 of the vehicle charging cord 22 automatically upon connection to the vehicle 18 or at any other time, and in some embodiments can be stored in the memory 106 of the vehicle charging cord 22. In some embodiments, any of this information can then be retrieved from the memory 106 of the vehicle charging cord 22 and/or from the memory of the vehicle 18 for transmission to the controller 50 of the power utility 48 or for determining when to begin charging a battery 20 based upon any of the embodiments described herein.

Based upon the battery information obtained by the power utility 48 as described above, the power utility 48 can determine an desirable time to begin charging the battery 20 connected to the vehicle charging cord 22. This time can be based upon a number of factors that are specific to the requested charging session, such as the charge time completion for the requested charging session, as well as other factors that are independent of the requested charging session, such as the current and anticipated power draw by other customers of the power utility 48, and/or the current and anticipated cost of power to the power utility 48. Accordingly, based upon the battery information obtained by the power utility 48, the power utility 48 can control when the vehicle charging cord 22 starts to charge the battery 20 connected thereto. This control can occur, for example, by sending a signal from the controller 50 of the power utility 48 to the controller 44 of the vehicle charging cord 22 at a desired start time to trigger closure of the switch 92, or by sending a signal from the controller 50 of the power utility 48 to the controller 44 of the vehicle charging cord 22 to close the switch 92 at a particular future time (which time can be stored in the memory 106 of the vehicle charging cord 22 or can begin a timer counting to that particular time of day), or in other manners. In this manner, the power utility 48 can maintain a degree of control over power draw while still following an instruction by the user to complete a vehicle charging session by a desired time.

As just described, in some embodiments the power utility 48 can control when the vehicle charging cord 22 begins charging a battery 20 connected thereto. Alternatively or in addition, in some embodiments the power utility 48 can interrupt charging of a vehicle battery 20 in the event that it is desirable to delay the remainder of the charging process, such as during a surge of demand occurring while a battery 20 is being charged, in an emergency, and the like. This interruption can occur, for example, by sending a signal from the controller 50 of the power utility 48 to the controller 44 of the vehicle charging cord 22 at a desired interruption time to trigger the switch 92 to open, or by sending a signal from the controller 50 of the power utility 48 to the controller 44 of the vehicle charging cord 22 to open the switch 92 at a particular future time (which time can be stored in the memory 106 of the vehicle charging cord 22 or can begin a timer counting to that particular time of day), or in other manners. The power utility 48 can resume charging the vehicle battery 20 in the same manner as described above in connection with beginning to charge the vehicle battery 20. Any number of interruptions and resumptions in charging the vehicle battery 20 can take place based upon the desires and needs of the power utility 48 and the power draw upon the power utility 48.

Although it is desirable in some applications to delay the time at which charging of the vehicle battery 20 will begin based upon any of the embodiments described herein, it is also desirable in many cases to insure that a minimum level of battery power is immediately available to the user. This minimum level of battery power can be needed, for example, in case of emergency, or in the event that the user unexpectedly needs use of the vehicle 18. In such cases, the vehicle charging cord 22 illustrated in FIGS. 2, 5-11 and 15 has another valuable feature. With particular reference to FIG. 10, the second screen 40A of the illustrated vehicle charging cord 22 has a button 110 that can be selected (e.g., by user manipulation of the navigation and select buttons 36, 38 as described above) to set the vehicle charging cord 22 to immediately begin charging the battery 20 until a minimum threshold level of battery charge has been reached regardless of whether a programmed charge has also been selected as described above. This minimum threshold level of battery charge can be changed and set by one or more charge level buttons 112, such as by using the navigation buttons 36 to highlight one of the charge level buttons 112 and by using the select button 38 to change the minimum threshold level of battery charge 114 displayed on the second screen 40A. Any other manner of changing and selecting a desired minimum level of battery charge can be used as desired, including without limitation drop down or pull-up menus displaying various levels of battery charge that can be selected.

When the button 110 is selected (and in some embodiments, after the user selects the navigation button 82 described above to return to the first screen 40, and after the user commands the vehicle charging cord 22 to begin a charging session by pressing the power button 34), the controller 44 determines whether the charge level of the vehicle battery 20 connected thereto is below the threshold input by the user. The battery charge level can be determined as described above. If the battery charge level is below the threshold input by the user, or in some cases at or below the threshold input by the user, the controller 44 of the vehicle charging cord 22 automatically causes the switch 92 to close, thereby charging the vehicle battery 20 without delay. If the user has also requested a programmed charge as described above, the vehicle charging cord 22 continues to charge the vehicle battery 20 until the minimum threshold level of battery charge 114 has been reached. At this time, the vehicle charging cord 22 resumes operation in programmed mode. For example, if the charge start time 90 has already passed or if the current cost of power is below the desired cost of power as described above, the controller 44 can continue to charge the vehicle battery 20, and can do so without interruption following battery charging to the minimum threshold level of battery charge as just described. As another example, if the power utility 48 had determined that the vehicle battery 20 should be charged (e.g., based at least in part upon a charge completion time 104 entered by a user as also described above), the controller 44 can continue to charge the vehicle battery 20, and can do so without interruption following battery charging to the minimum threshold level of battery charge as just described.

Of course, if the vehicle charging cord 22 is operating in a manual charge mode (e.g., not based upon a time of day as selected using buttons 86 and 100), the vehicle charging cord 22 can begin to charge the vehicle battery 20 immediately after the user presses the power button 34, regardless of the degree to which the battery charge has been depleted.

In some embodiments, user control over additional functions and features of the vehicle charging cord 22 is enabled by further controls and menus. Additional controls and menus can be shown on the display 32 in either or both of the screens 40, 40A described above, or in any number of additional screens. By way of example only, the vehicle charging cord 22 of the embodiment illustrated in FIGS. 2, 5-11 and 15 has a third screen 40B shown in FIG. 11. This third screen 40B can be a utilities screen accessed by a user when the "UTILITIES" navigation button 80 is selected in a manner as described above. The third screen 40B also has navigation buttons 116, 118 that can be selected by a user to return to the first screen 40, whether by making one or more changes to operation of the vehicle charging cord 22 (by selecting the "GO" navigation button 116), or by making no changes to operation of the vehicle charging cord 22 (by selecting the "CANCEL" navigation button 118). In the illustrated embodiment, selection of either navigation button 116, 118 on the third screen 40B will return the user to the first screen 40.

With continued reference to FIG. 11, the third screen 40B can show any amount of the information shown on the first screen 40 described above, such as the vehicle charging cord status indicator 42, the communication status indicator 54, the power connection status indicator 56, and the clock 58. The third screen 40B can include a battery charge rate selector 120 enabling a user to change the amperage at which the vehicle charging cord 22 charges a battery 20 connected to the vehicle charging cord 22. This amperage can be changed and set by one or more amperage level buttons 122, such as by using the navigation buttons 36 to highlight one of the amperage level buttons 122 and by using the select button 38 to change the amperage of the vehicle charging cord 22 displayed on the third screen 40B. Any other manner of changing and selecting a charging amperage can be used as desired, including without limitation drop down or pull-up menus displaying various charging amperages that can be selected. Although not shown in FIG. 11, in other embodiments, a similar selector can be used to also or instead change the voltage at which the vehicle charging cord 22 charges a battery 20 connected to the vehicle charging cord 22.

Additional features that can be used in any of the vehicle charging cord embodiments described and/or illustrated herein relate to communication settings of the vehicle charging cord 22. For example, the third screen 40B of the vehicle charging cord 22 illustrated in FIGS. 2, 5-11 and 15 includes a selector 124 that can be selected by a user to enable and disable Bluetooth® wireless communication with another controller, such as the processor of a user's computer. In other embodiments, the same or different selector can be used to enable and disable other types of wireless and wired communication with another controller. The third screen 40B of the illustrated embodiment also has a selector 126 that can be selected by a user to enable and disable wireless and/or wired communication with a power utility 48.

In some embodiments, the controller 44 of the vehicle charging cord 22 can send a communication to the user in the event that one or more different events associated with a vehicle charging session occur. By way of example only, by using conventional power detection circuitry, the controller 44 can detect when a supply of power to the vehicle charging cord 22 has been interrupted, such as in a power failure in the electrical system of the user, at the power utility, or anywhere in between. Identifying and communicating this status to a user can be very important to the user, enabling the user to find another source of electrical power to charge the user's vehicle 18, or at least enabling the user to make appropriate plans based upon the existing level of charge in the vehicle battery 20. As another example, and by using conventional battery diagnostic circuitry, the controller 44 can detect when the battery 20 connected thereto is fully charged or has reached any other level of charge (e.g., a minimum battery charge level as described above). Still other events that can be detected and communicated to the user include a battery fault condition, a problem with the vehicle charging cord 22, and the like.

Upon detection of any of the events just described, the controller 44 of the vehicle charging cord 22 can send a communication to the user providing notice of the event. For example, the third screen 40B of the vehicle charging cord 22 shown in FIG. 11 includes a selector 128 that can be selected by a user to enable and disable the controller 44 automatically sending a communication indicating that power supply to the vehicle charging cord 22 has been interrupted. As another example, the third screen 40B of the vehicle charging cord 22 shown in FIG. 11 includes a selector 130 that can be selected by a user to enable and disable the controller 44 automatically sending a communication indicating that the battery 20 to which the vehicle charging cord 22 is connected is fully charged.

The controller 44 of the vehicle charging cord 22 can communicate any of the events described above in a number of different manners. For example, the vehicle charging cord 22 can have a speaker or other sound emitting device (not shown) coupled to the controller 44 and capable of emitting an auditory alarm when any of the above-described events have occurred. The audible alarm can be emitted once upon the occurrence of the event, or can be emitted upon the occurrence of the event and at periodic times (e.g., every 5 minutes, every hour, and the like) after the occurrence of the event. As another example, the controller 44 of the vehicle charging cord 22 can transmit a wired or wireless signal to the user's computer and/or to the power utility 48 (i.e., to the controller 50 of the power utility 48) in any of the manners of communication described above in connection with the controller 50. Such a signal can automatically trigger a visual or auditory alarm or other notice via the user's computer and/or the controller 50 of the power utility 48, such as by automatically generating a text message or e-mail from the controller 50 of the power utility 48 to a computer, phone, PDA, or other device of the user, by automatically generating a text message or e-mail from the user's computer to a phone, PDA, or other device of the user, by displaying an alert on the user's computer, and the like. Another mode of communication to the user include an automatically generated telephone call from the power utility 48 (triggered by and/or under control of the controller 50) or the user's computer to a phone of the user, followed by an automatically generated voice message communicating the event and played by phone to the user when the phone is answered. Still other modes of alerting the user to any of the events described above are possible, and fall within the spirit and scope of the present invention.

In the illustrated embodiment of FIGS. 2, 5-11 and 15, the controller 44 of the vehicle charging cord 22 responds to detection of power interruption or completion of battery charge by either causing an e-mail to be sent to the user and/or by generating an auditory alarm from the vehicle charging cord 22 based upon whether respective selectors 132, 134 for such modes of communication are selected on the third screen 40B illustrated in FIG. 11. In other embodiments, other modes of communication can be similarly enabled and disabled by selection of other selectors.

Figure 12:
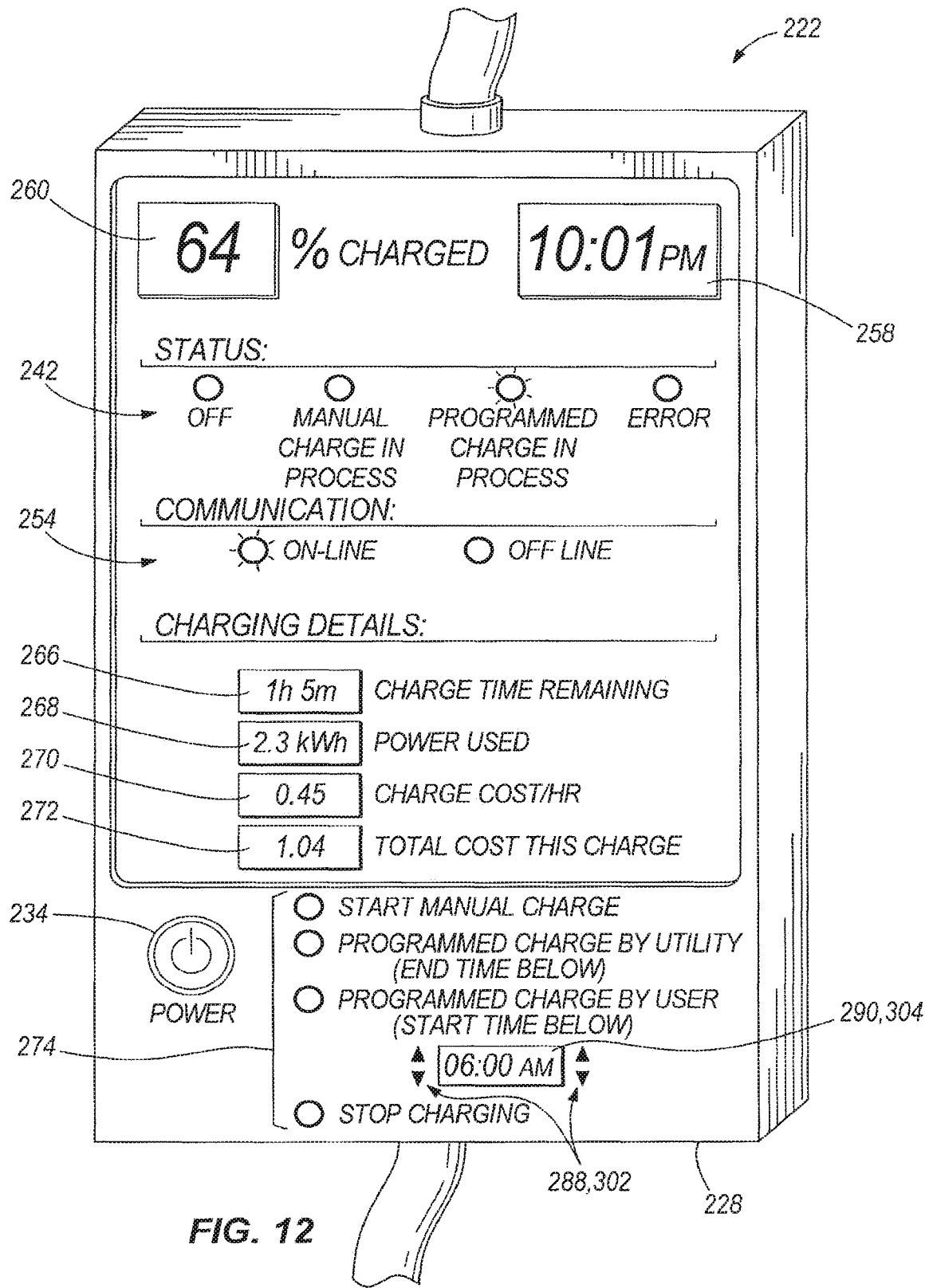
FIG. 12 is a perspective view of a portion of a vehicular charger according to another embodiment of the present invention.

FIG. 12 illustrates another embodiment of a vehicle charging cord according to the present invention. This embodiment employs much of the same structure and has many of the same properties as the embodiments of the vehicle charging cord described above in connection with FIGS. 2, 5-11 and 15. Accordingly, the following description focuses primarily upon the structure and features that are different the embodiments described above in connection with FIGS. 2, 5-11 and 15. Reference should be made to the description above in connection with FIGS. 2, 5-11 and 15 for additional information regarding the structure and features, and possible alternatives to the structure and features of the vehicle charging cord illustrated in FIG. 12 and described below. Structure and features of the embodiment shown in FIG. 12 that correspond to structure and features of the embodiment of FIGS. 2, 5-11 and 15 are designated hereinafter in the 200 and 300 series of reference numbers.

The embodiment of the vehicle charging cord 222 shown in FIG. 12 provides an example of how the various indicators, selectors, and user-manipulatable controls can take different forms and be located in different positions and arrangements on the housing 228, and how the vehicle charging cord 222 can have any sub-combination of the features and elements described above (e.g., any sub-combination of the various indicators, selectors, and user-manipulatable controls described above). The illustrated vehicular charging cord 222 does not have an LCD display as shown in the embodiment of FIGS. 2, 5-11 and 15, and instead has a number of LED displays and indicators. For example, the illustrated vehicular charging cord 222 utilizes an LED display for the battery charge level indicator 260, clock 258, charge time remaining indicator 266, power used indicator 268, charge cost per hour indicator 270, total cost indicator 272, and charge start time/charge completion time indicator 290, 304 (both of which are combined into a common indicator as shown). As another example, the illustrated vehicular charging cord 222 utilizes individual LED lights for the vehicle charging cord status indicator 242 and the communication status indicator 254. The use of LED displays and LED lights can reduce manufacturing costs of the vehicle charging cord 222, and in some embodiments can provide a design of the vehicle charging cord 222 less susceptible to damage compared to the use of LCD and other displays.

As described above in connection with the illustrated embodiment of FIGS. 2, 5-11 and 15, the battery charge level indicator 260 and clock 258 can display information in any form desired. For example, the battery charge level indicator 260 shown in FIG. 12 is a numerical percentage of full charge, but can take any of the other forms described above in connection with the battery charge level indicator 60 of the embodiment of FIGS. 2, 5-11 and 15.

In contrast to the selectors 74 on the first screen 40 in the embodiment of FIGS. 2, 5-11 and 15, the selectors 274 in the illustrated embodiment of FIG. 12 are individual buttons of any conventional type, including any of the button types described above in connection with the power, navigation, and select buttons 34, 36, 38 of the embodiment of FIGS. 2, 5-11 and 15. By pressing any of the four buttons 274, a user can start a manual charge, start a programmed charge of the type described above in connection with the charge start time 90 illustrated in FIG. 10 (i.e., start charging at a time entered by the user), start a programmed charge of the type described above in connection with the charge completion time 104 illustrated in FIG. 10 (i.e., start charging based upon power utility control and complete charging by a time entered by the user), and stop the vehicle charging cord 222 from charging a battery 20 connected thereto.

Also, in contrast to the time change buttons 88, 102 on the second screen 40A in the embodiment of FIGS. 2, 5-11 and 15, the time change buttons 288, 302 in the illustrated embodiment of FIG. 12 are mechanical buttons of any type, including any of the button types described above in connection with the power, navigation, and select buttons 34, 36, 38 of the embodiment of FIGS. 2, 5-11 and 15. By pressing on the buttons 288, 302 to the left of the charge start time/charge completion time indicator 290, 304, the hour of the time displayed by the charge start time/charge completion time indicator 290, 304 can be adjusted, whereas by pressing on the buttons 288, 302 to the right of the charge start time/charge completion time indicator 290, 304, the minutes of the time displayed by the charge start time/charge completion time indicator 290, 304 can be adjusted. In other embodiments, any other number, position, and type of time change buttons can be used to adjust the time on the charge start time/charge completion time indicator 290, 304. Following entry of a desired time, a user can press any of the first three selectors 274 (followed in some embodiments by pressing the power button 234) to begin a charging session.

Although LEDs are used in the illustrated embodiment of FIG. 12 for various indicators and selectors 258, 260, 242, 254, 266, 268, 270, 272, 290, 304, any other type of light-emitting device can instead be used as desired.

The various embodiments of the vehicle charging cords 22, 222 described above and illustrated in FIGS. 2, 5-12 and 15 can provide significant advantages relating to the portability of the vehicle charging cords 22, 222. By virtue of the fact that the opposite ends 24, 26 of the vehicle charging cords 22, 222 are releasably connected to an electrical system providing a source of electrical power and to the battery 20 of a vehicle, respectively, and by virtue of the fact that the other components of the vehicle charging cord cords 22, 222 are contained within a housing to define a single integral unit, the vehicle charging cords 22, 222 are portable, can be readily moved from vehicle to vehicle, can thereby be used to charge any number of different vehicles, and can be moved into and out of (and can be transported by) vehicles with ease. Also, portable charging cords 22, 222 of the type described above and illustrated in FIGS. 2, 5-12 and 15 can be purchased by a user and can be releasably connected to the battery 20 of a vehicle 18, thereby eliminating the need to service the vehicle 18 or to the electrical system at which the vehicle will be charged. This can be particularly useful in cases where the ability to charge the battery 20 of the vehicle 18 in different locations only having standard electrical outlets (and otherwise not being specially adapted to charge electric vehicles) is important or desirable.

In other embodiments, either end 24, 26 of the charging cord 22, 222 can be permanently secured to the electrical system of the house, building, or other facility and/or to the vehicle 18, 218, respectively. For example, one end 24 of the charging cord 22, 222 can be permanently secured to the electrical system of the house, building, or other facility (i.e., not intended or adapted for removal by a user, such as by being wired directly into a junction box or circuit breaker of the electrical system of the house, building, or other facility). In such cases, the charging cord 22, 222 can be wound upon and stored in a floor standing, wall-mounted, or ceiling-mounted reel (not shown), such as those disclosed in U.S. Pat. No. 6,439,360, the entire disclosure of which is incorporated herein by reference. The reel can be spring-loaded to enable the vehicle charging cord 22, 222 to be easily wound upon the reel for storage, or can be manually turned for this purpose. In such embodiments, the majority, all, or almost all of the length of the charging cord 22, 222 can be defined between the housing 28, 228 and the end 226 of the charging cord 22, 222 intended for connection to the electrical system of the facility. In this manner, the majority or almost all of the vehicle charging cord 22, 222 can be conveniently stored. Such vehicle charging cords provide a significant benefit to users desiring to charge two or more vehicles 18, 218 at the same facility using the same vehicle charging cord 22, 222, such as for charging one vehicle 18, 218 during the day and for charging another vehicle 18, 218 at night using the same vehicle charging cord 22, 222. The use of one vehicle charging cord 22, 222 for two or more vehicles 18, 218 can provide significant cost savings to the user(s) of the vehicles 18, 218.

As another example, one end 26 of the charging cord 22, 222 can be permanently secured to the vehicle 18, 218 (i.e., not intended or adapted for removal by a user, such as by being permanently connected to one or more wiring harnesses of the vehicle, or by being connected to an electrical junction box or fuse box of the vehicle 18, 218). In such cases, the charging cord 22, 222 can also be wound upon and stored on a reel (not shown) carried by the vehicle 18, 218, such as the reels disclosed in U.S. Pat. No. 6,439,360 and incorporated by reference above. The reel can be mounted directly to the frame of the vehicle 18, 218, an interior surface of a body part of the vehicle 18, 218, to a bracket or other fixture (e.g., radiator mounting bracket, alternator or battery mounting bracket, and the like) of the vehicle 18, 218, to the front or rear bumper of the vehicle 18, 218, or to any other location providing suitable strength to carry the reel and vehicle charging cord 18, 218. As described above, the reel can be spring-loaded to enable the vehicle charging cord 22, 222 to be easily wound upon the reel for storage on the vehicle, or can be manually turned for this purpose. In such embodiments, the majority, all, or almost all of the length of the charging cord 22, 222 can be defined between the housing 28, 228 and the end 224 of the charging cord 22, 222 intended for connection to the vehicle 18, 218. In this manner, the majority or almost all of the vehicle charging cord 22, 222 can be conveniently stored on the vehicle. The vehicle-mounted vehicle charging cord 22, 222 provides a significant benefit for users needing to charge their vehicle battery 20, 220 in multiple locations, as the vehicle charging cord 22, 222 is conveniently carried by the vehicle 18, 218 from destination to destination.

Although reel-based vehicle charging cords as just described are described in connection with vehicle charging cords 22, 222 not intended for release by a user from both the vehicle 18, 218 and the electrical system of the facility, it should be noted that the other portable vehicle charging cord embodiments described and/or illustrated herein (i.e., those intended for user release at both ends) can also include a spring-loaded or non-spring-loaded reel as just described. In this manner, such vehicle charging cords 22, 222 can be quickly and conveniently placed in a relatively portable and compact state.

Figures 13, 14:
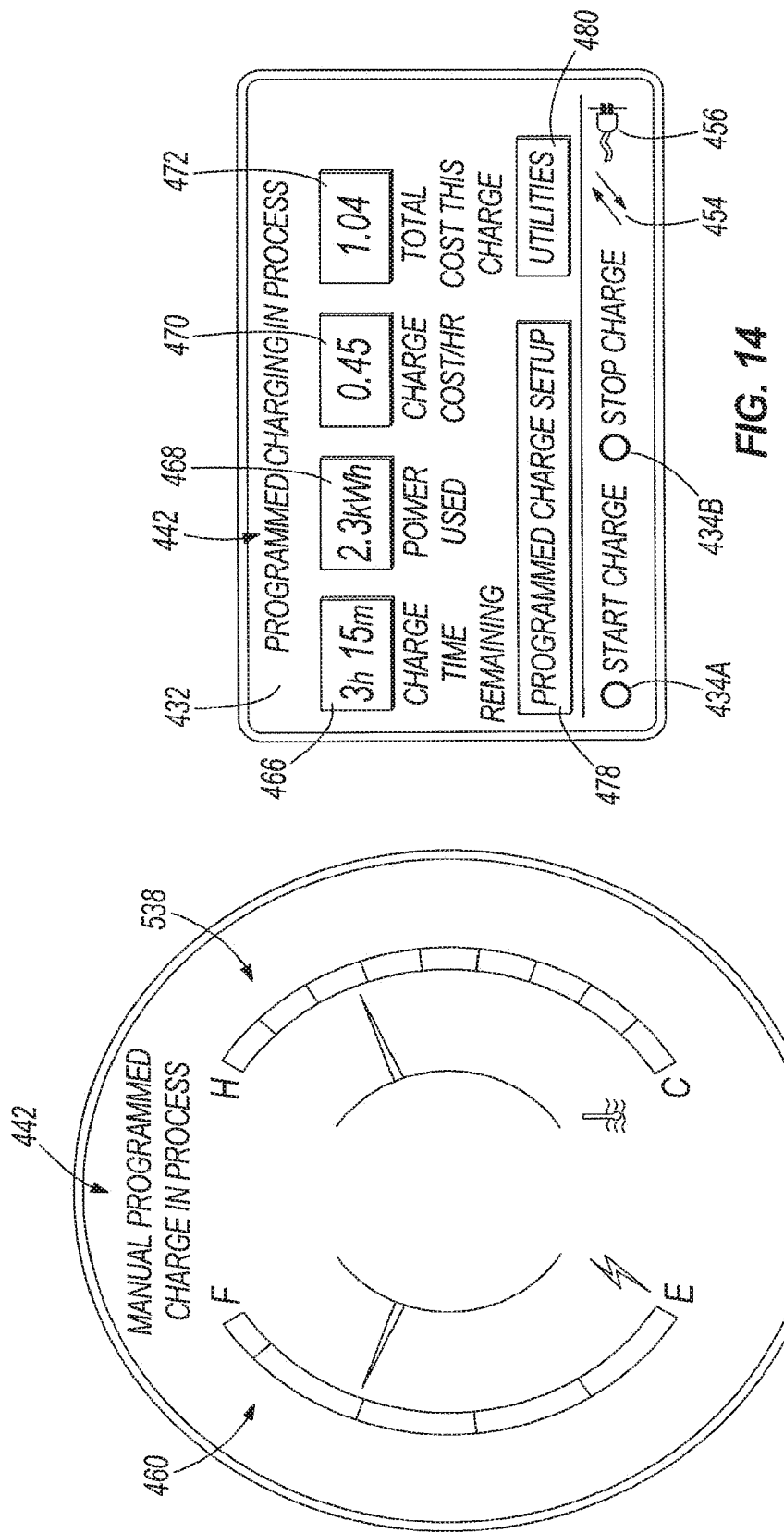
FIG. 13 illustrates a vehicle display according to an embodiment of the present invention.
FIG. 14 illustrates another vehicle display according to an embodiment of the present invention.
Figure 16:
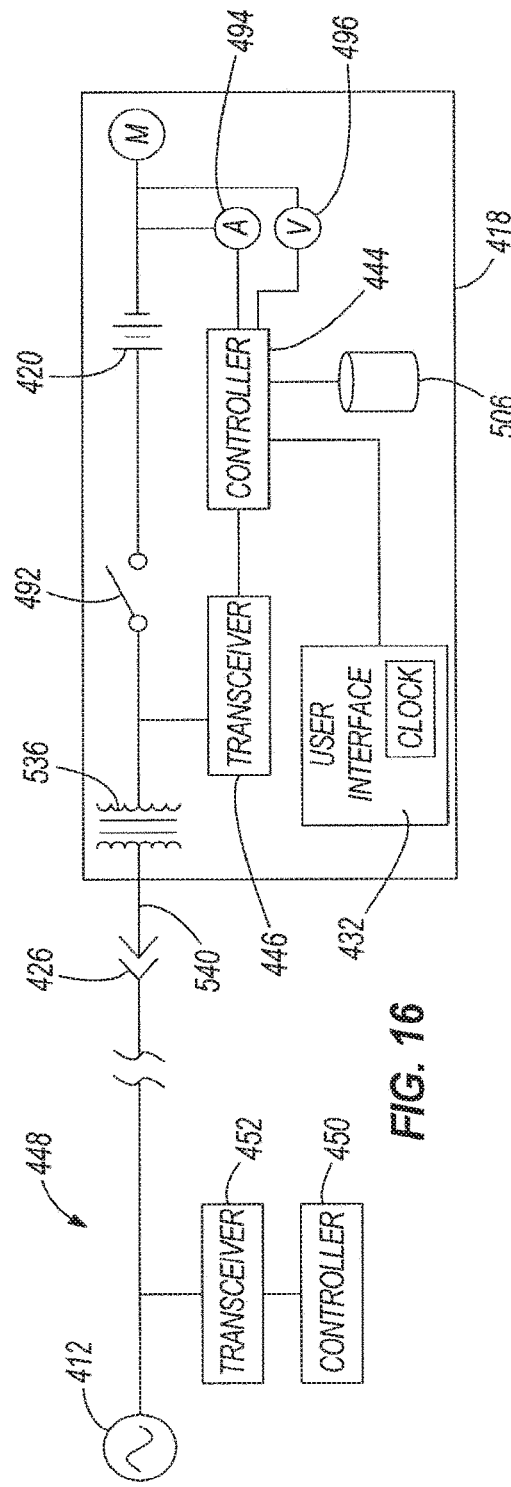
FIG. 16 is a schematic electrical diagram of a vehicular charging system according to another embodiment of the present invention.

FIGS. 13, 14, and 16 illustrate an embodiment of a vehicle charging system according to the present invention. This embodiment employs much of the same structure and has many of the same properties as the embodiments of the vehicle charging cord described above in connection with FIGS. 2, 5-12 and 15. Accordingly, the following description focuses primarily upon the structure and features that are different the embodiments described above in connection with FIGS. 2, 5-12 and 15. Reference should be made to the description above in connection with FIGS. 2, 5-12 and 15 for additional information regarding the structure and features, and possible alternatives to the structure and features of the vehicle charging system illustrated in FIGS. 13, 14, and 16 and described below. Structure and features of the embodiment shown in FIGS. 13, 14, and 16 that correspond to structure and features of the embodiment of FIGS. 2, 5-12 and 15 are designated hereinafter in the 400 and 500 series of reference numbers.

Despite the significant advantages provided by the portable vehicle charging cords 22, 222 described above in connection with FIGS. 2, 5-12 and 15, other significant advantages are realized by incorporating the elements and features of the vehicle charging cords 22, 222 into a vehicle 18. With reference to FIGS. 13, 14, and 16, the illustrated vehicle charging system uses much of the same elements and features described above in connection with the various embodiments of the vehicle charging cords 22, 222. In this regard, FIG. 13 illustrates a portion of the dashboard of a vehicle 18, and includes a battery charge level indicator 460 integrated into the same part of the vehicle dashboard as an oil temperature indicator 538. Also integrated into the same portion of the dashboard, by way of example only, is a vehicle charging status indicator 442. The vehicle charging status indicator 442 shown in FIG. 13 can be similar to the charge status display area 76 described above in connection with the vehicle charging cord 22 of FIGS. 2, 5-11 and 15. Accordingly, one or more lights can be used to illuminate the words "MANUAL CHARGING IN PROCESS" when the vehicle battery charging system is in a manual charging mode as described above, whereas one or more other lights can be used to illuminate the words "PROGRAMMED CHARGE IN PROCESS" when the vehicle battery charging system is in a programmed charging mode as also described above. Any other manner of displaying the vehicle charging status indicator 442 can be used as desired, including without limitation an LED or LCD display, one or more lamps adjacent printed graphics, and the like.

With continued reference to the illustrated embodiment of FIGS. 13, 14, and 16, the illustrated vehicle charging system can include a display 432 located in the console of the vehicle 18. As used herein, the term "console" refers to any portion of the interior of a vehicle (i.e., in the interior passenger cabin of the vehicle) having one or more manual or electronic controls for controlling operation of a vehicle 18 and/or one or more indicators showing the status of vehicle operation. For example, the console of a vehicle 18 can include a dashboard having a speedometer, odometer, RPM gauge, oil temperature gauge, and the like, a navigation screen with associated indicators and/or controls, HVAC indicators and controls, an entertainment center (e.g., radio, DVD or other video system, CD, MP3 or other audio system, and the like) with associated indicators and controls, environmental temperature indicators, travel direction indicators, and the like. The console can be located immediately in front of the driver, to either side of the driver, in central forward area of the vehicle cabin, in an area between the driver's seat and an adjacent passenger seat, in an interior location on the roof or otherwise at a higher elevation than a horizontal line of sight of the user, and the like. Also, the console of the vehicle can extend to and be positioned in any combination of these interior vehicle locations, such as a single console including the dashboard and central area between the driver and passenger seats.

In some embodiments, the selectors and indicators (including any displays) of the vehicle charging system are located in their own dedicated console, whereas in other embodiments, the console carrying such features also carries other vehicle indicators and controls. Also, the selectors and indicators (including any displays) of the vehicle charging system can be located in two or more consoles, if desired, such as one or more indicators located in the dashboard console of the vehicle 18 and the remainder located in another console located between the driver and passenger at the front of the passenger compartment. Any combination of selectors and indicators located in any combination of vehicle consoles is possible, and falls within the spirit and scope of the present invention.

The display 432 shown in FIG. 14 is a touch screen display 432, and includes many of the same indicators and selectors used in the vehicle charging cord embodiments described above in connection with FIGS. 2, 5-11 and 15. In particular, the display 432 includes a charge time remaining indicator 466, power used indicator 468, charge cost per hour indicator 470, and total cost indicator 472 like those of the vehicle charging cords 22, 222 described and illustrated above. Also, the illustrated display 432 includes another vehicle charging status indicator 442 that can be used in addition to or in place of that shown in FIG. 13, and a communication status indicator 454 and power connection status indicator 456 similar to those described above in connection with the illustrated embodiment of FIGS. 2, 5-11 and 15. Although a clock can also be included on the display 432, a clock is not included in the display 432 of FIG. 14 in lieu of another clock of the vehicle 18 located elsewhere on the dashboard or console of the vehicle 18. This other clock can be connected to the same controller 444 (see FIG. 16) as the rest of the vehicle charging system, thereby providing the controller 444 with the time of day information needed to begin programmed charging operations as described above.

The display 432 illustrated in FIG. 14 can display multiple screens 440 to be shown upon the display 432, thereby enabling a significantly greater amount of battery and battery charging information to be shown on the display, and/or enabling a greater degree of control over the vehicle charging system. Like the vehicle charging cords 22, 222 described above, navigation between screens 440 on the display 432 is enabled by navigation buttons on the screens. For example, the screen 440 shown in FIG. 14 includes two navigation buttons 478, 480 like those of the illustrated embodiment of FIGS. 2, 5-11 and 15 described above. By pressing one of the navigation buttons 478 (entitled "PROGRAMMED CHARGE SETUP"), the screen 440 is replaced by a charge programming screen (not shown) having any or all of the indicators and selectors 42, 54, 56, 58, 82, 84, 86, 88, 90, 100, 102, 104, 110, 112, and/or 114 described above in connection with the second screen 40A in FIG. 10. These indicators and selectors can have the same or any other arrangement upon the programming screen. By pressing the other navigation button 480 (entitled "UTILITIES"), the screen 440 is replaced by a utilities screen (also not shown) having any or all of the indicators and selectors 42, 54, 56, 58, 116, 118, 120, 122, 124, 126, 128, 130, 132, and/or 134 described above in connection with the third screen 40B in FIG. 11. These indicators and selectors can have the same or any other arrangement upon the utilities screen.

To begin or stop a manual or programmed charging session, the embodiment of the present invention illustrated in FIGS. 13, 14, and 16 can include a single power button that in some embodiments can change text to indicate whether a selection can be made by a user to start or stop a charging session (e.g., changing from "START CHARGE" to "STOP CHARGE" once a user selects "START CHARGE", or changing from "STOP CHARGE" to "START CHARGE" once the user selects "STOP CHARGE"). In other embodiments, such as that shown in FIGS. 13, 14, and 16, the screen 440 can include separate buttons 434A, 434B to start or stop a charging session, such as to start a manual charge if none of the selectors for a programmed charge have been selected on a programming screen, or to start a programmed charge of any type described herein.

Although the in-console display 432 illustrated in FIG. 14 is a touch screen display 432, the display 432 can be any other type of display, such as the other types of displays described and illustrated herein. For example, the touch screen display 432 can be replaced by a display such as that shown in FIGS. 5-11 or FIG. 12, in which cases the vehicle charging system can include navigation buttons (e.g., adjacent the display 432) enabling a user to navigate through a screen and to select any selectors upon the display 432. As another example, the touch screen display 432 can be replaced by any combination of buttons, switches, dials, or other user-manipulatable controls; LEDs and other lights; and displays (e.g., see FIG. 12).

A schematic diagram of the vehicle charging system in which an in-console display 432 is utilized and/or in which the in-console vehicle charging selectors and indicators are otherwise utilized is shown in FIG. 16. Like the embodiments of FIGS. 2, 5-12 and 15 described above, the system illustrated in FIG. 16 is releasably coupled to a source of power 412 operated and controlled by a power utility 448 having a transceiver 452 and controller 444 (e.g., a computer) that can communicate via a PLC system with the controller 444 of the vehicle charging system. In the illustrated embodiment of FIG. 16, however, the display 432 and other controls and indicators are located in one or more in-cabin consoles of the vehicle 418. Therefore, a power cord 540 having ends 424, 426 described above in connection with the embodiments of FIGS. 2, 5-12 and 15 (but without the housing and other components carried in or on the housing) can be used to releasably connect the battery 420 of the vehicle 418 with the electrical system of the facility used to charge the battery 420 as also described above. As with the earlier-described embodiments, the power cord 540 can be releasably coupled to the vehicle 418, and in other embodiments can instead be stored on-board the vehicle 418 when not in use (e.g., by a cord reel mounted on the vehicle as described above). Also as with the earlier-described embodiments, the power cord 540 can also or instead be releasably coupled to the electrical system of the house, office, or other facility to enable the power cord 540 to be more readily and easily moved within and removed from the facility, or can be permanently connected to the electrical system.

With continued reference to FIG. 16, the illustrated vehicle charging system also includes a transceiver 446 for communication between the controller 444 on board the vehicle 418 and the transceiver 452 and controller 440 of the power utility 448, a power transformer 536, an amp meter 494, a volt meter 496, a switch 492, and a memory 506 performing the same functions described above in conjunction with the embodiments of FIGS. 2, 5-12, and 15. It should be noted that the controller 444 of the vehicle charging system can be a dedicated controller (e.g., a processor or set of discrete logic elements) separate from the other controllers of the vehicle (e.g., those used to control vehicle startup, vehicle access and security, and engine operation, smart battery controllers, and the like), or can be the same as such other controller(s). Accordingly, the electronics of the vehicle charging system according to some embodiments of the present invention can be fully or partially integrated into one or more other controllers of the vehicle, or can be separate therefrom. In either case, the controller 444 can be located within a housing (not shown), and can be connected via suitable wiring harnesses or other wired or wireless electrical connections to an electrical connector on the vehicle (adapted for releasable mating connection to an external power cord as described above) or to a power cord carried by the vehicle as also described above. Similarly, the memory 506, transceiver 446, and clock can be dedicated solely for operation of the vehicle charging system as described in earlier embodiments, or can instead be shared by other systems of the vehicle 418.

The vehicle charging system shown in FIG. 16 can function in the same manners described above in connection with the embodiments of FIGS. 2, 5-12, and 15, it being understood that communications, power control, programming, and other features of the vehicle charging system are performed on-board the vehicle 418 rather than in a vehicle charging cord as shown in FIGS. 2, 5-12, and 15. Accordingly, power supply and communications in the embodiment of FIG. 16 can include power supply and communications over one or more suitable power cords, wiring harnesses, and the like of the vehicle performing the same functions (including PLC and power transmission functions) as the flexible power cords on both sides of the housings 28, 228 illustrated in FIGS. 2 and 5-12.

Figure 3:
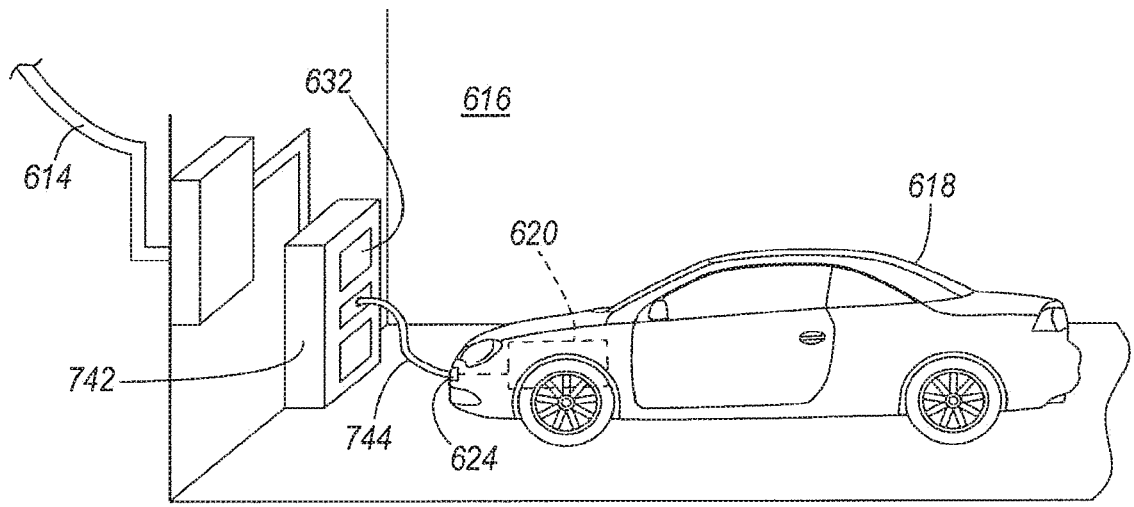
FIG. 3 illustrates a vehicular charging system according to another embodiment of the present invention.

FIG. 3 illustrates another embodiment of a vehicle charging system according to the present invention. This embodiment employs much of the same structure and has many of the same properties as the embodiments of the vehicle charging cord described above in connection with FIGS. 2, 5-12 and 15. Accordingly, the following description focuses primarily upon the structure and features that are different the embodiments described above in connection with FIGS. 2, 5-12 and 15. Reference should be made to the description above in connection with FIGS. 2, 5-12 and 15 for additional information regarding the structure and features, and possible alternatives to the structure and features of the vehicle charging system illustrated in FIG. 3 and described below. Structure and features of the embodiment shown in FIG. 3 that correspond to structure and features of the embodiment of FIGS. 2, 5-12 and 15 are designated hereinafter in the 600 and 700 series of reference numbers.

The vehicle charging system illustrated in FIG. 3 operates in substantially the same manner as that of FIGS. 2, 5-12 and 15. However, in the illustrated embodiment of FIG. 3, the vehicle charging system is embodied in a cabinet 742. The cabinet 742 performs functions similar to the housings 28, 228 described and illustrated herein, such as to house the controller, transformer, and other electronics of the vehicle charging system. In some embodiments, the cabinet 742 can be wall-mounted and/or floor-mounted (such as that shown in FIG. 3).

The cabinet 742 of the vehicle charging system can include a display 732 having any of the features and performing any of the functions described above in connection with the displays 32 of the embodiments shown in FIGS. 2, 5-11, 14, and 15. The display 732 can be a touch screen display or any other type of display as described herein, and can be accompanied by any number and type of user manipulatable controls as also described herein. Any combination of selectors and indicators (including displays) described and/or illustrated herein can be provided on the cabinet to perform the vehicle charging functions also described herein.

In some embodiments, the cabinet 742 is provided with a power cord 744 terminating in a plug 624 that can be releasably connected to a vehicle 618 (and to the battery 620 thereof). The plug 624 can take any of the forms described above in connection with the embodiments of FIGS. 2, 5-12, and 15. In some embodiments, the power cord 744 can be stored on a reel (not shown) in or adjacent the cabinet 742. The reel can take any of the forms described above in connection with other embodiments of the present invention. Although the cabinet 742 can provide a convenient location for storage of the power cord 744, the power cord 744 can instead be permanently or releasably coupled to the vehicle 618 for storage on the vehicle 618 when the power cord 744 is not in use. For example, the power cord 744 can be stored upon a reel of the vehicle 618 as described in greater detail above. In those embodiments in which the power cord 744 is intended to be stored and carried by the vehicle 618, the power cord 744 can have an opposite end terminating in a plug (such as any of the plugs described above in connection with plug 26 shown in FIG. 5). The cabinet 742 can be provided with any number of electrical connectors for releasable mating engagement with the plug (and for any number of other plugs on power cords 744 extending to other vehicles 618).

Figure 17:
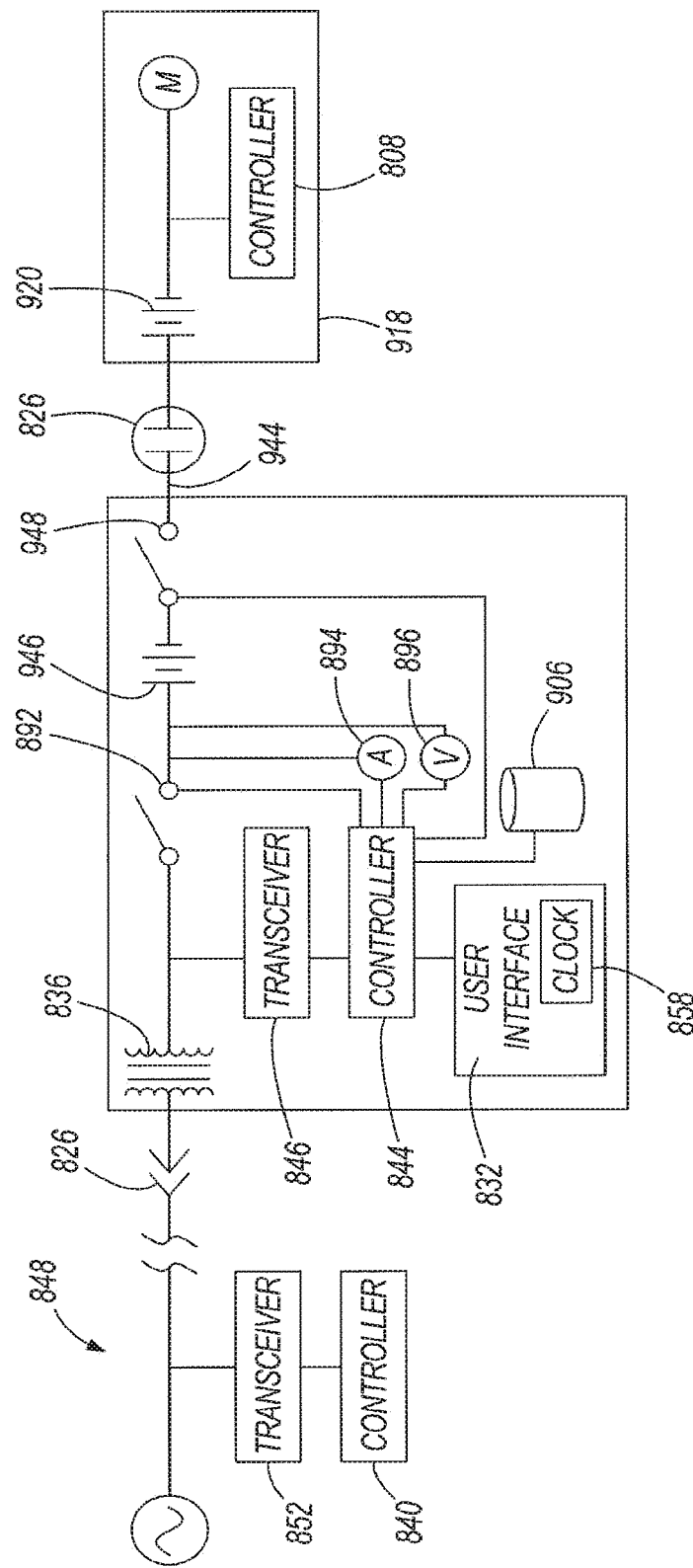
FIG. 17 is a schematic electrical diagram of a vehicular charging system according to another embodiment of the present invention.

FIG. 17 illustrates another embodiment of a vehicle charging system according to the present invention. This embodiment employs much of the same structure and has many of the same properties as the embodiments of the vehicle charging system described above in connection with FIGS. 2, 3, and 5-16. Accordingly, the following description focuses primarily upon the structure and features that are different the embodiments described above in connection with FIGS. 2, 3, and 5-16. Reference should be made to the description above in connection with FIGS. 2, 3, and 5-16 for additional information regarding the structure and features, and possible alternatives to the structure and features of the vehicle charging system illustrated in FIG. 17 and described below. Structure and features of the embodiment shown in FIG. 17 that correspond to structure and features of the embodiments of FIGS. 2, 3, and 5-16 are designated hereinafter in the 800 and 900 series of reference numbers.

Like the embodiment of FIGS. 2, 3, and 5-16, the vehicle charging system of FIG. 17 also includes a transceiver 846 for communication between a controller 844 and the transceiver 852 and controller 840 of the power utility 848, a power transformer 836, an amp meter 894, a volt meter 896, a switch 892, and a memory 906 performing the same functions described above in conjunction with the embodiments of FIGS. 2, 5-12, and 15. A clock 858, display 832, and associated user-manipulatable controls as described above (or other types and combinations of selectors and indicators, with or without displays) are also included for providing information to the user and for receiving instructions from the user in any of the manners also described above.

The vehicle charging system of FIG. 17 includes a battery 946 that can be charged in any of the same manual or programmed manners described above in connection with the embodiments of FIGS. 2, 3, and 5-16. The battery 946 is separate from the battery 920 of the vehicle 918, and can have any size sufficient for at least partially charging the battery 920 of the vehicle 918 when connected thereto. Rather than or in addition to charging a battery 920 of the vehicle 918 as described herein in connection with other embodiments of the present invention, the vehicle charging system of FIG. 17 operates to charge the battery 946 that remains at the house, building, or other facility at which vehicle charging takes place. The battery 946 therefore functions as a reservoir of power that can collect and store a charge for later transfer to batteries 946 of one or more vehicles 918. Accordingly, although the battery 946 can have any size suitable for charging a battery 920 of a vehicle 918, in some embodiments the battery 946 has a capacity capable of fully charging the battery 920 of at least one vehicle 918 when the battery 920 of the vehicle 918 has no charge or substantially no charge.

The battery 946 can be located anywhere in a house, building, or other facility where vehicle battery charging is desired, and in some embodiments is located an a garage in which the vehicle is stored. For example, the battery 946 can be stored in a cabinet also housing the rest of the vehicle charging system (e.g., in a lower portion of the cabinet 742 illustrated in FIG. 3). In some embodiments, the battery 946 can be sufficiently oversized (in voltage, current, or capacity) for completely charging a drained vehicle battery 920 connected thereto so that improved or optimized battery charging conditions can be achieved. The battery 946 can also be oversized to carry sufficient charge for charging two or more fully or substantially discharged vehicle batteries 920. Also, in some embodiments, the vehicle charging system can have one or more power converters (e.g., DC to DC converters) to increase the output voltage of the battery 946 sufficiently for charging the vehicle battery 920.

With continued reference to the illustrated embodiment of FIG. 17, the vehicle charging system can include an additional relay or other electrical switch 948 coupled to the controller 844. The switch 948 can enable a user to begin charging the battery 920 of a vehicle 918 connected to the vehicle charging system only when desired. Accordingly, the controller 844 can send a signal to close the switch 948 upon receiving a command from a user (e.g., via a user-manipulatable control having any of the forms described herein) to begin charging the battery 920 of a vehicle 918 connected thereto. Like the other embodiments described and illustrated herein, the switch 948 can be controlled by a user and/or can be controlled by a power utility 948 via the transceivers 846, 852 and controllers 840, 844.

By virtue of the battery 946 in the embodiment of FIG. 17, control over a community's power draw needed for charging vehicles 918 is greatly increased. Rather than wait until a vehicle 918 is connected to the electrical system of a house, building, or other facility in order to supply power to charge the battery 920 of the vehicle 918, the user or power utility 848 can be free to supply vehicle battery charging power at any convenient time. For example, if the power utility 848 has a period of relatively low daytime demand that is unexpected (such as a drop in power draw during an otherwise peak or high demand time), the power utility 848 can begin charging the battery 946 regardless of whether the vehicle 918 is in another location. This flexibility can enable the power utility 848 to independently send relatively low-cost battery charging power—and/or for the user to independently draw relatively low-cost battery charging power—at times of power surplus regardless of the location of the vehicle 918 to be charged.

In some embodiments, the vehicle charging system of FIG. 17 can also operate in a manner similar to the embodiments of FIGS. 2, 3, and 5-16, whereby a user can connect the battery 920 of the vehicle 918 for charging, and the battery 920 can be charged in any manual or programmed mode by closure of the switches 892, 948 under control of the controller 844. Such charging can take place without draining the battery 946 described above (such as by a suitable electrical bypass around the battery 946), or can be supplemented by any amount of charge existing in the battery 946. In this regard, if the cost for charging or partially charging the battery 946 of the vehicle charging system is higher than the calculated cost of charging the battery 920 of the vehicle 918 at the desired charging start time (both figures being available to the controller 844 as described above, and being storable in and retrievable from the memory 906 as desired), the controller 844 can control the switches 892, 948 to charge the vehicle battery 920 using the charge from the system battery 946 first. If the opposite is true, the controller 844 can control the switches 892, 948 to charge the vehicle battery 920 using power directly from the power utility 848 without draining the system battery 946. These operating conditions can be continually monitored by the controller 844, which in some embodiments can automatically react to changing power supply costs while charging is in process by changing the source of charging current (i.e., system battery 946 or power utility 848).

The vehicle charging system of FIG. 17 is illustrated in the form of a portable vehicle charging cord, such as the embodiments of FIGS. 2, 5-12, and 15. However, the features of the vehicle charging system of FIG. 17 can be incorporated into any of the vehicle charging system embodiments described and/or illustrated herein, including those illustrated in FIGS. 3, 13, 14, 16, and FIGS. 4, 18, and 19 (described below).

Figure 4:
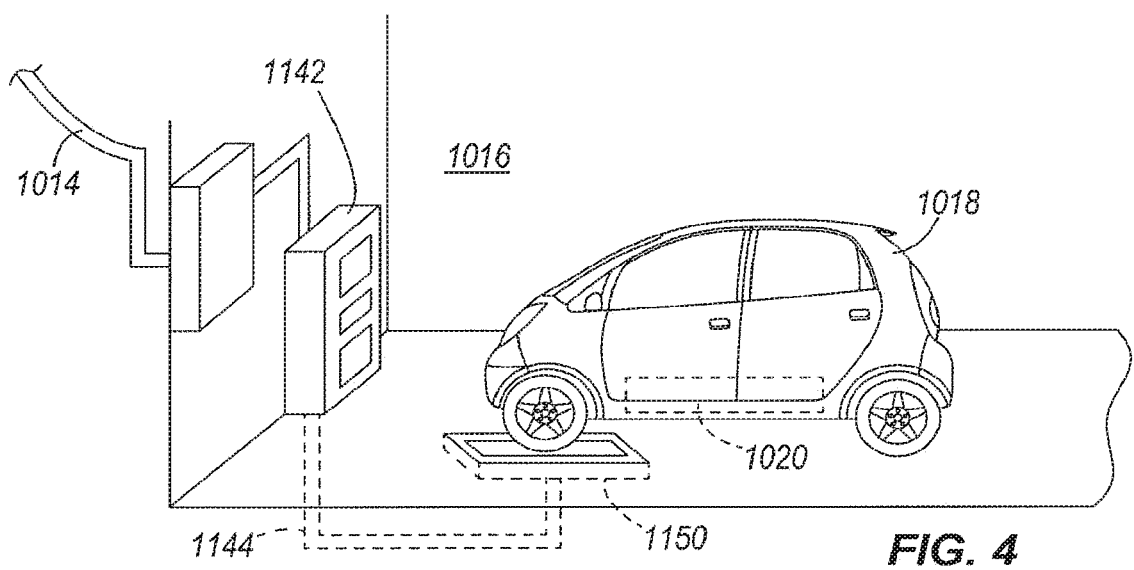
FIG. 4 illustrates a vehicular charging system according to another embodiment of the present invention.
Figure 18:
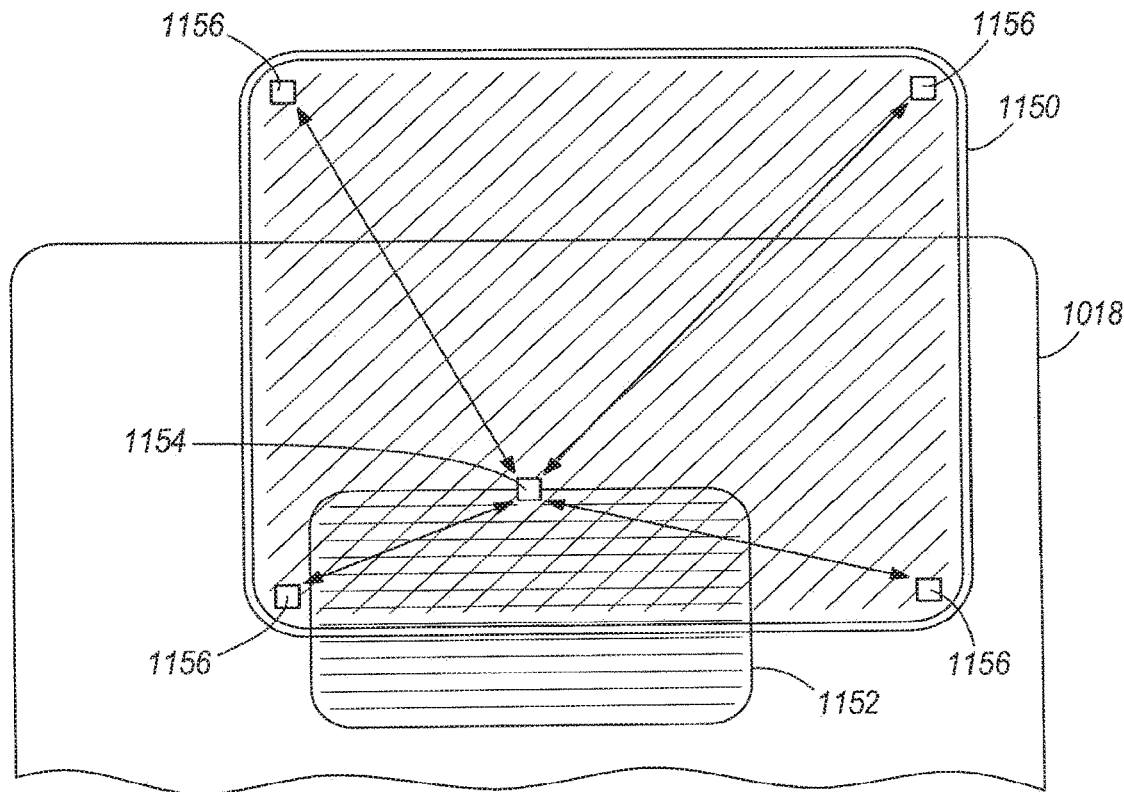
FIG. 18 a schematic diagram of a portion of a inductive vehicular charging system according to an embodiment of the present invention.
Figure 19:
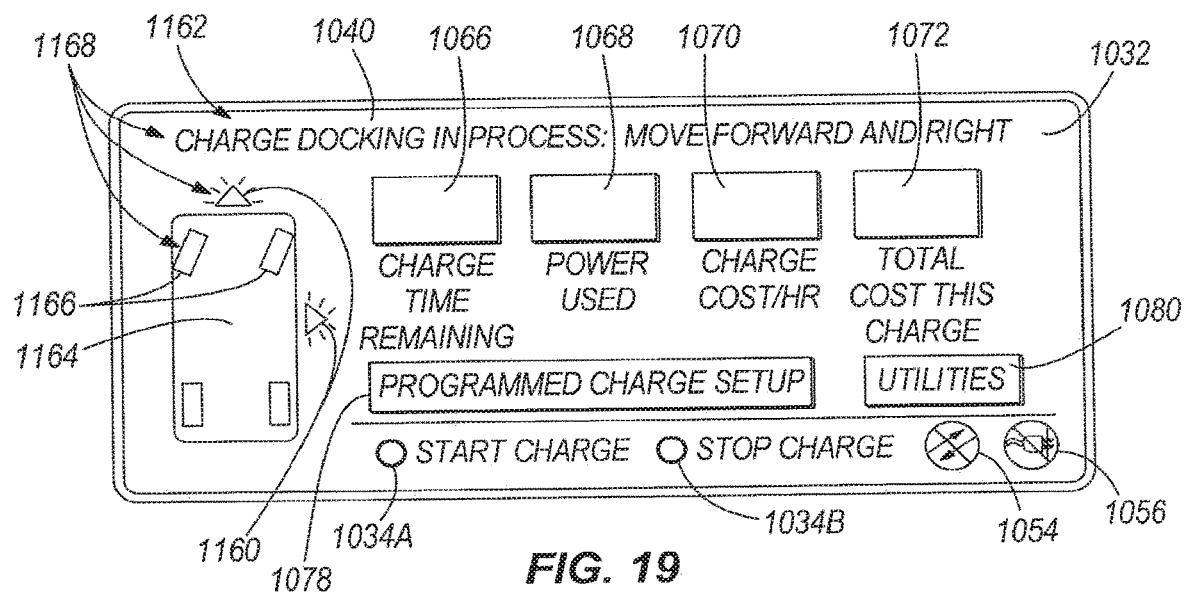
FIG. 19 illustrates a vehicular display for the inductive vehicular charging system illustrated in FIG. 18.

FIGS. 4, 18, and 19 illustrate another embodiment of a vehicle charging system according to the present invention. This embodiment employs much of the same structure and has many of the same properties as the embodiments of the vehicle charging systems described above in connection with FIGS. 2, 3, and 5-17. Accordingly, the following description focuses primarily upon the structure and features that are different the embodiments described above in connection with FIGS. 2, 3, and 5-17. Reference should be made to the description above in connection with FIGS. 2, 3, and 5-17 for additional information regarding the structure and features, and possible alternatives to the structure and features of the vehicle charging system illustrated in FIGS. 4, 18, and 19 and described below. Structure and features of the embodiment shown in FIGS. 4, 18, and 19 that correspond to structure and features of the embodiments of FIGS. 2, 3, and 5-17 are designated hereinafter in the 1000 and 1100 series of reference numbers.

The vehicle charging system illustrated in FIGS. 4, 18, and 19 has the same components and features as described above in connection with the on-board vehicle charging system of FIGS. 13, 14, and 16, but is further adapted for charging the battery 1020 of the vehicle 1018 by induction charging. Accordingly, the vehicle charging system illustrated in FIGS. 4, 18, and 19 has a touch screen display 1032 having a charge time remaining indicator 1066, power used indicator 1068, charge cost per hour indicator 1070, and total cost indicator 1072 as described in greater detail in the embodiments above. Also, the illustrated display 1032 includes a vehicle charging status indicator 1042 (not shown in FIG. 19, but in the text banner at the top of the illustrated display 1032 in FIG. 19 when docking is not in process), a communication status indicator 1054, and a power connection status indicator 1056 as described in greater detail in the embodiments above.

The display 1032 illustrated in FIG. 19 can display multiple screens 1040 to be shown upon the display 1032, thereby enabling a significantly greater amount of battery and battery charging information to be shown on the display, and/or enabling a greater degree of control over the vehicle charging system. Navigation between screens 1040 on the display 1032 is enabled by navigation buttons on the screens 1040. For example, the screen 1040 shown in FIG. 19 includes two navigation buttons 1078, 1080 for navigation to programming and utility screens as described in greater detail in the embodiments above. Also, the screen 1040 has separate buttons 1034A, 1034B to start or stop a charging session.

Although the in-console display 1032 illustrated in FIG. 19 is a touch screen display 1032, the display 1032 can be any other type of display, such as the other types of displays described and illustrated herein. For example, the touch screen display 1032 can be replaced by a display such as that shown in FIGS. 5-11 or FIG. 12, in which cases the vehicle charging system can include navigation buttons (e.g., adjacent the display 1032) enabling a user to navigate through a screen and to select any selectors upon the display 1032. As another example, the touch screen display 1032 can be replaced by any combination of buttons, switches, dials, or other user-manipulatable controls; LEDs and other lights; and displays (e.g., see FIG. 12).

With reference now to FIG. 4, the vehicle charging system of FIGS. 4, 18, and 19 utilizes a conventional battery induction charging system in order to charge the battery 1020 of the vehicle 1018, and includes a charging pad 1150 having a power supply core (not shown) energized to supply power via induction to a power receiving core of the vehicle (shown schematically at 1152 in FIG. 18). By way of example only, an inductive vehicular battery charger system that can be used is disclosed in U.S. Pat. No. 6,525,510, the entire contents of which are incorporated herein by reference. The power supply core of the charging pad 1150 is electrically connected to and receives power from a vehicular charger that is the same as that described above in connection with the embodiment of FIG. 3. In particular, the core of the charging pad 1150 is electrically connected to the electrical system of the house, building, or other facility at which charging is to take place via a below-ground or above-ground power line 1144 extending to a cabinet 1142 having any of the selectors and indicators (including display(s)) described above in connection with FIG. 3. In this regard, any of the alternative vehicle charger features and structures also described above in connection with the embodiment of FIG. 3 can also be applied in the inductive vehicular charging system of FIGS. 4, 18, and 19.

As is well known to those in the art of inductive battery charging, proper alignment between the power supply core and the power receiving core of the battery charger is important for efficient battery charging. In the illustrated embodiment of FIGS. 4, 18, and 19, this alignment can be achieved by user operation of the vehicle 1018. In particular, one or more sensors 1154 can be provided on the vehicle 1018 and can be positioned to detect the presence and proximity of the vehicle charging pad 1150 and core thereof. The sensors 1154 can be inductive sensors adapted to detect the presence of metallic elements 1156 in the vehicle charging pad 1150 or having known positions with respect to the vehicle charging pad 1150 and core. Alternatively, the sensors 1154 can be Hall Effect sensors adapted to detect the magnetic field of magnets or electromagnets having known positions on or with respect to the vehicle charging pad 1150 and core. In other embodiments, the sensors 1154 can be RFID sensors adapted to detect the position of one or more RFID transmitters having known positions on or with respect to the vehicle charging pad 1150 and core. Still other types of sensors 1154 can instead be used, including without limitation optical sensors, eddy current sensors, and ultrasonic sensors for use in conjunction with optical, eddy current, and ultrasonic sensing and position systems, all of which operate on principles well-known to those skilled in the art. By detecting the distance between the sensor(s) 1154 on the vehicle 1018 and one or more reference points on the charging pad 1150 (or having known positions with respect to the charging pad 1150), the position of the sensor(s) 1154 with respect to the charging pad 1150 can be identified via triangulation. Triangulation systems operating to detect the relative position of objects based upon any of these technologies are well-known to those skilled in the art, and are not therefore described further herein.

In other embodiments, the locations of the sensors 1154 and the elements 1156 (e.g., metallic elements 1156, magnets or electromagnets, RFID transmitters, and the like, as described above) detected by the sensors 1154 can be reversed, whereby one or more of the sensors 1154 can be located on the charging pad 1150 or located at known positions with respect to the charging pad 1150 for detecting one or more elements 1156 (e.g., metallic elements 1156, magnets or electromagnets, RFID transmitters, and the like, as described above) of the vehicle 1018.

The controller (not shown) of the inductive vehicle charging system illustrated in FIGS. 4, 18, and 19 receives signals from the sensor(s) 1154 described above, and based upon a conventional triangulation algorithm as described above, determines the direction in which the vehicle 1018 must move for desired alignment of the vehicle 1018 (and power receiving core connected to the battery 1020 of the vehicle 1018) with respect to the charging pad 1150 and core thereof. Upon making this determination, the controller can display directional instructions to the user. In the illustrated embodiment of FIGS. 4, 18, and 19, directional indicators 1160 are displayed on the same touch screen display 1032 described above, along with a text line 1162 noting the direction the vehicle 1018 should move for proper charging alignment. In other embodiments, this information can be provided on another display (e.g., on a display located in a console of the vehicle 1018), or can be located on another type of display (not necessarily a touch screen). Also, in some embodiments, this information can be presented without a display 1032, such as by illumination of one or more LEDs or other lights to illuminate an arrow or other symbol, text, or any combination of symbols and text providing directional instructions to the user.

By way of example only, the touch screen display 1032 illustrated in FIG. 19 presents text 1162 indicating the direction in which the user should move the vehicle 1018 for proper charging alignment, presents arrow symbols 1160 in any combination (e.g., forward, rearward, left, right) around a graphical depiction of the vehicle 1164, and also displays a graphical depiction of the front wheels 1166 turned in the direction needed for proper charging alignment. Any combination of these and other alignment symbols and text instructions 1168 can be displayed to the user to indicate how the vehicle 1018 should be moved for proper charging alignment. Such symbols and/or text 1168 can be updated continuously or periodically as the position of the sensors 1154 and vehicle 1018 change with respect to the charging pad 1150 and core thereof, until alignment within a predetermined acceptable error calculated by the controller is achieved. In some embodiments, the control(s) selected to begin a charging session (e.g., the "START CHARGE" selector 1034A on the touch screen display 1032 of the illustrated embodiment) are disabled until such alignment is achieved.

By utilizing the sensors 1154, sensed elements 1156, and alignment indicators 1168 as just described, proper alignment of the vehicle 1018 with respect to the charging pad 1150 can be conveniently and quickly achieved without requiring the user to leave the vehicle 1018. Also, a charging session can be started without the need to plug in the vehicle 1018.

Although the induction-based vehicle charging system described above in connection with FIGS. 4, 18, and 19 is presented in the context of an on-board vehicle charging system (i.e., where the display 1032, and other indicators and selectors are located in one or more consoles of the vehicle 1032, it should be noted that the vehicle alignment features described above can be used in connection with any of the other vehicle charging systems herein.

Another feature of the present invention regards the location at which a cord-based vehicle charging system is attached to the vehicle. As described above, some vehicle charging systems according to the present invention utilize a cord 22, 222, 540, 744, 944 that is releasably or permanently attached to the vehicle 18, 218, 418, 618, 818. It will be appreciated that such a tethered connection can present the danger of a user accidentally moving the vehicle 18, 218, 418, 618, 818 before disconnecting the cord 22, 222, 540, 744, 944 from the vehicle 18, 218, 418, 618, 818. Depending upon the position and orientation of the electrical connector of the vehicle 18, 218, 418, 618, 818 to which the cord 22, 222, 540, 744, 944 is connected, and the manner in which the opposite end of the cord 22, 222, 540, 744, 944 is attached to the electrical system of the house, building, or other facility, such movement can create significant damage to the vehicle 18, 218, 418, 618, 818, cord 22, 222, 540, 744, 944, and/or the electrical system of the house, building, or other facility. In some embodiments of the present invention, this damage can be mitigated or avoided by virtue of the position of the electrical connector of the vehicle 18, 218, 418, 618, 818.

With reference now to FIGS. 20-23, another embodiment of the present invention is illustrated, and is presented in the context of the vehicle charging cords 22, 122 in the embodiments of FIGS. 2, 5-12, and 15 by way of example only. In this regard, the features described below in connection with FIGS. 20-23 can be utilized in conjunction with any of the vehicle charging systems disclosed herein in which a power cord 22, 222, 540, 744, 944 is attached to a vehicle 18, 218, 418, 618, 818 for purposes of charging the battery 20, 222, 422, 622, 822 of the vehicle 18, 218, 418, 618, 818.

Figure 20:
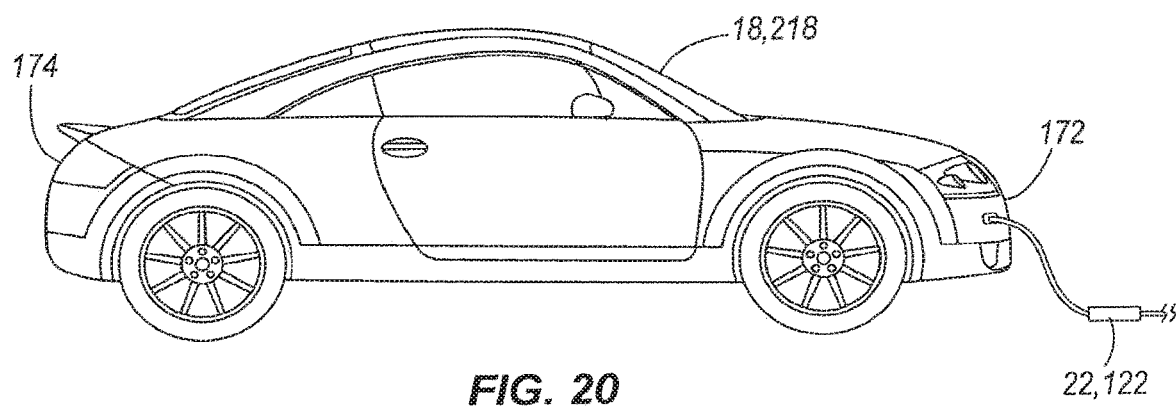
FIG. 20 is a side view of a vehicle and vehicular charger according to an embodiment of the present invention.
Figure 21:
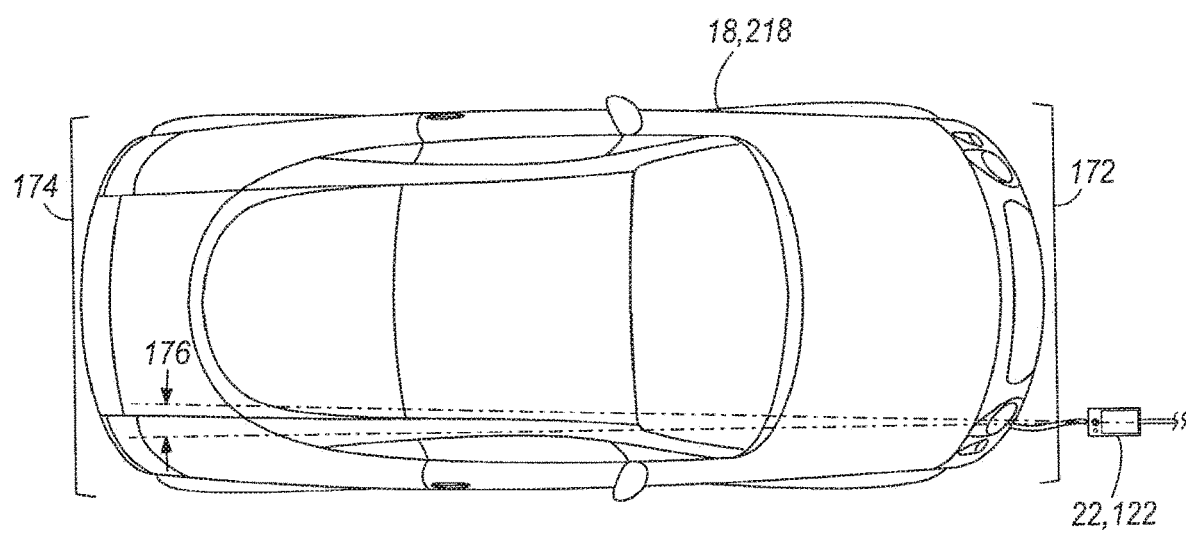
FIG. 21 is a top view of the vehicle and vehicular charger shown in FIG. 19.
Figure 22:
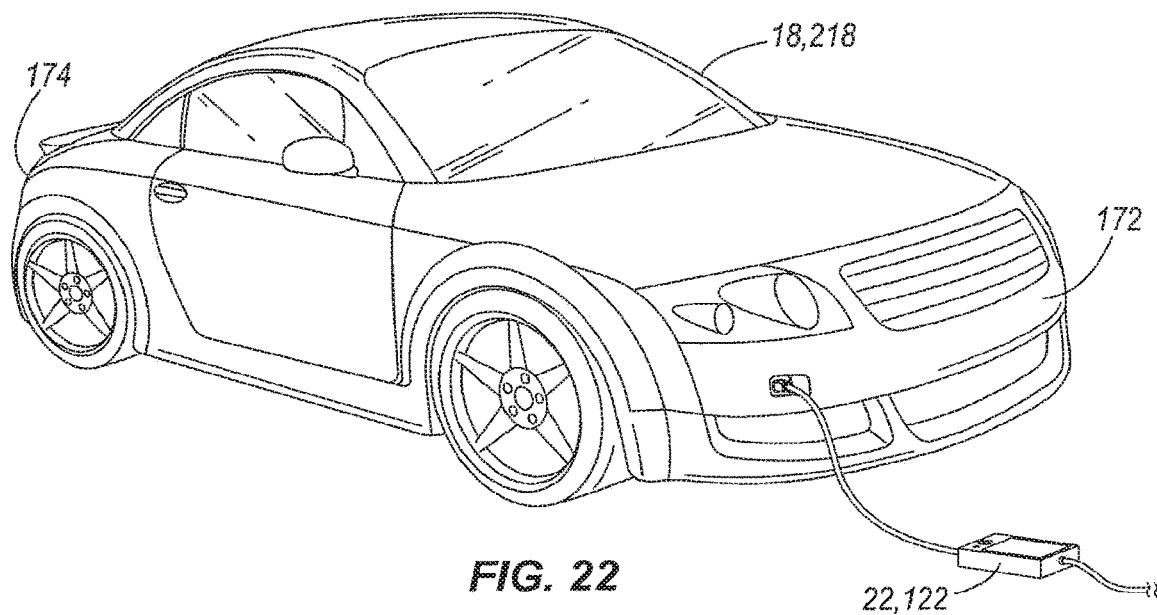
FIG. 22 is a perspective view of the vehicle and vehicular charger shown in FIGS. 19 and 20.
Figure 23:
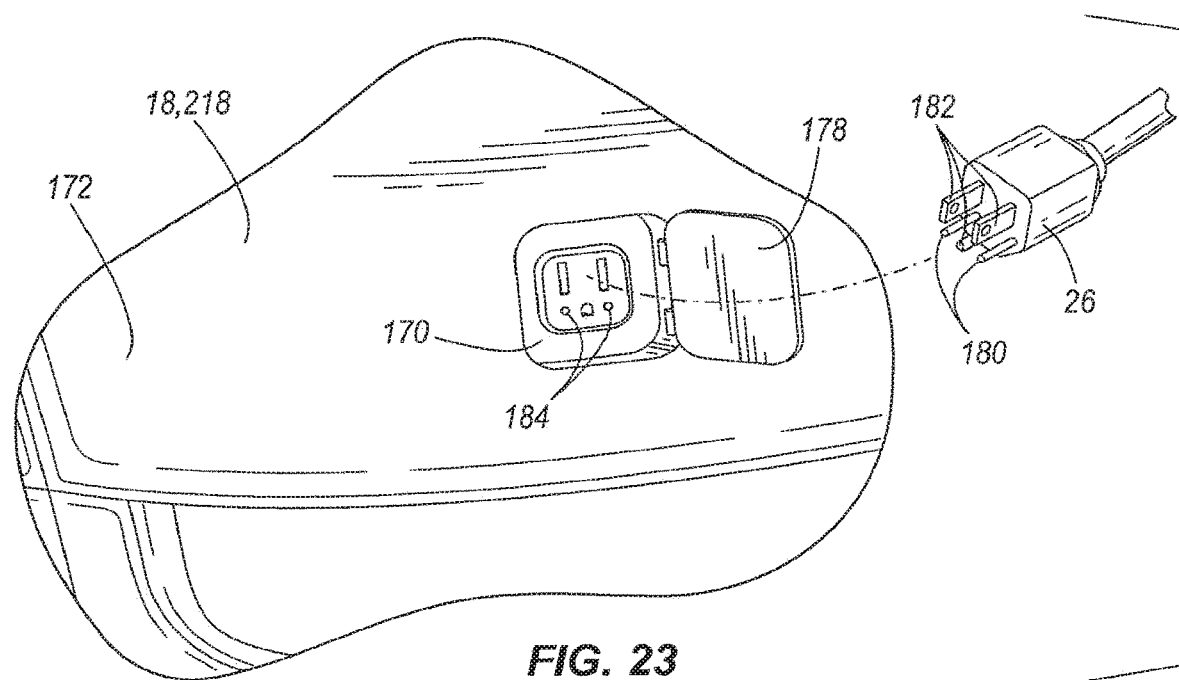
FIG. 23 is a perspective detail view of the vehicle and vehicular charger shown in FIGS. 19-21.

As shown in FIGS. 20-22, the plug 26 of the vehicle charging cord 22, 222 releasably connects to the electrical connector 170 of the vehicle 18, 218. In the illustrated embodiment of FIGS. 20-22, the electrical connector 170 of the vehicle is located in a front surface 172 of the vehicle 18, 218. Accordingly, in the event a user moves the vehicle 18, 218 in a rearward direction without disconnecting the vehicle charging cord 22, 222, the opportunity for the plug 26 of the vehicle charging cord 22, 222 to automatically disconnect by virtue of rearward movement of the vehicle 18, 218 is significantly increased. Of course, a significant factor in the amount of shear and tension force exerted upon the plug 26, vehicle charging cord 22, 222, and electrical connector 170 prior to this disconnection is the location of the other end of the vehicle charging cord 22, 222. In those embodiments where the other end (e.g., plug 24) of the vehicle charging cord 22, 222 is connected to the electrical system of a house, building, or other facility substantially in front of the vehicle 18, 218, this force can be significantly less than the disconnection force needed in those embodiments in which the other end of the vehicle charging cord 22 is connected at a location laterally disposed from the vehicle 18, 218. However, for those applications in which the vehicle 18, 218 must be backed up to exit the vehicle charging area, this location of the electrical connector 170 can significantly reduce the amount of disconnection force compared to locations of the electrical connector 170 located on a side or rear of the vehicle 18, 210.

Although not illustrated, in some embodiments, the electrical connector 170 of the vehicle 18, 218 is located in a rear surface 174 of the vehicle 18, 218. Accordingly, in the event a user moves the vehicle 18, 218 in a forward direction without disconnecting the vehicle charging cord 22, 222, the opportunity for the plug 26 of the vehicle charging cord 22, 222 to automatically disconnect by virtue of forward movement of the vehicle 18, 218 is significantly increased. As described above, a significant factor in the amount of shear and tension force exerted upon the plug 26, vehicle charging cord 22, 222, and electrical connector 170 prior to this disconnection is the location of the other end of the vehicle charging cord 22, 222. In those embodiments where the other end (e.g., plug 24) of the vehicle charging cord 22, 222 is connected to the electrical system of a house, building, or other facility substantially behind the vehicle 18, 218, this force can be significantly less than the disconnection force needed in those embodiments in which the other end of the vehicle charging cord 22 is connected at a location laterally disposed from the vehicle 18, 218. However, for those applications in which the vehicle 18, 218 must be moved forward to exit the vehicle charging area, this location of the electrical connector 170 can significantly reduce the amount of disconnection force compared to locations of the electrical connector 170 located on a side or front of the vehicle 18, 218.

In some embodiments, a clearance or light interference fit is provided between the plug 24 of the vehicle charging cord 22, 222 and the electrical connector 170 (located in a front or rear surface 172, 174 of the vehicle 18, 218 as described above), thereby providing a reduced amount of force needed to disconnect the plug 24 from the electrical connector 170. In some embodiments, a force needed for disconnection of the plug 24 from the electrical connector 170 is no greater than about 20 pounds (measured in a direction parallel to motion of the plug 24 with respect to the electrical connector 170 during connection) to avoid or reduce damage to the vehicle charging cord 22, 222, electrical connector 170, and vehicle 18, 218. In other embodiments, this force is no greater than about 10 pounds to avoid or reduce damage to the vehicle charging cord 22, 222, electrical connector 170, and vehicle 18, 218. In still other embodiments, this force is no greater than about 5 pounds to avoid or reduce damage to the vehicle charging cord 22, 222, electrical connector 170, and vehicle 18, 218.

As indicated above, the angle at which the force of disconnection is applied upon the electrical connector 170 and plug 24 can have a significant impact upon the shear and tension forces experienced by the electrical connector 170 and plug 24 when the vehicle 18, 218 is moved without unplugging the vehicle charging cord 22, 222. To reduce or mitigate these forces, the orientation of the electrical connector 170 with respect to the vehicle 18, 218 is selected to fall within a range of angles measured from a forward direction of the vehicle 18, 218. In particular, in some embodiments, the electrical connector 170 is oriented so that an angle 176 (see FIG. 21) between the forward direction of the vehicle 18, 218 (defined by proper alignment of the vehicle under normal operating conditions) and the direction of motion of the plug 24 with respect to the electrical connector 170 during connection is no greater than about 50 degrees. In other embodiments, this angle 176 is no greater than about 40 degrees to reduce or mitigate the disconnection force. In still other embodiments, this angle 176 is no greater than about 30 degrees to reduce or mitigate the disconnection force. In combination with the maximum disconnection forces according to some embodiments as described above, these orientation angles 176 of the electrical connector 170 can help to ensure damage-free disconnection of the vehicle charging cord 22, 222 from the electrical connector 170 of the vehicle 18, 218 regardless of whether the electrical connector 170 is located in the front or rear surface 172, 174 of the vehicle 18, 218 as described above.

In some embodiments, the vehicle 18, 218 is provided with two or more electrical connectors 170 in different locations (e.g., different sides) on the exterior of the vehicle 18, 218, any of which can be connected to a vehicle charging cord 22, 222 to charge the battery 20, 220 of the vehicle 18, 218. For example, one electrical connector 170 can be located in a front surface 172 of the vehicle 18, 218, and another electrical connector 170 can be located in a rear surface 172 of the vehicle 18, 218. Both such electrical connectors 170 can be connected to the battery 20, 220 and controller 44, 244 of the vehicle 18, 218 by suitable power wiring (e.g., wiring harnesses) extending along the vehicle 18, 218. In such embodiments, a user can choose to connect the vehicle charging cord 22, 222 to the electrical connector 170 closest to the location at which the vehicle charging cord 22, 222 is connected to the electrical system of the house, building, or other charging facility, or can connect the vehicle charging cord 22, 222 to the electrical connector 170 oriented at the smallest angle with respect to such a location upon accidental movement of the vehicle 18, 218. This ability to choose between two or more electrical charging connectors 170 can present significant convenience to the user while helping to prevent damage to the vehicle charging cord 22, 222 and vehicle 18, 118 upon accidental movement of the vehicle 18, 118 while still plugged in.

The illustrated embodiment of FIGS. 20-23 is presented with reference to a vehicle charging cord 22, 222 intended for releasable connection at an electrical connector 170 of the vehicle 18, 218. However, it should be noted that the same principles of disconnect force, disconnect angle, and cord-to-vehicle interface location apply regardless of whether the vehicle charging cord 22, 222 is intended to be disconnected at the vehicle 18, 218. In this regard, some embodiments of the present invention provide a vehicle charging cord 22, 222 that is not intended for disconnection from the vehicle 18, 218 (as presented above in connection with earlier-described embodiments). However, in such embodiments, the vehicle charging cord 22, 222 and/or the electrical wiring of the vehicle 18, 218 can be provided with an electrical connector that can automatically disconnect upon experiencing a threshold force. Any electrical connector located in the wiring of the vehicle 18, 218 or in the cord extending therefrom to a source of electrical power can be used. For example, in embodiments in which a power cord extending from the vehicle 18, 218 can be retracted onto a reel located on the vehicle 18, 218 as described above, the power cord can have a releasable electrical connection at a point along the length of the cord. As another example, the power cord can be provided with a releasable electrical connector located at the housing 28, 228 or cabinet 742, 1142 of the vehicle charging system. In any such case, the power cord can automatically disconnect upon experiencing a threshold force such as those described above, thereby preventing damage (or further damage) to the vehicle 18, 218 or the electrical system of the house, building, or other charging facility. Such disconnection can be frangible, meaning that the cord and/or connector is at least partially destroyed upon disconnection, or can be re-connectable by a user or service technician.

In some embodiments, the electrical connector 170 is located in a surface of the vehicle 18, 218 that is recessed with respect to adjacent (e.g., surrounding) exterior body surfaces of the vehicle 18, 218. This feature can help to reduce exposure of the electrical connector 170 to the environment around the vehicle 18, 218. In these and other embodiments, the electrical connector 170 is located behind a door 178 that can either slide or pivot with respect to the electrical connector 170 in order to reveal the electrical connector 170 for connection and charging. The door 178 can also help to reduce exposure of the electrical connector 170 to the environment around the vehicle 18, 218. In some embodiments, the door 178 can be opened manually by a user pushing, pulling, and/or rotating the door 178. However, in other embodiments, the door 178 can be at least partially opened remotely by a cable, solenoid and associated power wiring, mechanical linkage, and other elements connected to a user-manipulatable control in the vehicle 18, 218. Any mechanism used to open a fuel door for a gasoline or diesel-powered vehicle can be used for this purpose, and falls within the spirit and scope of the present invention.

As described in greater detail above, the controller 44, 244 of the vehicle charging cords 22, 222 can communicate with a controller 108 of the vehicle 18, 218, such as by PLC-based communication. As an alternative or in addition to such communication, the vehicle charging cord 22, 222 (and all other vehicle charging cords described and/or illustrated herein) can enable such communication by dedicated wiring in the same cord 22, 222. An example of such a cord 22, 222 is illustrated in FIGS. 20-23, and with particular reference to FIG. 23. In this embodiment, the plug 26 of the vehicle charging cord 26 has two communication pins 180 in addition to power and ground blades 182. The communication pins 180 are electrically coupled to wires or other electrical lines extend along the cord 22, 222, and can extend into and establish electrical communication with sockets 184 of the electrical connector 170. By this connection, communication along the cord 22, 222 on one or more electrical lines separate from power and ground lines of the cord 22, 222 can be established. It will be appreciated that such communication lines can be appropriately shielded for better performance, in some embodiments. Also, any number of such communication lines and associated pins 180 can be provided on the cord 22, 222. Furthermore, although pins 180 are illustrated in the embodiment of FIGS. 20-23, any other type of electrical connector (e.g., sockets adapted for connection to pins on the electrical connector 170) can instead be used. Such communication lines can also be used on the opposite end of the cord 22, 222 for communication between the controller 44, 244 and a controller 50, 250 of a power utility 48, 248, and can be used in any of the cord-based vehicle charging system embodiments disclosed herein.

Figure 24:
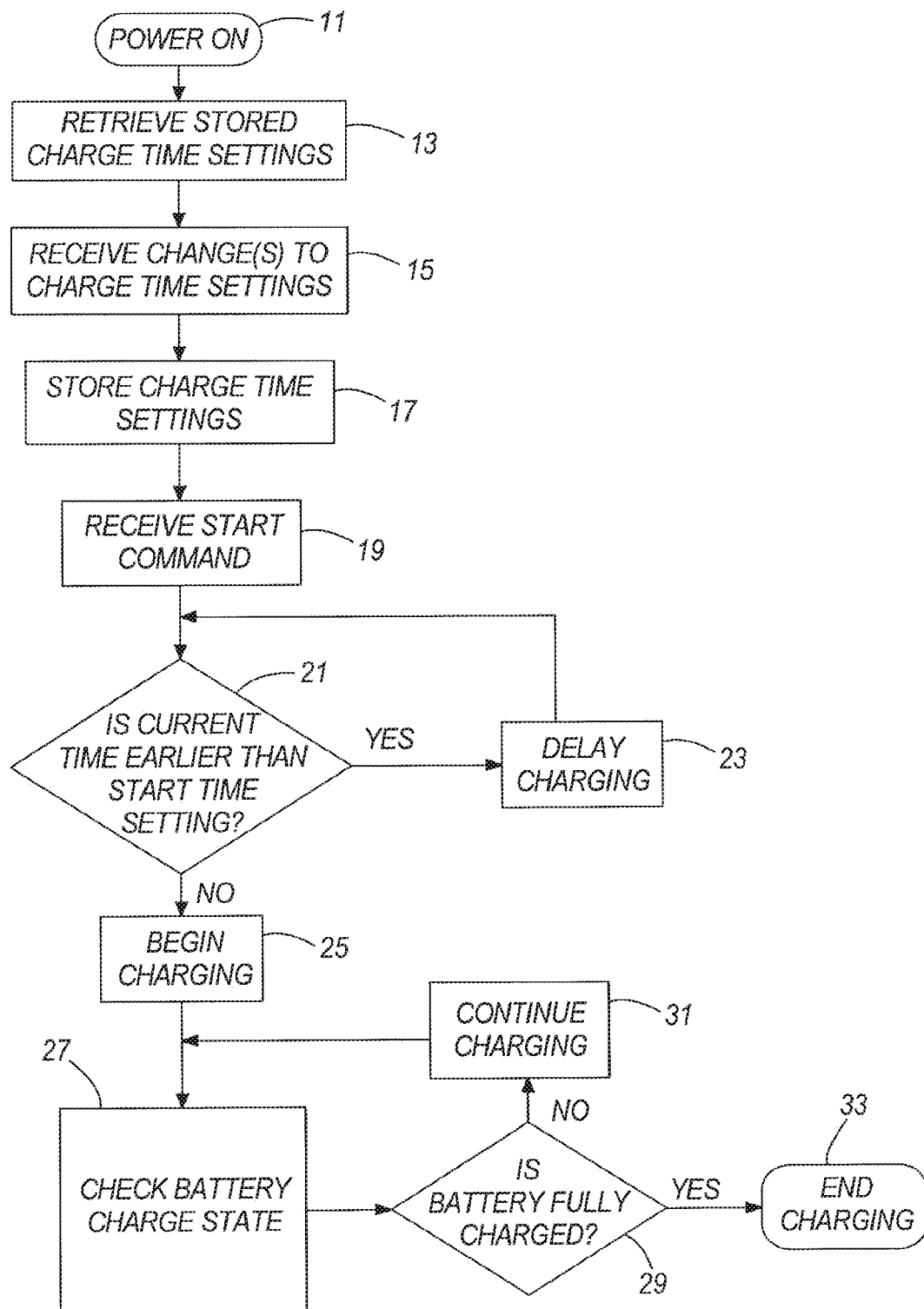
FIG. 24 is a flowchart illustrating a method of operation of a vehicular charger according to an embodiment of the present invention.

Operation of a vehicle charging system according to an embodiment of the present invention to perform a manual charging session will now be described with reference to FIG. 24. By way of example only, operation will be described in connection with the illustrated embodiment of FIGS. 2, 5-11, and 15, it being understood that any portion or all of the operation described in connection with FIG. 24 can be applied in any of the other vehicle charging system embodiments described and/or illustrated herein. With continued reference to FIG. 24, power is first established 11 to the vehicle charging cord 22, such as (in some embodiments) by plugging the vehicle charging cord 22 into an electrical outlet of the house, building or other facility at which charging is to take place, or by pressing the power button 34 in these and other embodiments. Upon receiving power, the controller 44 can retrieve any charge settings 13 previously entered and saved into memory 106, and can display such settings when the appropriate screen(s) 40 are shown upon the display 32. Next, the controller 44 can receive charge time and other settings 15 entered by a user via the display 32 and associated navigation buttons 36, 38, and in some embodiments can store such settings in memory 106 (at 17).

Following a command to start a manual battery charging session (at 19) based upon a start time selected by a user (such as by the user selecting selector 86 in the second screen 40A shown in FIG. 10 and entering a charge start time in selector 90), the controller 44 can continue to compare the time of the clock 58 with the charge start time entered by the user (at 21) until the start time is reached by the clock 58. Until the start time is reached, the controller continues to delay 23 charging of the battery 20 connected thereto. Once the start time is reached, the controller 44 closes the electrical switch 92 at 25, and begins charging the battery 20. Next, using the battery diagnostic circuitry described above, the controller 44 determines the charge level of the battery 20 at 27. If a determination is made that the battery 20 is not fully charged at 29, the controller 44 continues to keep the electrical switch 92 closed, thereby continuing to charge the battery 20 at 31. Otherwise, the controller 44 ends the charging session by opening the electrical switch 92 at 33.

Figure 25:
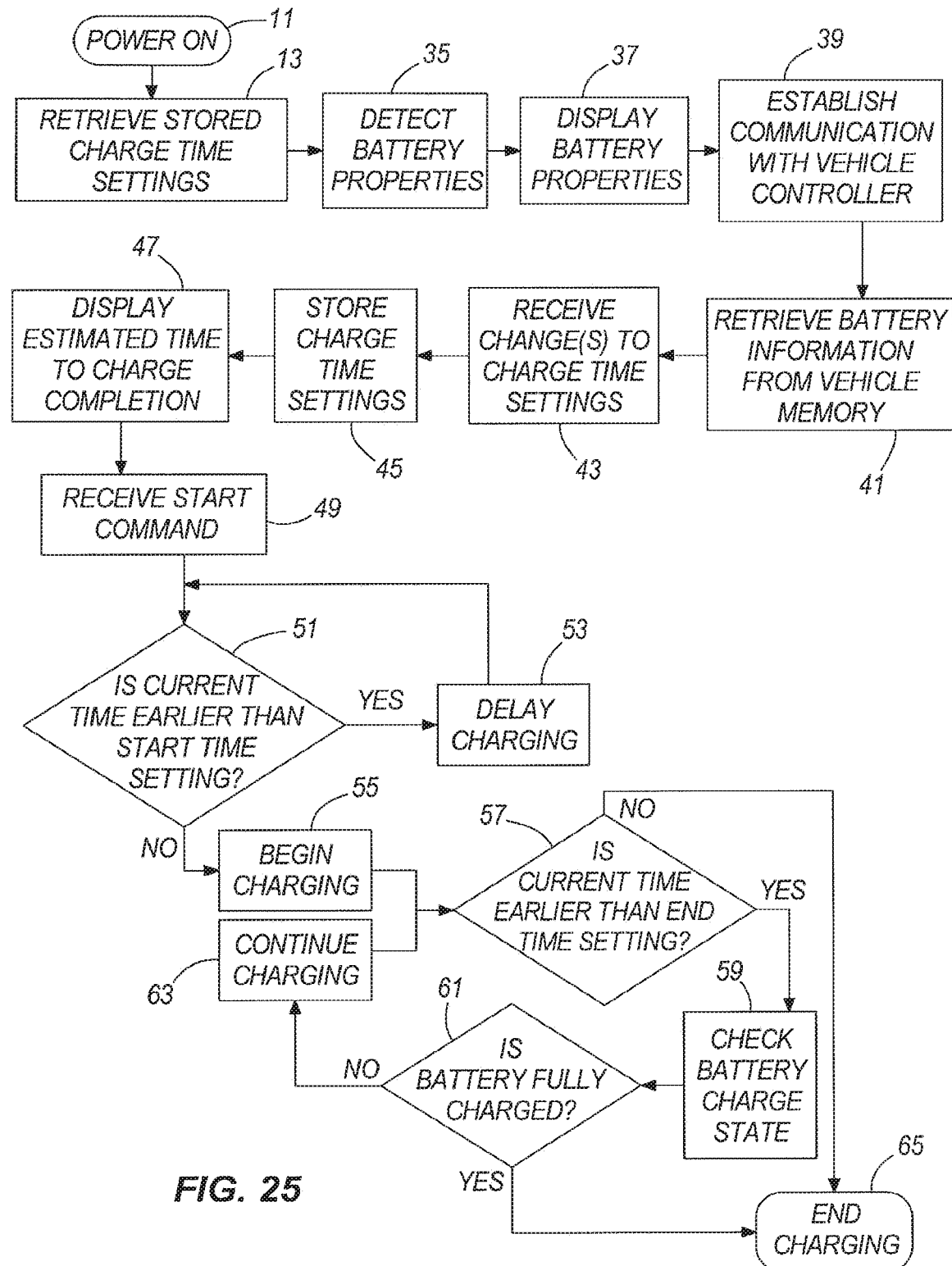
FIG. 25 is a flowchart illustrating a method of operation of a vehicular charger according to another embodiment of the present invention.

Operation of a vehicle charging system according to another embodiment of the present invention to perform a programmed charging session will now be described with reference to FIG. 25. In this embodiment, additional features are provided compared to the charging session described above in connection with FIG. 24. By way of example only, operation will be described in connection with the illustrated embodiment of FIGS. 2, 5-11, and 15, it being understood that any portion or all of the operation described in connection with FIG. 25 can be applied in any of the other vehicle charging system embodiments described and/or illustrated herein. With continued reference to FIG. 25, power is first established 11 to the vehicle charging cord 22, such as (in some embodiments) by plugging the vehicle charging cord 22 into an electrical outlet of the house, building or other facility at which charging is to take place, or by pressing the power button 34 in these and other embodiments. Upon receiving power, the controller 44 can retrieve any charge settings 13 previously entered and saved into memory 106, and can display such settings when the appropriate screen(s) 40 are shown upon the display 32.

Next, at 35, the controller 44 can employ the battery diagnostic circuitry described above to detect one or more properties of the battery 20 connected to the vehicle charging cord 22, such as the charge level of the battery 20, the voltage of the battery 20, the condition of the battery 20 (e.g., whether the battery 20 is faulty), and the like, and can display (at 37) any or all of this information to the user in any of the manners described above in connection with the embodiment of FIGS. 2, 5-11, and 15. The controller 44 can also establish communication with the controller 108 of the vehicle 18 at 39, and can retrieve information regarding the battery 20 (e.g., battery make, model, age, and the like) at 41 via the controller 108 of the vehicle 18 or directly from a memory of the vehicle 18.

At step 43, the controller 44 can receive charge time and other settings entered by a user via the display 32 and associated navigation buttons 36, 38, and in some embodiments can store such settings in memory 106 (at 45). The controller 44 can also display the charge time remaining 66 at 47. Following a command to start a programmed battery charging session (at 49) based upon a start time selected by a user (such as by the user selecting selector 86 in the second screen 40A shown in FIG. 10 and entering a charge start time in selector 90), the controller 44 can continue to compare the time of the clock 58 with the charge start time entered by the user (at 51) until the start time is reached by the clock 58. Until the start time is reached, the controller continues to delay 53 charging of the battery 20 connected thereto. Once the start time is reached, the controller 44 closes the electrical switch 92 at 55 to begin charging the battery 20.

Next, at 57, the controller 44 compares the time of the clock 58 with an end time setting that can be entered into the vehicle charging cord 22 according to some alternative embodiments of the present invention. If the end time has been reached, the controller 44 ends the charging session by opening the electrical switch 92 at 65. Otherwise, if the end time setting has not yet been reached, battery charging continues, and using the battery diagnostic circuitry described above, the controller 44 determines the charge level of the battery 20 at 59. If a determination is made that the battery 20 is not fully charged at 61, the controller 44 continues to keep the electrical switch 92 closed, thereby continuing to charge the battery 20 at 63. Otherwise, the controller 44 ends the charging session by opening the electrical switch 92 at 65.

Figure 26:
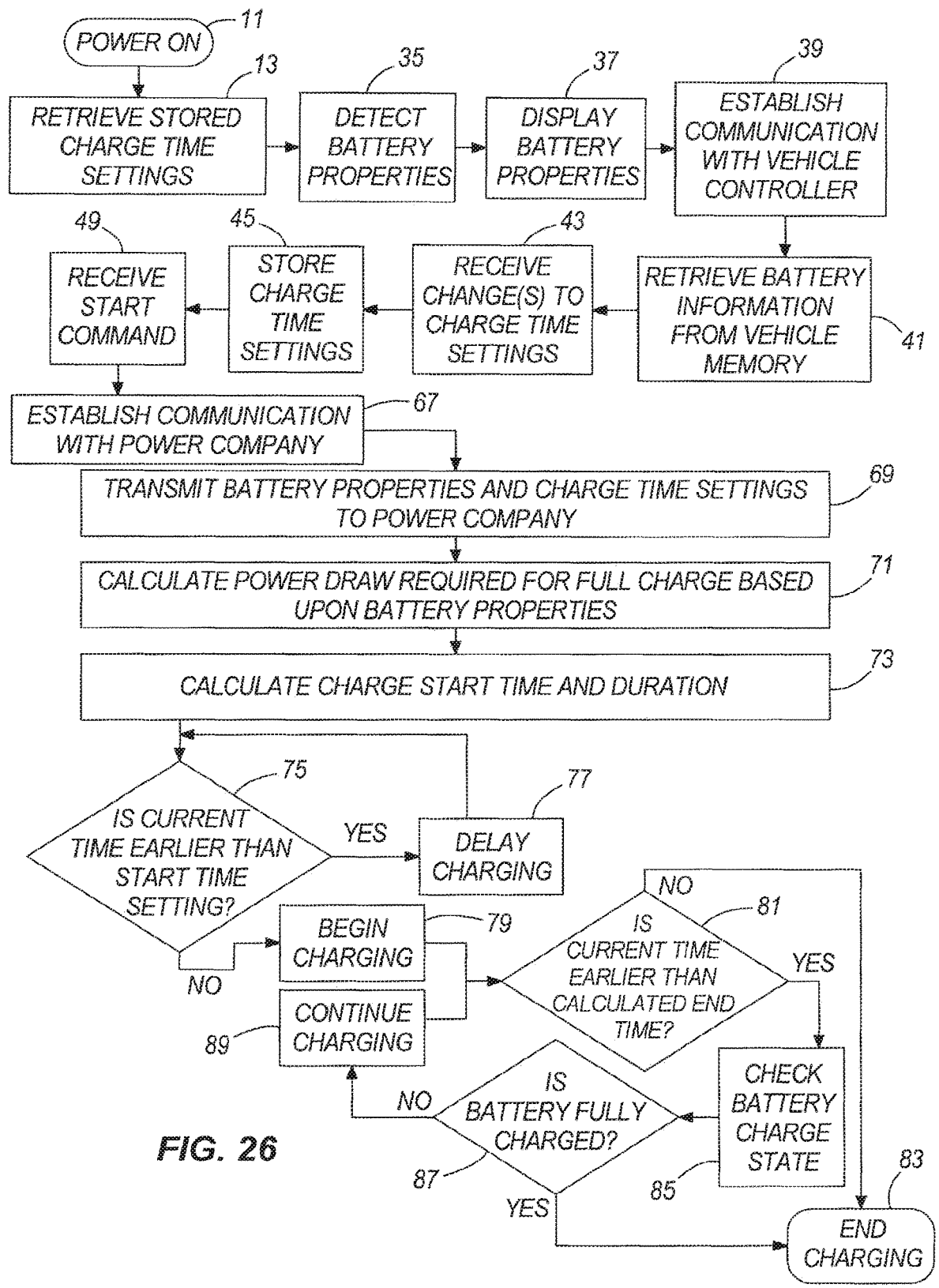
FIG. 26 is a flowchart illustrating a method of operation of a vehicular charger according to another embodiment of the present invention.

Operation of a vehicle charging system according to another embodiment of the present invention to perform a programmed charging session will now be described with reference to FIG. 26. By way of example only, operation will be described in connection with the illustrated embodiment of FIGS. 2, 5-11, and 15, it being understood that any portion or all of the operation described in connection with FIG. 26 can be applied in any of the other vehicle charging system embodiments described and/or illustrated herein. With continued reference to FIG. 26, power is first established 11 to the vehicle charging cord 22, such as (in some embodiments) by plugging the vehicle charging cord 22 into an electrical outlet of the house, building or other facility at which charging is to take place, or by pressing the power button 34 in these and other embodiments. Upon receiving power, the controller 44 can retrieve any charge settings 13 previously entered and saved into memory 106, and can display such settings when the appropriate screen(s) 40 are shown upon the display 32.

Next, at 35, the controller 44 can employ the battery diagnostic circuitry described above to detect one or more properties of the battery 20 connected to the vehicle charging cord 22, such as the charge level of the battery 20, the voltage of the battery 20, the condition of the battery 20 (e.g., whether the battery 20 is faulty), and the like, and can display (at 37) any or all of this information to the user in any of the manners described above in connection with the embodiment of FIGS. 2, 5-11, and 15. The controller 44 can also establish communication with the controller 108 of the vehicle 18 at 39, and can retrieve information regarding the battery 20 (e.g., battery make, model, age, and the like) at 41 via the controller 108 of the vehicle 18 or directly from a memory of the vehicle 18.

At step 43, the controller 44 can receive charge time and other settings entered by a user via the display 32 and associated navigation buttons 36, 38, and in some embodiments can store such settings in memory 106 (at 45). Following a command to start a programmed battery charging session (at 49) based upon a battery charging end time selected by a user (such as by the user selecting selector 100 in the second screen 40A shown in FIG. 10 and entering a charge end time in selector 104), the controller 44 can establish communication with the power utility 48 at 67, and can transmit (or enable the power utility 48 to retrieve) the charge time settings, any other settings, and the battery property information to the power utility 48 at 69.

Next, the controller 44 of the vehicle charging cord 22 or the controller 50 of the power utility 48 can calculate the power required to fully charge the battery 20 based at least in part upon the level of charge of the battery 20 at 71. The controller 44 of the vehicle charging cord 22 or the controller 50 of the power utility 48 can then calculate the amount of time needed to fully charge the battery 20 based upon the power required to do so, and can thereby estimate the time of day at which charging can begin based at least in part upon the battery charging end time and the estimated duration of time necessary to fully charge the battery 20 (at 73).

At step 75, the controller 44 can continue to compare the time of the clock 58 with the charge start determined as described above until the start time is reached by the clock 58. Until the start time is reached, the controller continues to delay 77 charging of the battery 20 connected thereto. Once the start time is reached, the controller 44 closes the electrical switch 92 at 79 to begin charging the battery 20.

Next, at 81, the controller 44 compares the time of the clock 58 with an end time setting that can be entered into the vehicle charging cord 22 according to some alternative embodiments of the present invention. If the end time has been reached, the controller 44 ends the charging session by opening the electrical switch 92 at 83. Otherwise, if the end time setting has not yet been reached, battery charging continues, and using the battery diagnostic circuitry described above, the controller 44 determines the charge level of the battery 20 at 85. If a determination is made that the battery 20 is not fully charged at 87, the controller 44 continues to keep the electrical switch 92 closed, thereby continuing to charge the battery 20 at 89. Otherwise, the controller 44 ends the charging session by opening the electrical switch 92 at 83.

Figure 27:
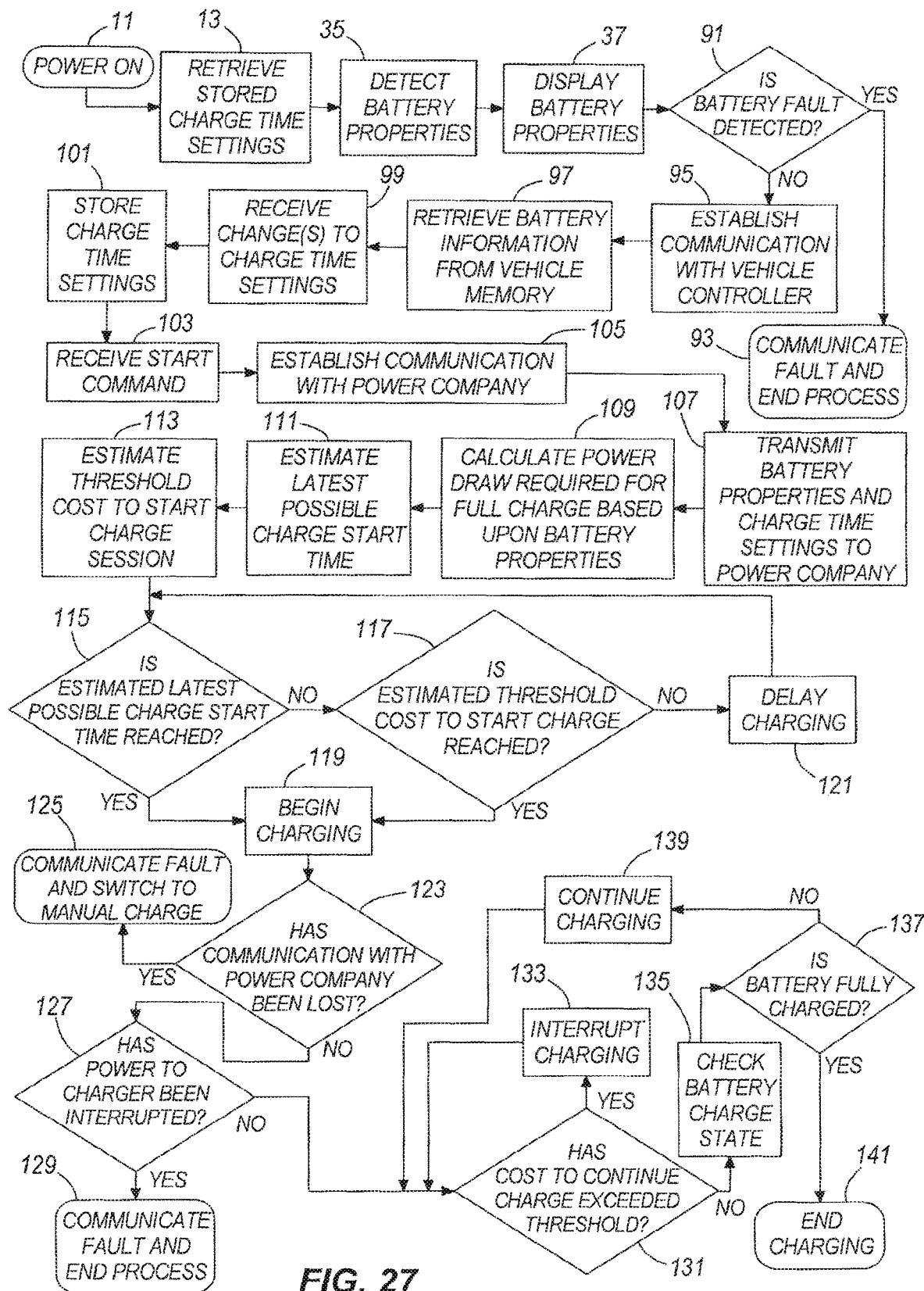
FIG. 27 is a flowchart illustrating a method of operation of a vehicular charger according to another embodiment of the present invention.

Operation of a vehicle charging system according to another embodiment of the present invention to perform a programmed charging session will now be described with reference to FIG. 27. By way of example only, operation will be described in connection with the illustrated embodiment of FIGS. 2, 5-11, and 15, it being understood that any portion or all of the operation described in connection with FIG. 27 can be applied in any of the other vehicle charging system embodiments described and/or illustrated herein. With continued reference to FIG. 27, power is first established 11 to the vehicle charging cord 22, such as (in some embodiments) by plugging the vehicle charging cord 22 into an electrical outlet of the house, building or other facility at which charging is to take place, or by pressing the power button 34 in these and other embodiments. Upon receiving power, the controller 44 can retrieve any charge settings 13 previously entered and saved into memory 106, and can display such settings when the appropriate screen(s) 40 are shown upon the display 32.

Next, at 35, the controller 44 can employ the battery diagnostic circuitry described above to detect one or more properties of the battery 20 connected to the vehicle charging cord 22, such as the charge level of the battery 20, the voltage of the battery 20, the condition of the battery 20 (e.g., whether the battery 20 is faulty), and the like, and can display (at 37) any or all of this information to the user in any of the manners described above in connection with the embodiment of FIGS. 2, 5-11, and 15. With this information, the controller 44 can determine whether the battery 20 is defective or otherwise has a fault at 91, and can communicate a battery fault message to the user in any of the manners also described above in connection with the embodiment of FIGS. 2, 5-11, and 15 if a fault exists (at 93). The controller 44 can also establish communication with the controller 108 of the vehicle 18 at 95, and can retrieve information regarding the battery 20 (e.g., battery make, model, age, and the like) at 97 via the controller 108 of the vehicle 18 or directly from a memory of the vehicle 18.

At step 99, the controller 44 can receive charge time and other settings entered by a user via the display 32 and associated navigation buttons 36, 38, and in some embodiments can store such settings in memory 106 (at 101). Following a command to start a programmed battery charging session (at 103) based upon a battery charging end time selected by a user (such as by the user selecting selector 100 in the second screen 40A shown in FIG. 10 and entering a charge end time in selector 104), the controller 44 can establish communication with the power utility 48 at 105, and can transmit (or enable the power utility 48 to retrieve) the charge time settings, any other settings, and the battery property information to the power utility 48 at 107.

Next, the controller 44 of the vehicle charging cord 22 or the controller 50 of the power utility 48 can calculate the power required to fully charge the battery 20 based at least in part upon the level of charge of the battery 20 at 109. The controller 44 of the vehicle charging cord 22 or the controller 50 of the power utility 48 can then calculate the amount of time needed to fully charge the battery 20 based upon the power required to do so, and can thereby estimate the latest time of day at which charging can begin based at least in part upon the battery charging end time and the estimated duration of time necessary to fully charge the battery 20 (at 111). Also, at 113, the controller 44 of the vehicle charging cord 22 or the controller 50 of the power utility 48 can set an acceptable threshold cost of power (e.g., per unit time) at or below which battery charging will begin. In some embodiments, this threshold cost of power is entered by a user into the vehicle charging cord 22 in any of the manners of user interface described herein, or can be set by the power utility 48 based upon the desired maximum power cost determined by the power utility 48.

At step 115, the controller 44 can compare the time of the clock 58 with the latest estimated charge time, and at step 117 can compare the current cost of power (e.g., per unit time) with the threshold cost of power determined at step 113. If the latest estimated charge start time has been reached or if the threshold cost of power has been reached, the controller 44 closes the electrical switch 92 at 119 to begin charging the battery 20. Otherwise, the controller 44 continues to delay 121 charging of the battery 20 connected thereto.

Next, at 123, the controller 44 can check or otherwise determine whether communication has been lost with the controller 50 of the power utility 48. If communication has been lost, the controller 44 can send a communication fault message to the user in any of the manners described above in connection with the embodiment of FIGS. 2, 5-11, and 15 (at 125). Otherwise, the controller 44 can check or otherwise determine whether the supply of power to the vehicle charging cord 22 has been interrupted at 127. If the supply of power has been interrupted, the controller 44 can send a power interrupt fault message to the user in any of the manners also described above in connection with the embodiment of FIGS. 2, 5-11, and 15 (at 129).

On a continuing basis as the battery 20 is being charged, the controller 44 of the vehicle charging cord 22 or the controller 50 of the power utility 48 can monitor the cost of power supplied to the battery 20, and can compare this cost with the threshold cost of power described above (at 131). If the cost of power supplied to the battery 20 exceeds the threshold cost of power, the controller 44 of the vehicle charging cord 22 or the controller 50 of the power utility 48 can interrupt charging of the battery at 133, such as by opening the electrical switch 92 of the vehicle charging cord 92. Otherwise, using the battery diagnostic circuitry described above, the controller 44 determines the charge level of the battery 20 at 135. If a determination is made that the battery 20 is not fully charged at 137, the controller 44 continues to keep the electrical switch 92 closed, thereby continuing to charge the battery 20 at 139. Otherwise, the controller 44 ends the charging session by opening the electrical switch 92 at 141.

Four examples of vehicle charging operation according to embodiments of the present invention are described above in connection with FIGS. 24-27. It should be noted any sub-combination of the steps described in connection with FIGS. 24-27 can be performed in other embodiments. Also, although the steps of the various processes presented above are described as occurring in a particular order, a number of the steps of each process can occur in different orders without departing from the spirit and scope of the present invention. Furthermore, steps and combinations of steps described in combination with one or more of the embodiments of FIGS. 24-27 can be employed in the processes of the other embodiments of FIGS. 24-27. For example, the battery fault check and notification steps 91, 93, the communication fault and notification steps 123, 125, and/or the power interruption fault check and notification steps 127, 129 in the process illustrated in FIG. 27 can be utilized in any of the other embodiments disclosed herein, including those of FIGS. 24-26.

Also, in the various processes described and illustrated herein, the controller 44 is described as performing a number of functions. Based upon the ability of those vehicle charging systems herein to communicate with a processor of a power utility, any of these functions can instead or also be performed by the processor of the power utility communicating and controlling the vehicle charging cords 22 or systems.

As described above, the use of any of the vehicle charging systems described and/or illustrated herein can provide significant control to a user in determining the conditions under which vehicle battery charging will occur. This control can result in cost savings to the user without impacting the user's daily routine. However, other benefits accrue to power utilities providing power to users of these vehicle charging systems. By at least partially controlling the time at which battery charging will occur and/or by having the ability to interrupt and re-start battery charging by a large number of users in a community, the power utility can better distribute power usage over a period of time, thereby providing significant cost savings to the power utility.

Figure 28:
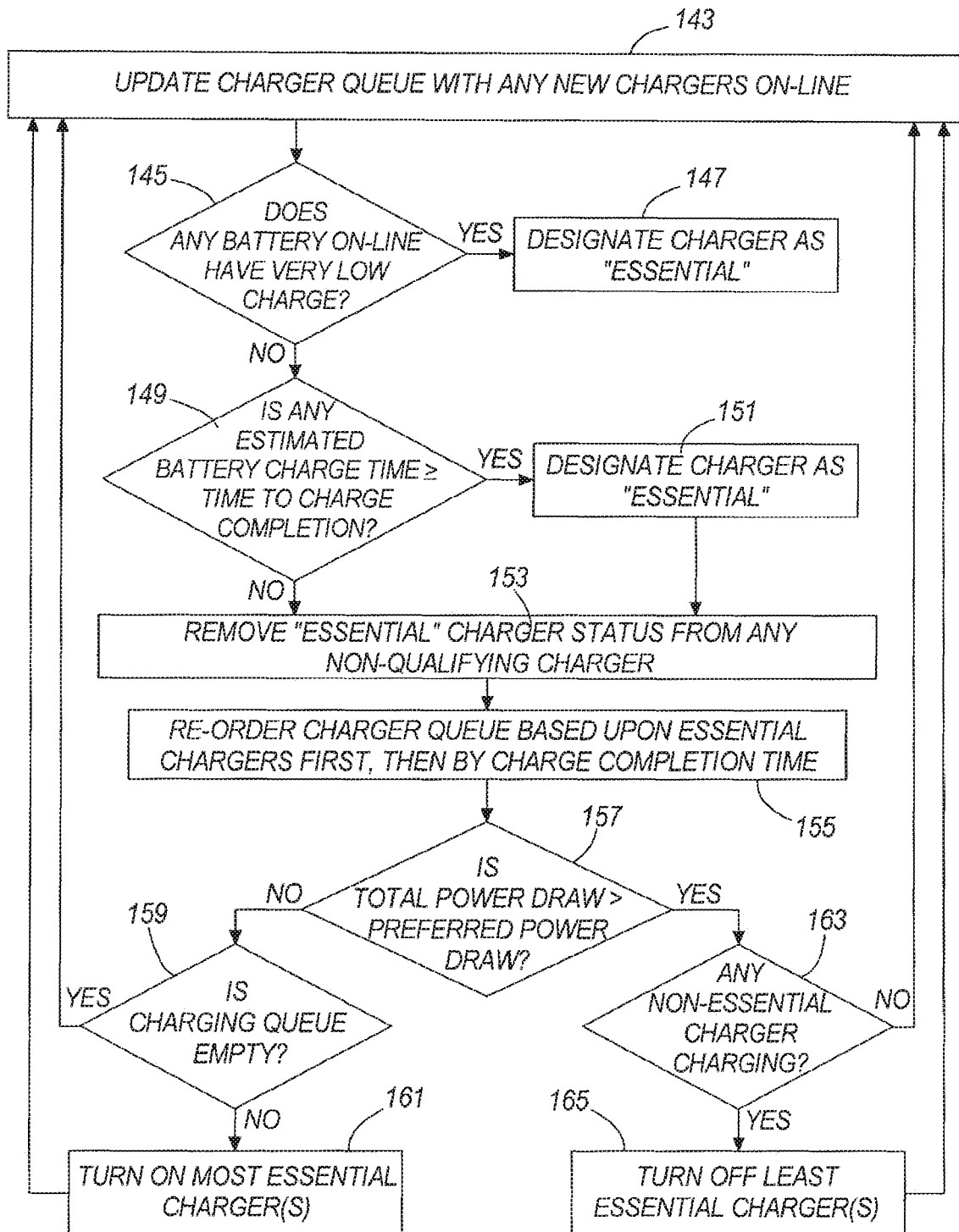
FIG. 28 is a flowchart illustrating a method of operation of a vehicular charging system according to an embodiment of the present invention.
Figure 29:
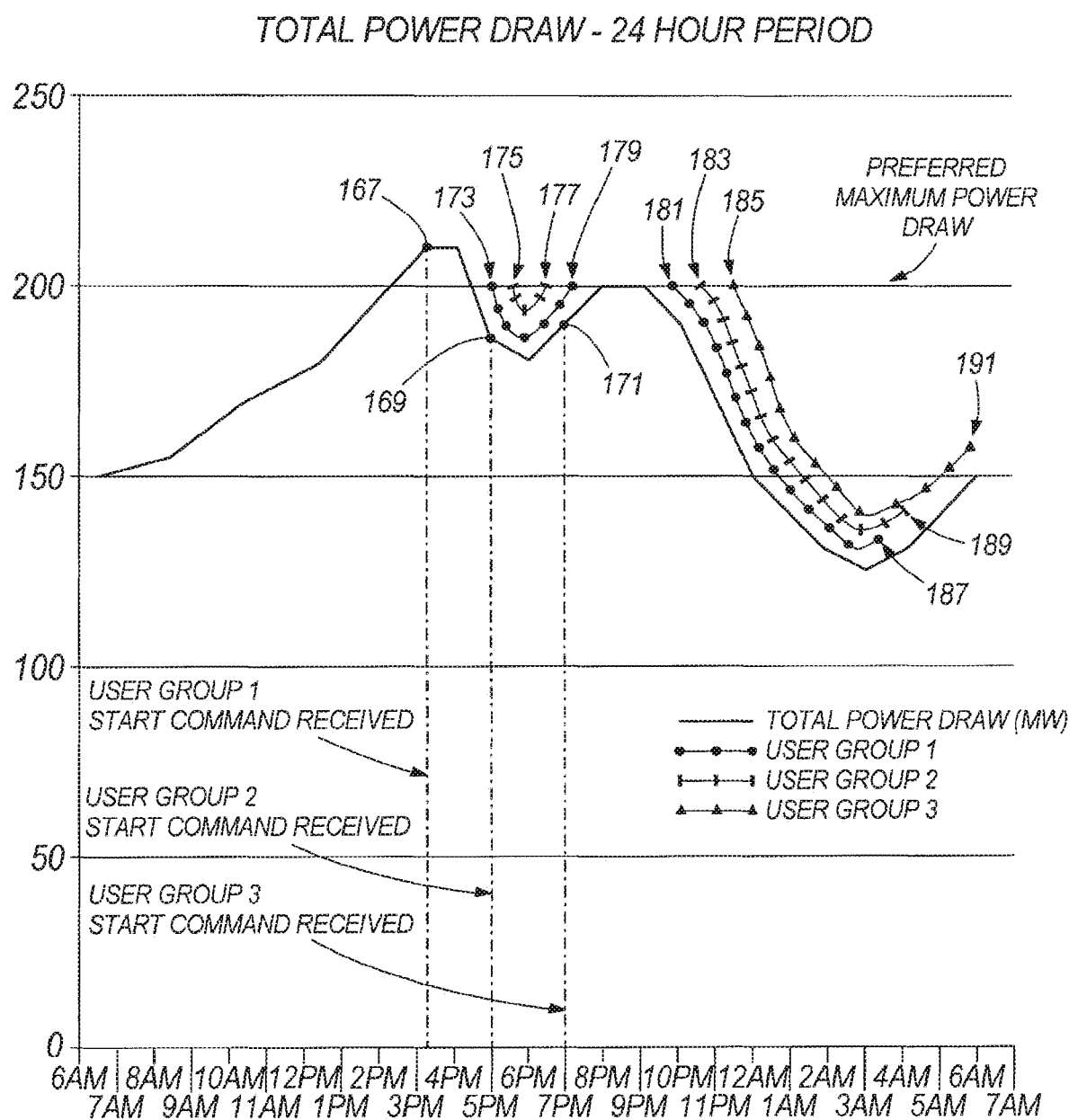
FIG. 29 illustrates power draw from a power grid over a period of time, as controlled in part by a vehicular power charging system according to an embodiment of the present invention.

An example of how a power utility can control multiple vehicle charging systems according to the present invention is illustrated in FIGS. 28 and 29. By way of example only, operation will be described in connection with users employing vehicle charging cords 22, 222 such as those illustrated in FIGS. 2, 5-11, and 15, it being understood that any portion or all of the operation described in connection with FIGS. 28 and 29 can be applied in any of the other vehicle charging system embodiments described and/or illustrated herein.

With reference first to FIG. 28, the controller 50 of the power utility 48 (which can be defined by one or more servers and associated computer equipment) can communicate with the vehicle charging cords 22, 222 of multiple users, and can continuously or periodically update a queue or other list of on-line users who have requested a battery charge session as described above (at 143).

In some embodiments, the controller 50 sorts the on-line users based upon one or more factors, such as the charge time end setting (i.e., earlier charge time end settings having priority), the estimated charge time needed for fully charging each battery 20 (i.e., longer charge times having priority), the time at which the battery charge session was requested, and the like. By way of example only, the controller 50 in the process of FIG. 28 checks at 145 whether any of the batteries 20 that are on-line have a very low charge, such as a charge below a minimum level set by the user at selector 112 on the second screen 40B shown in FIG. 10, or a charge below a minimum level set by the power utility 48. As another example, the controller 50 in the process of FIG. 28 checks at 149 whether the estimated time to fully charge any battery 20 is equal to or greater than the time available for battery charging (i.e., to the battery charge completion time entered by the user at selector 100 on the second screen 40B shown in FIG. 10). If the controller 50 determines that a battery 20 has a very low charge or will require a charging duration equal to or greater than the charging time available, the controller 50 can flag or otherwise indicate that the vehicle charging cord 22, 222 has priority over other vehicle charging cords 22, 222 (at 147 and 151, respectively).

The controller 50 can also remove a priority designation from any on-line vehicle charging cord 22, 222 no longer meeting this criteria (at 153), such as on-line charging cords 22, 222 that have been supplied with power based upon the fact that their respective batteries 20 had a very low charge, but that now have supplied their batteries 20 with a sufficient minimum threshold charge. At step 155, the queue of on-line vehicle charging cords 22, 222 can be re-ordered based upon the determination of which vehicle charging cords 22, 222 are flagged as having priority (described above), and upon any of the other factors also described above.

Next, the controller 50 at 157 can determine whether the total power draw from the community or the total power draw of all vehicle charging cords 22, 222 exceeds a threshold maximum level of power draw. This maximum level of power draw can be set by a power utility 48 based upon a threshold level of power cost to the power utility 48, the maximum output of power that can be supplied by the power utility 48 to the community, an amount of power budgeted by the power utility 48 for charging vehicle batteries via the vehicle charging cords 22, 222, other factors, and any combination thereof. If the total power draw does not exceed the maximum level of power draw set by the power utility 48, and if the queue of vehicle charging cords 22, 222 awaiting charging is empty (at 159), the controller 50 can re-initiate the vehicle charging cord management process by again updating the vehicle charging cord queue at 143. Otherwise, the controller 50 of the power utility 48 can send signals at 161 to one or more vehicle charging cords 22, 222 to begin charging their respective batteries 20 by closing their electrical switches 92. Such signals can be sent to any vehicle charging cords 22, 222 flagged with priority, and then to any other vehicle charging cords 22, 222. In either case, such signals are sent to vehicle charging cords 22, 222 in the order presented in the vehicle charging queue (ordered as described above). Following this step, the controller 50 can re-initiate the vehicle charging cord management process by again updating the vehicle charging cord queue at 143.

If the total power draw described above exceeds the maximum level of power draw set by the power utility 48 as determined by the processor at step 157, and if any vehicle charging cords 22, 222 are not flagged as having priority (check by the processor 50 made at step 163) as described above, the controller 50 can send signals to one or more vehicle charging cords 22, 222 not flagged as having priority to at least temporarily stop charging the batteries 20 connected thereto (e.g., by opening the electrical switches 92 of such vehicle charging cords 22, 222) at step 165. In some embodiments, such signals can be sent by the power utility in batches, such as signals sent to two or more of such vehicle charging cords 22, 222 at a given time or under a common command. Following this step, the controller 50 can re-initiate the vehicle charging cord management process by again updating the vehicle charging cord queue at 143. Otherwise, if the processor 50 determines that all vehicle charging cords 22, 222 are flagged as having priority at 163, the controller 50 can re-initiate the vehicle charging cord management process by again updating the vehicle charging cord queue at 143.

In light of the fact that the vehicle charging cord management process illustrated in FIG. 28 can be performed on a continual basis, it will be appreciated that the steps described above in connection with FIG. 28 can be carried out in a number of different orders without departing from the spirit and scope of the present invention.

With reference now to FIG. 29, an example application of the vehicle charging cord management process of FIG. 28 is provided. FIG. 29 illustrates the total power draw (in kW) of a community upon a power utility 48 over a 24-hour period of time. As shown in FIG. 29, the maximum preferred power draw of the power utility 48 described above in connection with FIG. 28 is 200 kW. As also shown in FIG. 29, the power draw of the community varies significantly over the 24-hour period, peaking around 3 pm and falling to a lowest level between 2 am and 3 am. Any number of factors can define this power draw over the 24-hour period, including without limitation the number of users using air conditioning or electrical heating units during the day and the times at which such units are operated by the users, the times at which any large manufacturing operations begin and end operations, and the like. For example, the second peak shown in FIG. 29 can be the result of one or more manufacturing plants in a community drawing significant power during a second shift.

Based upon the amount of power drawn from the power utility 29 as shown in FIG. 29, the power utility 48 can control and operate a number of vehicle charging systems according to the present invention based upon non-peak time periods and upon other factors as described above (charge time end settings, estimated charge times needed to fully charge batteries 20, times at which battery charge sessions were requested, and the like). For example, a first group of users requesting charge sessions at 2 pm (point 167 in FIG. 29) can have priority over other groups of users requesting charge sessions at 4 pm and 6 pm (points 169 and 171), respectively. Accordingly, once the controller 50 of the power utility 48 determines that the power draw by the community has fallen below the preferred maximum level of power draw (e.g., step 157 in FIG. 28; point 173 in FIG. 29), the controller 50 can send signals to the vehicle charging systems of the first group of users to begin battery charging. Taking this additional power draw into account, the controller 50 of the power utility 48 can later determine that the power draw by the community has fallen further (point 175 in FIG. 29), and that the vehicle charging systems of the second user group can be turned on. However, if the total power draw by the community rises again, such as based upon a large draw from a manufacturing facility operating a second shift, the controller 50 of the power utility 48 can temporarily turn off the vehicle charging systems of the second user group and then the first user group in series (points 177 and 179, respectively), and can turn on the vehicle charging systems of the first and second user groups in series once the total power draw by the community falls again (points 181 and 183, respectively).

Although the third user group requested charging sessions much earlier as described above, the total power draw by the community remained too high to permit the controller 50 of the power utility 48 to turn on the vehicle charging systems of the third user group until 11 pm. At this point (185 in FIG. 29), the total power draw taking into account the first and second groups of users falls sufficiently to permit the controller 50 to turn on the vehicle charging systems of the third user group while still remaining below the preferred maximum power draw described above. The batteries corresponding to the first, second, and third groups of users illustrated in FIG. 29 become fully charged at different times, and cause battery charging to stop at points 187, 189, and 191, respectively.

Application of a vehicle charging system management process (using vehicle charging systems of the present invention) is shown by way of example in FIG. 29. It will be appreciated that a similar process can be implemented for any other power draw profile of a community, and that any number of charging initiations, interruptions, and re-initiations can occur for any number of users or groups of users throughout the course of a 24-hour period based at least in part upon the needs of the users and any preferred maximum level of power draw determined by the power utility.

The embodiments described above and illustrated in the figures are presented by way of example only and are not intended as a limitation upon the concepts and principles of the present invention. As such, it will be appreciated by one having ordinary skill in the art that various changes in the elements and their configuration and arrangement are possible without departing from the spirit and scope of the present invention. For example, the vehicle charging systems described above and illustrated in connection with the embodiments of FIGS. 2, 5-11 and 15; FIG. 3; FIGS. 4, 18, and 19; FIG. 12; FIGS. 13, 14, and 16; FIG. 17; FIGS. 20-23; FIG. 24, FIG. 25, FIG. 26, FIG. 27, and FIGS. 28 and 29 each have a number of features, elements, and/or steps. Although these features, elements, and steps are described and illustrated in connection with each embodiment, it should be noted that any sub-combination of such features, elements, and steps can be utilized in other embodiments of the present invention. The particular combination of features, elements, and steps in each illustrated embodiment is presented by way of example only, and does not indicate or imply that embodiments of the present invention must have all such features, elements, and steps.

I claim:

1. A vehicle charger for charging a battery of a vehicle and for communication with a first controller remote from the vehicle charger and the battery, the vehicle charger comprising:
    a transmitter in the vehicle for communication with the first controller; and
    a second controller in the vehicle and coupled to the transmitter,
    the second controller configured to:
        receive a first input selecting a first mode of communication from a plurality of modes of communication provided via the vehicle charger,
        supply power to the battery to charge the battery in a charging session,
        in response to detecting of predetermined threshold level of charge of the battery during charging of the battery, send a first by sending an alert indicative of the predetermined threshold level of charge of the battery via the transmitter by the first mode of communication,
        receive a second input selecting a second mode of communication from the plurality of modes of communication, and
        after receiving the second input, send a second alert via the transmitter by the second mode of communication, and
    further comprising a user-manipulatable control, wherein the second controller receives the first input and the second input via the user-manipulatable control.

2. The vehicle charger of claim 1, wherein the first alert is sent via a wireless signal.

3. The vehicle charger of claim 1, wherein the predetermined threshold level of charge of the battery is a full charge of the battery.

4. The vehicle charger of claim 1, wherein the predetermined threshold level of charge of the battery is less than a full charge of the battery.

5. The vehicle charger of claim 1, wherein the plurality of modes of communication includes at least one of a group consisting of a text and an e-mail.

6. The vehicle charger of claim 1, wherein the user-manipulatable control is in the vehicle and coupled to the second controller.

7. The vehicle charger of claim 1, wherein the user-manipulatable control is a touch-screen display in the vehicle, coupled to the second controller, and within reach of the user seated within the vehicle.

8. A method of charging a battery of a vehicle with a vehicular battery charger, the method comprising:
    receiving a first input from a user selecting a first mode of communication from a plurality of modes of communication provided via the vehicular battery charger, each of the plurality of modes of communication communicating data via a different medium or channel;
    supplying power to the battery of the vehicle via the vehicular battery charger on board the vehicle;
    detecting, by a controller of the vehicular battery charger, when a predetermined level of charge of the battery has been reached as the result of supplying an amount of power to the battery;
    establishing communication between the controller of the vehicular battery charger and a controller remote from the vehicle and the vehicular battery charger;
    generating a first alert responsive to detecting when the predetermined level of charge of the battery has been reached;
    transmitting the first alert from the controller of the vehicular battery charger to the other controller remote from the vehicle and the vehicular battery charger according to a first mode of communication;
    receiving a second input from the user selecting a second mode of communication from the plurality of modes of communication; and
    after receiving the second input, transmitting a second alert from the controller of the vehicular battery charger to the other controller remote from the vehicle and the vehicle battery charger according to the second mode of communication.

9. The method of claim 8, wherein the first alert is transmitted via a wireless signal.

10. The method of claim 8, wherein the predetermined threshold level of charge of the battery is a full charge of the battery.

11. The method of claim 8, wherein the predetermined threshold level of charge of the battery is less than a full charge of the battery.

12. The method of claim 8, wherein the first mode of communication is at least one of a group consisting of a text and an e-mail automatically generated to a user.

13. The method of claim 8, wherein receiving the first input from the user comprises receiving the first input from a user seated in the vehicle.

14. The method of claim 8, wherein receiving the first input from the user comprises receiving the first input via a touch-screen display mounted in the vehicle and within reach of the user seated within the vehicle.

15. A vehicle charger for charging a battery of a vehicle and for communication with a first controller remote from the vehicle charger and the battery, the vehicle charger comprising:
    a second controller in the vehicle configured to:
        receive a first input selecting a first alert form from a plurality of alert forms, the plurality of alert forms including a visual alert and an audible alert,
        control power supply to the battery,
        in response to detecting when an increase in charge of the battery has reached a predetermined threshold level of charge, generate a first signal in the first alert form representative of the predetermined threshold level of charge of the battery,
        receive a second input selecting a second alert from the plurality of alert forms, and
        after receiving the second input, generate a second signal in the second form; and
    a transmitter in the vehicle coupled to the second controller, the transmitter configured to transmit the first signal to the first controller for providing an alert to a user regarding the charging status of the battery,
    wherein the second controller receives the first input and the second input via at least one user-manipulatable control.

16. The vehicle charger of claim 15, wherein the predetermined threshold level of charge of the battery is a full charge of the battery.

17. The vehicle charger of claim 15, wherein the predetermined threshold level of charge of the battery is less than a full charge of the battery and is set via a user-manipulatable control and wherein the second controller is configured to send the alert indicative of the predetermined threshold level of charge of the battery during charging of the battery and before the charging of the battery is complete.

18. The vehicle charger of claim 15, further comprising a display upon which a charge level of the battery is displayed simultaneously with the alert.

19. The vehicle charger of claim 18, wherein the display is electrically coupled to the second controller.

20. The vehicle charger of claim 15, further comprising a receiver configured to receive wireless commands from the user to change a charging state of the battery in response to the alert.

\* \* \* \* \*